US012382710B2

(12) United States Patent
Su et al.

(10) Patent No.: US 12,382,710 B2
(45) Date of Patent: Aug. 5, 2025

(54) METHOD FOR FORMING LONG CHANNEL BACK-SIDE POWER RAIL DEVICE

(71) Applicant: Taiwan Semiconductor Manufacturing Company, Ltd., Hsin-Chu (TW)

(72) Inventors: Huan-Chieh Su, Tianzhong Township (TW); Cheng-Chi Chuang, New Taipei (TW); Chih-Hao Wang, Baoshan Township (TW); Zhi-Chang Lin, Zhubei (TW); Li-Zhen Yu, New Taipei (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 0 days.

(21) Appl. No.: 18/439,859

(22) Filed: Feb. 13, 2024

(65) Prior Publication Data

US 2024/0266223 A1 Aug. 8, 2024

Related U.S. Application Data

(63) Continuation of application No. 18/079,053, filed on Dec. 12, 2022, now Pat. No. 11,935,794, which is a
(Continued)

(51) Int. Cl.
*H10D 84/03* (2025.01)
*H10D 30/01* (2025.01)
(Continued)

(52) U.S. Cl.
CPC ....... *H10D 84/038* (2025.01); *H10D 30/0243* (2025.01); *H10D 30/62* (2025.01);
(Continued)

(58) Field of Classification Search
CPC ..... H01L 21/823431; H01L 21/823412; H01L 29/6681; H01L 29/785; H01L 21/76831;
(Continued)

(56) References Cited

U.S. PATENT DOCUMENTS 9,590,038 B1 3/2017 Kim et al.
9,721,946 B2 * 8/2017 Kim ........................ H01L 21/78
(Continued)

OTHER PUBLICATIONS

U.S. Appl. No. 17/123,873, filed Dec. 16, 2020.
(Continued)

*Primary Examiner* — Christine A Enad
(74) *Attorney, Agent, or Firm* — Eschweiler & Potashnik, LLC

(57) ABSTRACT

A method of forming a semiconductor transistor device. The method comprises forming a channel structure over a substrate and forming a first source/drain structure and a second source/drain structure on opposite sides of the fin structure. The method further comprises forming a gate structure surrounding the fin structure. The method further comprises flipping and partially removing the substrate to form a back-side capping trench while leaving a lower portion of the substrate along upper sidewalls of the first source/drain structure and the second source/drain structure as a protective spacer. The method further comprises forming a back-side dielectric cap in the back-side capping trench.

20 Claims, 59 Drawing Sheets

Related U.S. Application Data continuation of application No. 17/068,037, filed on Oct. 12, 2020, now Pat. No. 11,581,224.

(60) Provisional application No. 63/021,740, filed on May 8, 2020.

(51) Int. Cl.
  *H10D 30/62* (2025.01)
  *H10D 84/01* (2025.01)

(52) U.S. Cl.
  CPC ..... *H10D 84/0128* (2025.01); *H10D 84/0158* (2025.01); *H10D 30/6219* (2025.01)

(58) Field of Classification Search
  CPC ............ H01L 21/76897; H10D 84/038; H10D 84/0158; H10D 84/0128; H10D 30/62; H10D 30/0243
  See application file for complete search history.

(56) References Cited

U.S. PATENT DOCUMENTS

| | | | |
|---|---|---|---|
| 10,332,881 B1 | 6/2019 | Badaroglu et al. | |
| 11,289,606 B2 | 3/2022 | Ju et al. | |
| 11,581,224 B2 | 2/2023 | Su et al. | |
| 11,961,915 B2 | 4/2024 | Ju et al. | |
| 2008/0054313 A1* | 3/2008 | Dyer | H01L 21/76898 257/E21.597 |
| 2011/0241073 A1 | 10/2011 | Cohen et al. | |
| 2013/0302950 A1 | 11/2013 | Doris et al. | |
| 2015/0200299 A1 | 7/2015 | Chen et al. | |
| 2016/0351570 A1 | 12/2016 | Park et al. | |
| 2018/0006126 A1 | 1/2018 | Hook et al. | |
| 2018/0277442 A1 | 9/2018 | Leobandung | |
| 2019/0088542 A1 | 3/2019 | Hsieh et al. | |
| 2019/0115424 A1 | 4/2019 | Park et al. | |
| 2019/0157310 A1 | 5/2019 | Glass et al. | |
| 2019/0164882 A1 | 5/2019 | Chen et al. | |
| 2019/0172828 A1 | 6/2019 | Smith et al. | |
| 2019/0189739 A1 | 6/2019 | Li et al. | |
| 2019/0221649 A1 | 7/2019 | Glass et al. | |
| 2019/0259807 A1 | 8/2019 | Kumar et al. | |
| 2019/0312023 A1 | 10/2019 | Morrow et al. | |
| 2019/0371898 A1 | 12/2019 | Huang | |
| 2020/0035560 A1 | 1/2020 | Block et al. | |
| 2020/0044087 A1 | 2/2020 | Guha et al. | |
| 2020/0066595 A1 | 2/2020 | Glass et al. | |
| 2020/0105753 A1 | 4/2020 | Kotlyar et al. | |
| 2020/0105759 A1 | 4/2020 | Bowonder et al. | |
| 2020/0105871 A1 | 4/2020 | Glass et al. | |
| 2020/0135634 A1 | 4/2020 | Chiang et al. | |
| 2020/0135929 A1 | 4/2020 | Van Dal et al. | |
| 2020/0303509 A1 | 9/2020 | Mehandru et al. | |
| 2020/0312981 A1* | 10/2020 | Bomberger | H01L 29/34 |
| 2020/0365509 A1 | 11/2020 | Sasaki et al. | |
| 2021/0134721 A1 | 5/2021 | Chiang et al. | |
| 2021/0305381 A1 | 9/2021 | Chiang et al. | |
| 2021/0305428 A1 | 9/2021 | Ju et al. | |
| 2021/0336012 A1 | 10/2021 | Huang et al. | |
| 2021/0336019 A1 | 10/2021 | Su et al. | |

OTHER PUBLICATIONS

Non-Final Office Action dated Feb. 11, 2022 for U.S. Appl. No. 17/068,037.
Final Office Action dated May 18, 2022 for U.S. Appl. No. 17/068,037.
Notice of Allowance dated Sep. 30, 2022 for U.S. Appl. No. 17/068,037.
Non-Final Office Action dated Sep. 11, 2023 for U.S. Appl. No. 18/079,053.
Notice of Allowance dated Nov. 20, 2023 for U.S. Appl. No. 18/079,053.
Notice of Allowance dated Nov. 24, 2021 for U.S. Appl. No. 17/034,347.
Non-Final Office Action dated May 11, 2023 for U.S. Appl. No. 17/703,116.
Final Office Action dated Nov. 6, 2023 for U.S. Appl. No. 17/703,116.
Notice of Allowance dated Dec. 21, 2023 for U.S. Appl. No. 17/703,116.
Non-Final Office Action dated Dec. 4, 2024 for U.S. Appl. No. 18/629,002.
Non-Final Office Action dated Jun. 5, 2025 for U.S. Appl. No. 18/629,002.

* cited by examiner

METHOD FOR FORMING LONG CHANNEL BACK-SIDE POWER RAIL DEVICE

REFERENCE TO RELATED APPLICATIONS

This Application is a Continuation of U.S. application Ser. No. 18/079,053, filed on Dec. 12, 2022, which is a Continuation of U.S. application Ser. No. 17/068,037, filed on Oct. 12, 2020 (now U.S. Pat. No. 11,581,224, issued on Feb. 14, 2023), which claims the benefit of U.S. Provisional Application No. 63/021,740, filed on May 8, 2020. The contents of the above-referenced Patent Applications are hereby incorporated by reference in their entirety.

BACKGROUND

The semiconductor integrated circuit (IC) industry has experienced exponential growth. Technological advances in IC materials and design have produced generations of ICs where each generation has smaller and more complex circuits than the previous generation. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs. Such scaling down has also increased the complexity of processing and manufacturing ICs.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
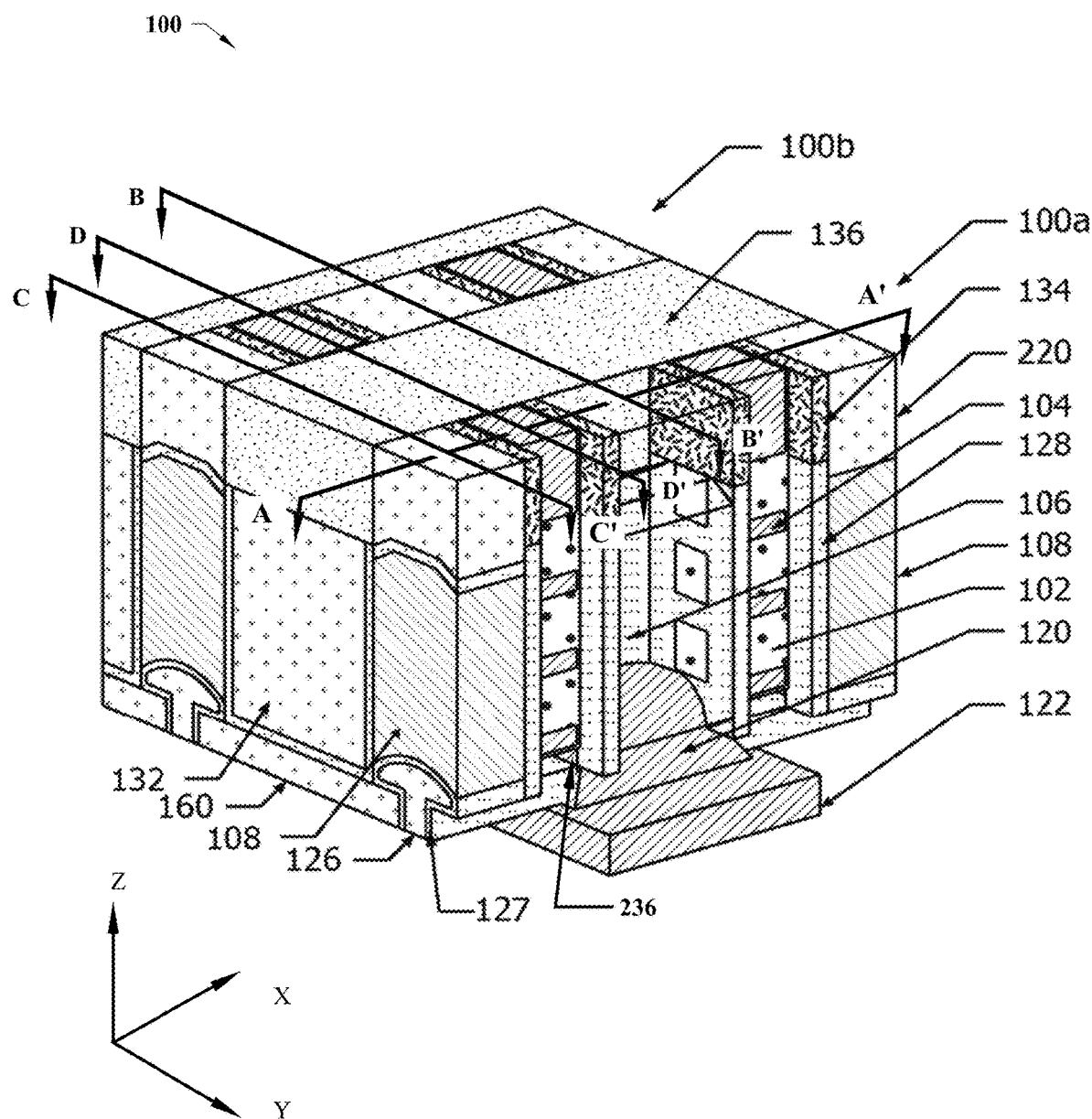
FIG. 1 illustrates a perspective view of some embodiments of a semiconductor transistor device having a recessed source/drain region.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

As used herein, "around," "about," "approximately," or "substantially" shall generally mean within 20 percent, or within 10 percent, or within 5 percent of a given value or range. Numerical quantities given herein are approximate, meaning that the term "around," "about," "approximately," or "substantially" can be inferred if not expressly stated.

Gate all around (GAA) transistor structures may be patterned by any suitable method. For example, the structures may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used to pattern the GAA transistor structures. After forming the GAA transistor structures, an interconnect structure may be formed thereover including power rails and signal lines disposed within interlayer dielectric (ILD) layers.

Current power rail design will suffer a complex metal layer routing in back-end-of-line (BEOL) when semiconductor process continues to shrink, for example, beyond 3 nm. As a result of complex metal layer routing, more masks are needed, and voltage drop (also referred as IR drop) suffers when metal wires become thinner.

In view of the above, the present disclosure is related to a semiconductor transistor device having a back-side power rail and manufacturing methods thereof. By moving a power rail from a front side to a back side of the semiconductor transistor device, the metal layer routing is relaxed in BEOL. Thus, fewer masks are needed, IR drop is improved, and both power rail area and active region can be enlarged.

More particularly, the present disclosure is related to a semiconductor transistor device with a back-side power rail and recessed source/drain regions and a method of manufacturing thereof. In some embodiments, the semiconductor transistor device comprises a channel structure, a gate structure wrapping around the channel structure, a first source/ drain epitaxial structure and a second source/drain epitaxial structure disposed on opposite sides of the channel structure, and a gate contact disposed on the gate structure. The semiconductor transistor device further comprises a back-side source/drain contact landing on a recessed bottom surface of the first source/drain epitaxial structure, and a back-side power rail disposed under and connecting the back-side source/drain contact. The back-side source/drain contact and the back-side power rail may comprise metal materials for example. In some embodiments, a bottom surface of the first source/drain epitaxial structure may be recessed to a location vertically deeper than a bottom surface of the gate structure or the channel structure.

In some embodiments, a bottom surface of the second source/drain epitaxial structure may also be recessed to a location vertically deeper than the bottom surface of the gate structure or the channel structure. The second source/drain epitaxial structure is recessed lower and thus further from the back-side power rail. Thus, a time dependent dielectric breakdown between the second source/drain epitaxial structure and the back-side power rail can be eliminated. Also, a back-side dielectric cap may replace original semiconductor body material and contact the bottom surfaces of the gate structure and the second source/drain epitaxial structure. The back-side dielectric cap may comprise an oxide, nitride, carbon nitride, or low-κ dielectric materials. Thus, cell capacitance can be reduced, and current leakage problems such as a leakage between the gate structure and the back-side source/drain contact can be eliminated.

In some further embodiments, the method of forming the semiconductor transistor device involves utilization of a protective spacer when recessing the bottom surface of the second source/drain epitaxial structure. When devices of different sizes need to be formed concurrently, there would be a loading effect between short channel transistor device and long channel transistor device. As one result of the loading effect, source/drain regions and/or other epitaxial structures may be formed with different depths. This depth difference would cause difficulties to remove substrate, recess the bottom surface of the source/drain regions, and then to cover with the back-side dielectric cap for both short channel transistor device and long channel transistor device: leaving substrate residues would introduce leakage while complete removal could damage the exposed epitaxial structure of the long channel transistor device. The protective spacer may be formed by partially removing the substrate to form a back-side capping trench while leaving a lower portion of the substrate along upper sidewalls of the first source/drain epitaxial structure and the second source/drain epitaxial structure. The protective spacer may be subsequently removed when recessing the first source/drain epitaxial structure and forming the back-side source/drain contact. These features are also illustrated below associating with figures as some exemplary embodiments.

The semiconductor transistor devices presented herein may include a p-type GAA device or an n-type GAA device. Further, the semiconductor transistor devices may have one or more channel regions, such as semiconductor fins, nanosheets, nanowires, nanodots, etc., associated with a single, contiguous gate structure, or multiple gate structures. One of ordinary skill may recognize other examples of semiconductor transistor devices that may benefit from aspects of the present disclosure. The semiconductor transistor devices may be a portion of an integrated circuit (IC) that may include static random access memory (SRAM), logic circuits, passive components, such as resistors, capacitors, and inductors, and/or active components, such as p-type field effect transistors (PFETs), n-type FETs (NFETs), multi-gate FETs, metal-oxide semiconductor field effect transistors (MOSFETs), complementary metal-oxide semiconductor (CMOS) transistors, bipolar transistors, high voltage transistors, high frequency transistors, other memory cells, and combinations thereof.

Figure 2:
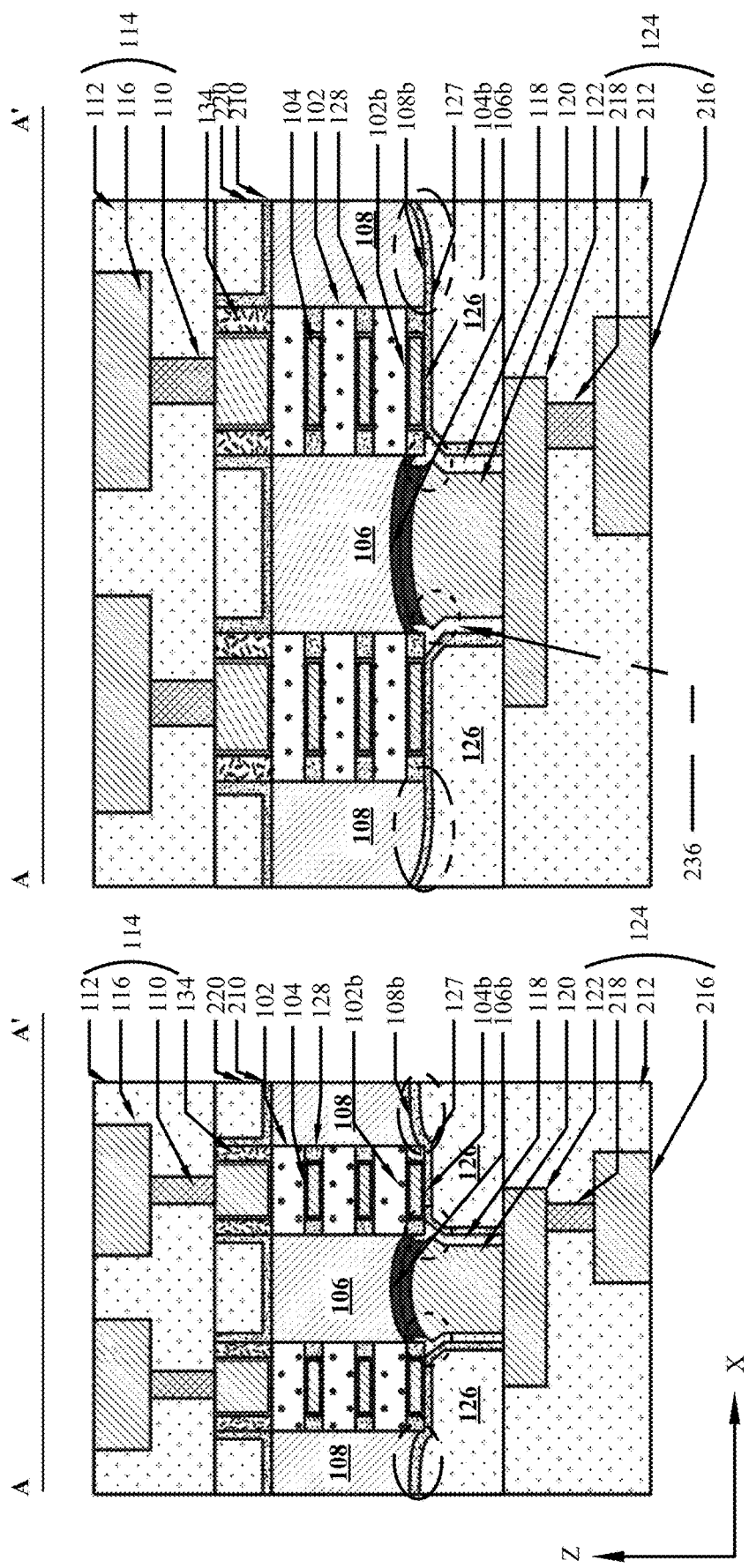
FIG. 2 illustrates a cross-sectional view of some additional embodiments of a semiconductor transistor device taken along line A-A' of FIG. 1.
Figure 3:
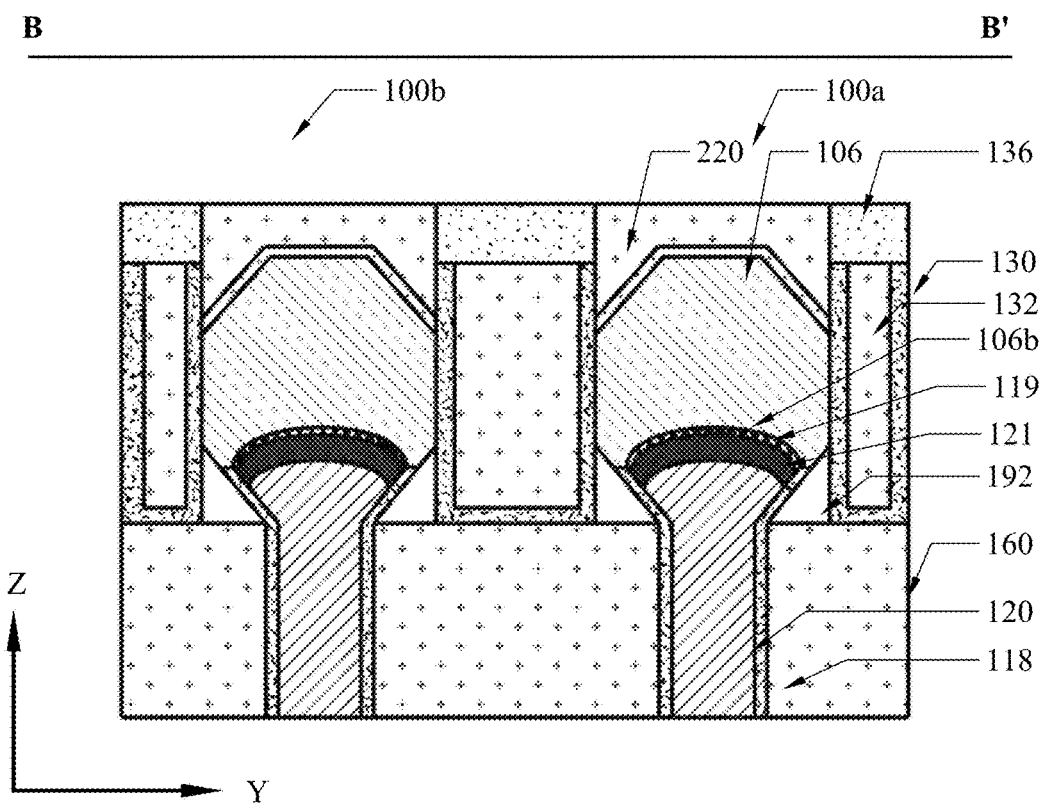
FIG. 3 is a cross-sectional view of some embodiments of a semiconductor transistor device taken along line B-B' of FIG. 1.
Figure 4:
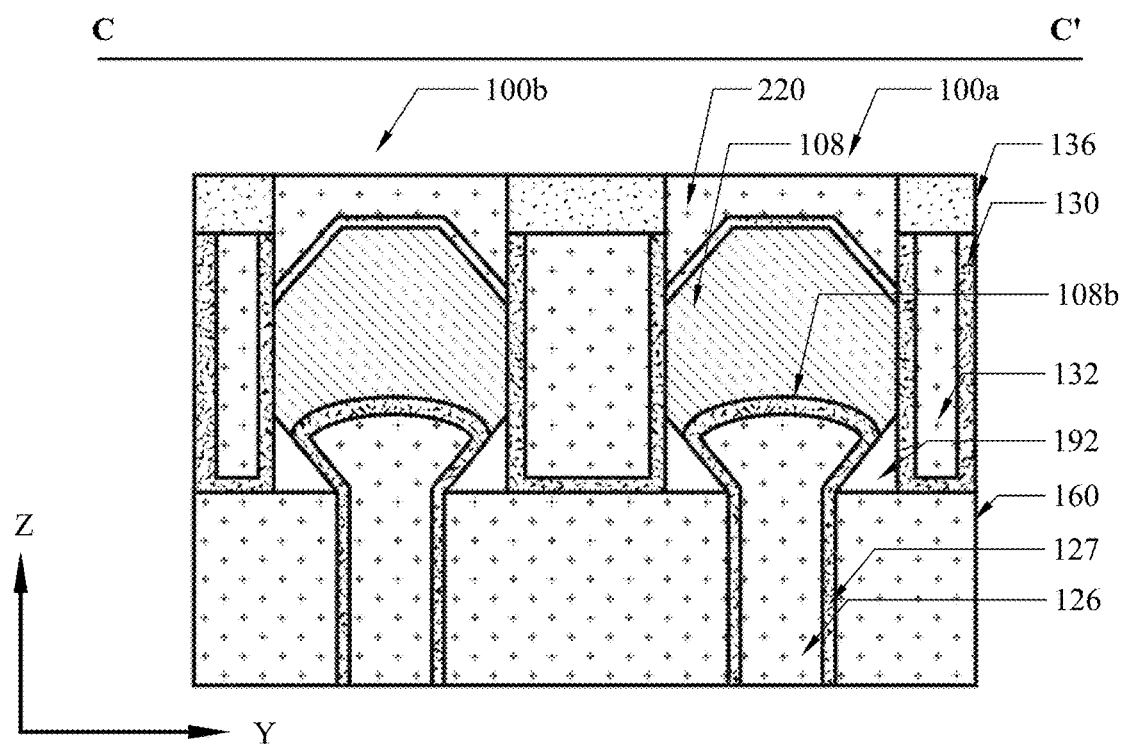
FIG. 4 is a cross-sectional view of some embodiments of a semiconductor transistor device taken along line C-C' of FIG. 1.
Figure 5:
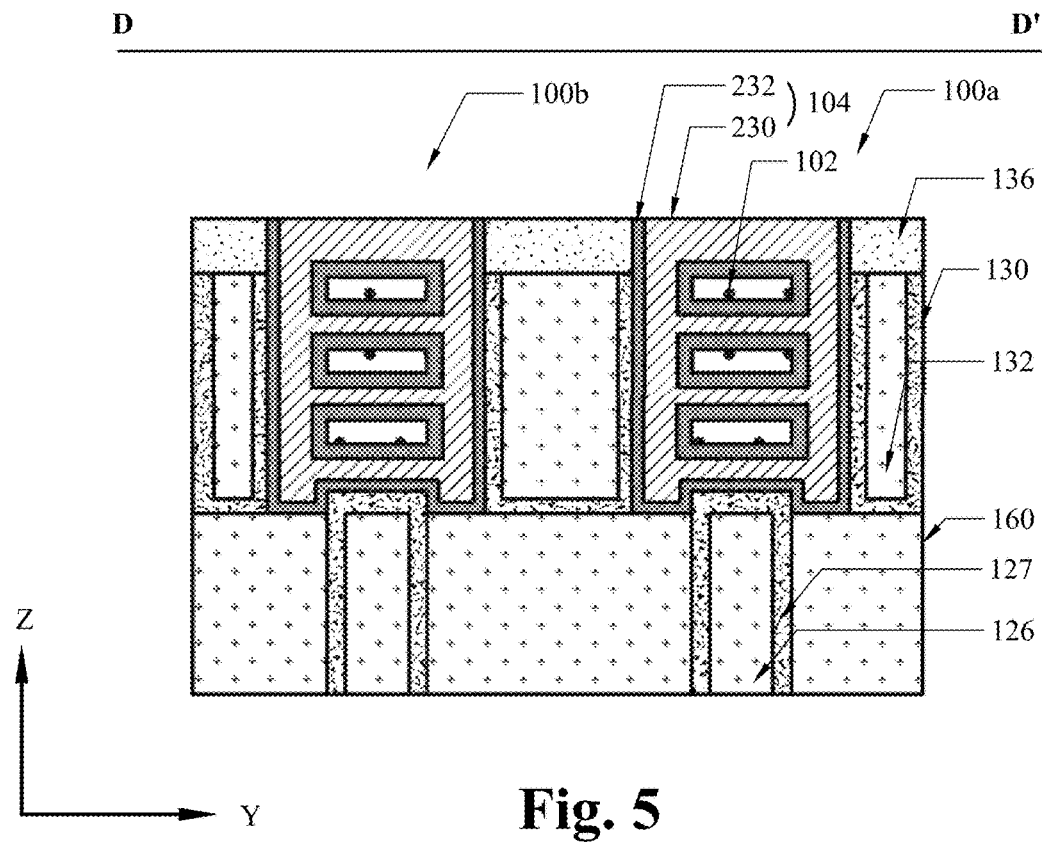
FIG. 5 is a cross-sectional view of some embodiments of a semiconductor transistor device taken along line D-D' of FIG. 1.

FIG. 1 shows a perspective view of a semiconductor transistor device 100 according to some embodiments. FIG. 2 shows a cross-sectional view taken along line A-A' of the x-direction of FIG. 1 according to some embodiments. FIGS. 3-5 show cross-sectional views taken respectively along line B-B', C-C', and D-D' of the y-direction in a first source/drain region, a gate region, and a second source/drain region of FIG. 1 according to some embodiments. Alternatively, FIGS. 2-5, and other cross-sectional figures hereafter, can also stand alone to show varies embodiments. Also, for illustration purposes, some components are removed, shown as transparent, or only shown with boundary lines. Also, features discussed associated with one figure may be omitted in another figure but may be incorporated to embodiments shown in that figure when applicable. FIG. 2 shows a short channel transistor device on left and a long channel transistor device on right that may be integrated in one substrate. Other than device dimensions, features of the short channel transistor device and the long channel transistor device may be similar unless stated otherwise.

As shown in FIGS. 1, 2, and 5, the semiconductor transistor device 100 comprises a channel structure 102 and a gate structure 104 wrapping around the channel structure 102. The channel structure 102 may comprise a stack of semiconductor layers separated and surrounded by a stack of metal components of the gate structure 104. A first source/drain epitaxial structure 106 and a second source/drain epitaxial structure 108 are disposed on opposite endings of the channel structure 102. As an example, the channel structure 102 may be pure silicon layers not doped with p-type and n-type impurities. A thickness of the channel structure 102 may be in a range between about 3 nm and about 15 nm. A width of the channel structure 102 may be in a range between about 6 nm and about 40 nm. As an example, the gate structure 104 may comprise a gate dielectric material such as high-κ materials (κ is greater than 7), a work function metal material, and a filling metal material such as tungsten or aluminum. A thickness of the gate structure 104 may be in a range between about 2 nm and about 10 nm. In some embodiments, the first and second source/drain epitaxial structures 106, 108 comprise a semiconductor material such as silicon, germanium, or silicon germanium. The first and second source/drain epitaxial structures 106, 108 may be hexagonal or diamond-like shapes. The first and second source/drain epitaxial structures 106, 108 may respectively be a source region and a drain region of the semiconductor transistor device 100.

As shown in FIG. 2, on a front side of the semiconductor transistor device 100, a front-side interconnect structure 114 may be disposed over the gate structure 104 and the first and second source/drain epitaxial structures 106, 108. The front-side interconnect structure 114 may comprise a plurality of front-side metal layers 116 disposed within and surrounded by a front-side interlayer dielectric layer 112. The front-side metal layers 116 includes vertical interconnects, such as vias or contacts, and horizontal interconnects, such as metal lines. The front-side interconnect structure 114 electrically connects various features or structures of the semiconductor transistor device. For example, a gate contact 110 may be disposed on the gate structure 104 and connected to external circuits through the front-side metal layers 116.

On a back side of the semiconductor transistor device 100, in some embodiments, a back-side source/drain contact 120 is disposed underlying the first source/drain epitaxial structure 106 and connects the first source/drain epitaxial structure 106 to a back-side power rail 122 disposed under the back-side source/drain contact 120. A back-side interconnect structure 124 may be formed to be electrically coupled to the back-side source/drain contact 120. The back-side interconnect structure 124 may comprise a plurality of back-side metal lines 216 and metal vias 218 disposed within and surrounded by a back-side interlayer dielectric layer 212. The back-side interconnect structure 124 electrically connects various features or structures of the semiconductor transistor device. For example, back-side interconnect structure 124 may comprise a back-side power rail 122 that connects external circuits to the back-side source/drain contact 120. The back-side source/drain contact 120 and the back-side power rail 122 may comprise metal materials for example. For example, the back-side source/drain contact 120 may comprise metal, such as tungsten (W), cobalt (Co), ruthenium (Ru), aluminum (Al), copper (Cu), or other suitable materials. As an example, the back-side source/drain contact 120 may have a thickness between about 5 nm to about 50 nm and a width between about 20 nm to about 40 nm. Thus, the first source/drain epitaxial structure 106 can be connected to external circuits from the back side of the semiconductor transistor device 100 through the back-side source/drain contact 120. Thereby, more metal routing flexibility is provided, and the cell capacitance can be reduced. In some embodiments, a first dielectric liner 118 is disposed along a sidewall of the back-side source/drain contact 120. As an example, the first dielectric liner 118 may have a thickness less than about 5 nm.

As shown in FIGS. 1-3, the back-side source/drain contact 120 may land on a recessed bottom surface 106b of the first source/drain epitaxial structure 106. In some embodiments, the bottom surface 106b of the first source/drain epitaxial structure 106 may be recessed as a convex shape reaching a location vertically deeper than a bottom surface 104b of the gate structure 104. In some embodiments, the bottom surface 106b of the first source/drain epitaxial structure 106 may have a convex shape along x-direction from the first source/drain epitaxial structure 106 to the second source/drain epitaxial structure 108 as shown in FIG. 2 and also have a convex shape along y-direction as shown in FIG. 3. The y-direction may be perpendicular to the x-direction. In some embodiments, the bottom surface 106b of the first source/drain epitaxial structure 106 may be vertically about 5 nm higher to about 20 nm deeper than the bottom surface 104b of the gate structure 104. In some embodiments, a low temperature epitaxial layer 119 may be disposed between the recessed bottom surface 106b of the first source/drain epitaxial structure 106 and the back-side source/drain contact 120, and a metal alloy layer 121 may be disposed on the low temperature epitaxial layer 119. The low temperature epitaxial layer 119 may have a doping concentration greater than that of the first source/drain epitaxial structure 106, such that a better metal alloy layer 121 can be formed subsequently to gain performance. As an example, the low temperature epitaxial layer 119 may have a thickness less than about 20 nm. The metal alloy layer 121 may be formed on the first source/drain epitaxial structure 106 for contact landing. The metal alloy layer 121 may be a silicide layers formed by a self-aligned salicide process. The metal alloy layer 121 may include a material selected from titanium silicide, cobalt silicide, nickel silicide, platinum silicide, nickel platinum silicide, erbium silicide, palladium silicide, combinations thereof, or other suitable materials. In some embodiments, the metal alloy layer 121 may include germanium.

As shown in FIGS. 1, 2, and 4, a bottom surface 108b of the second source/drain epitaxial structure 108 may be recessed to a location vertically equal to or even deeper than the bottom surface 104b of the gate structure 104. The bottom surface 108b of the second source/drain epitaxial structure 108 may be recessed even deeper to a location vertically exceeding a bottom surface 102b of the channel structure 102. In some embodiments, the bottom surface 108b of the second source/drain epitaxial structure 108 may have a convex shape along x-direction from the first source/drain epitaxial structure 106 to the second source/drain epitaxial structure 108 as shown in FIG. 2 and also have a convex shape along y-direction as shown in FIG. 4. The y-direction may be perpendicular to the x-direction. In some embodiments, the bottom surface 108b of the second source/drain epitaxial structure 108 may be vertically about 15 nm higher to about 30 nm deeper than the bottom surface 104b of the gate structure 104. The recessed bottom surface 108b of the second source/drain epitaxial structure 108 may be lower in the short channel transistor device than in the long channel transistor device. The bottom surface 108b may be recessed to a location shallower in the long channel transistor device than in the short channel transistor device. The cell capacitance is further reduced compared to the embodiments where the bottom surface 108b of the second source/drain epitaxial structure 108 is below the bottommost of the channel structure 102.

As shown in FIGS. 1-2 and 4-5, on the back side of the semiconductor transistor device 100, in some embodiments, a back-side dielectric cap 126 is disposed under the gate structure 104. The back-side dielectric cap 126 may also extend under the second source/drain epitaxial structure 108. The back-side dielectric cap 126 may be surrounded by the lower isolation structure 160. The back-side dielectric cap 126 replaces original semiconductor body material, helps to separate and insulate the gate structure 104 and the back-side source/drain contact 120, and thus reduces cell capacitance and eliminates current leakage problems such as a leakage between the gate structure 104 and the back-side source/drain contact 120. The back-side dielectric cap 126 may comprise an oxide, nitride, carbon nitride, or low-κ dielectric materials. In some embodiments, a second dielectric liner 127 lines inner sidewalls of the back-side dielectric cap 126. The second dielectric liner 127 protects the second source/drain epitaxial structure 108 from oxidation, and also prevents metal gate threshold shift during manufacturing processes. The second dielectric liner 127 may comprise a dielectric material.

As shown in FIGS. 1-2, in some embodiments, the back-side source/drain contact 120 may comprise a ledge 236 extended directly below the gate structure 104. The back-side source/drain contact 120 may contact the second dielectric liner 127 or the back-side dielectric cap 126 if the second dielectric liner 127 is omitted. In some embodiments, the ledge 236 may be a result of formation and removal of a protective spacer as stated above or described below associated with FIGS. 23-32B. As an example, the ledge 236 may have a width smaller than 5 nm and a height smaller than 20 nm. Also, inner spacers 128 may be disposed on opposite endings of the metal components of the gate structure 104 to isolate the gate structure 104 from the first and second source/drain epitaxial structures 106, 108. The ledge 236 may also contact the inner spacers 128 and/or the gate structure 104. In some embodiments, gate spacers 134 are disposed along opposite sidewalls of an upper portion of the gate structure 104. The outer surfaces of the inner spacers 128 may be substantial coplanar with outer surfaces of the channel structure 102 and/or the gate spacers 134. In some embodiments, an upper isolation structure 220 is disposed in trenches between the gate spacers 134. The upper isolation structure 220 provides electrical insulation between the gate structures 104.

As shown in FIG. 5, in some embodiments, a gate structure 104 comprises a gate dielectric layer 232 and a gate electrode 230. The gate electrode 230 includes one or more work function metal layer (s) and a filling metal. The gate dielectric layer 232 may be conformally formed lining outer surfaces of the gate electrode 230. The gate dielectric layer 232 may be in contact with the lower isolation structure 160 and a channel structure 102. In some embodiments, the gate dielectric layer 232 includes a high-κ material (κ is greater than 7) such as hafnium oxide ($HfO_2$), zirconium oxide ($ZrO_2$), lanthanum oxide ($La_2O_3$), hafnium aluminum oxide ($HfAlO_2$), hafnium silicon oxide ($HfSiO_2$), aluminum oxide ($Al_2O_3$), or other suitable materials.

As shown in FIGS. 1 and 3-5, in some embodiments, a lower isolation structure 160, a middle isolation structure 132, and a hard mask 136 can collectively function as an insulating structure separating two semiconductor transistor devices 100a, 100b along the y-direction. In some embodiments, air gaps 192 may be formed surrounding lower portions of the first source/drain epitaxial structure 106 and the second source/drain epitaxial structure 108.

FIGS. 6-33B illustrate a method for manufacturing a semiconductor transistor device at various stages in accordance with some embodiments of the present disclosure. In some embodiments, the semiconductor transistor device shown in FIGS. 6-33B may be intermediate devices fabricated during processing of an integrated circuit (IC), or a portion thereof, that may include static random access memory (SRAM), logic circuits, passive components, such as resistors, capacitors, and inductors, and/or active components, such as p-type field effect transistors (PFETs), n-type FETs (NFETs), multi-gate FETs, metal-oxide semiconductor field effect transistors (MOSFETs), complementary metal-oxide semiconductor (CMOS) transistors, bipolar transistors, high voltage transistors, high frequency transistors, other memory cells, and combinations thereof.

Figure 6:
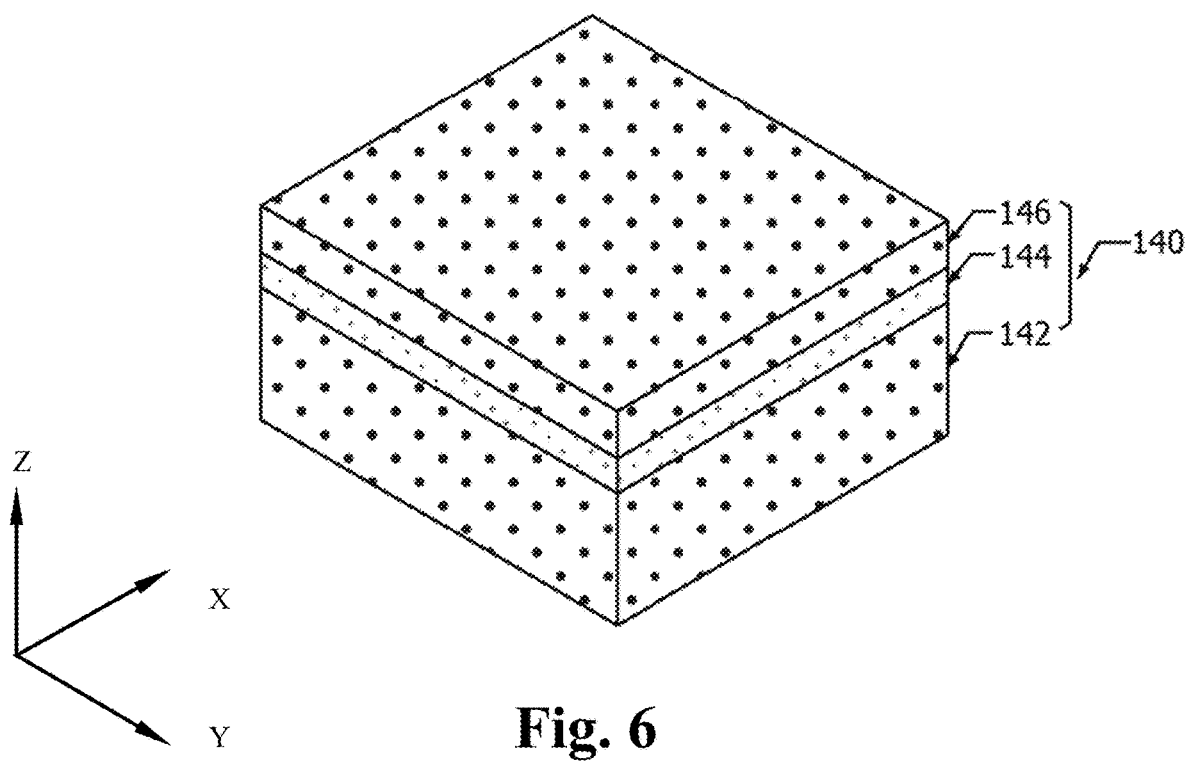
FIGS. 6-33B illustrate various views of some embodiments of a method of forming a semiconductor transistor device having a recessed source/drain region at various stages.

As shown in a perspective view of FIG. 6, a substrate 140 is provided. In some embodiments, the substrate 140 may be a part of a wafer, and may comprise silicon (Si), germanium (Ge), silicon germanium (SiGe), gallium arsenide (GaAs) or other appropriate semiconductor materials. In some embodiments, the substrate 140 is a semiconductor-on-insulator (SOI) structure comprising a bulk substrate 142, an insulator substrate layer 144 on the bulk substrate 142, and a semiconductor substrate layer 146 on the insulator substrate layer 144. In various embodiments, the substrate 140 may include any of a variety of substrate structures and materials.

Figure 7:
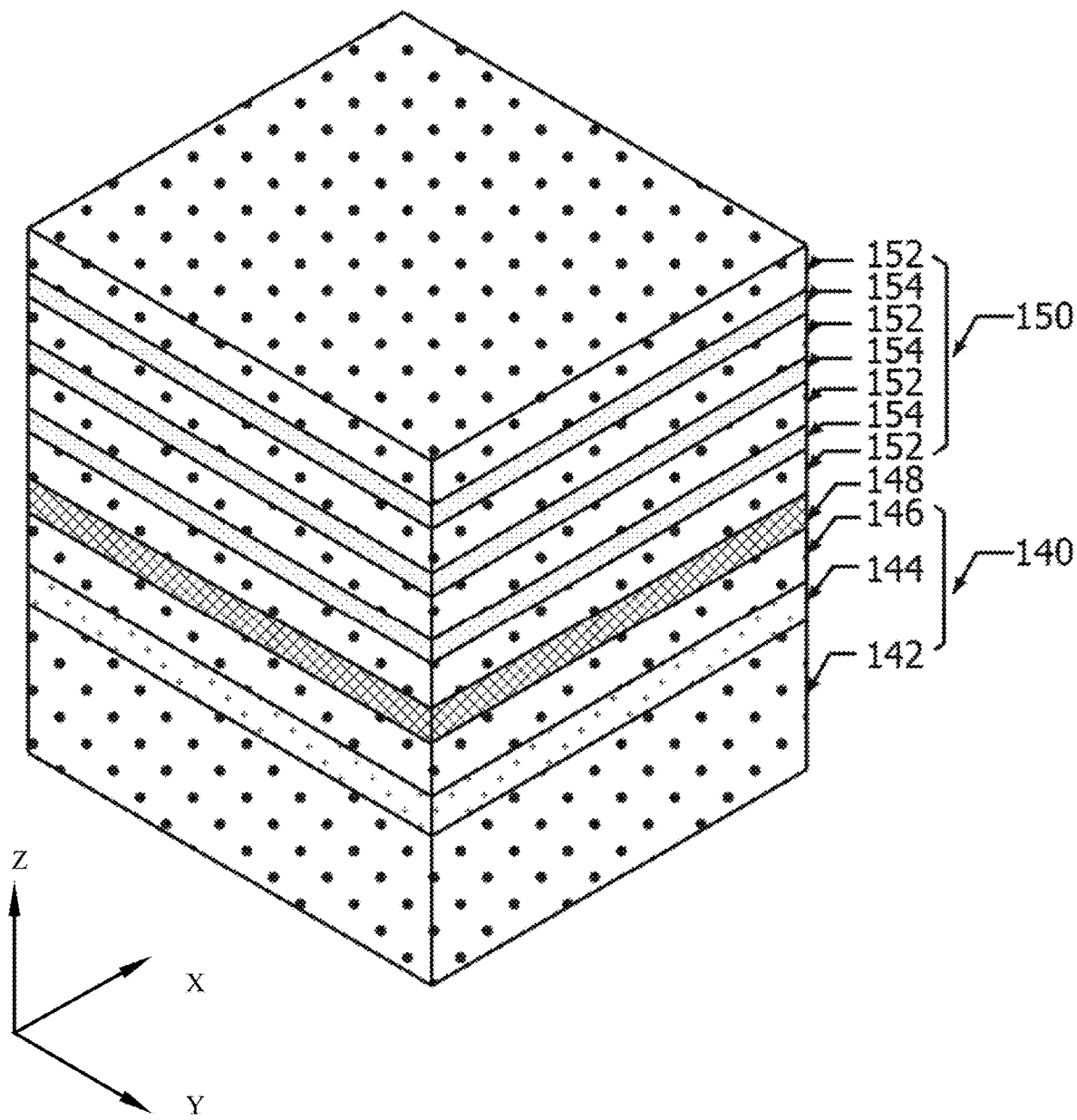
Figure 22A:
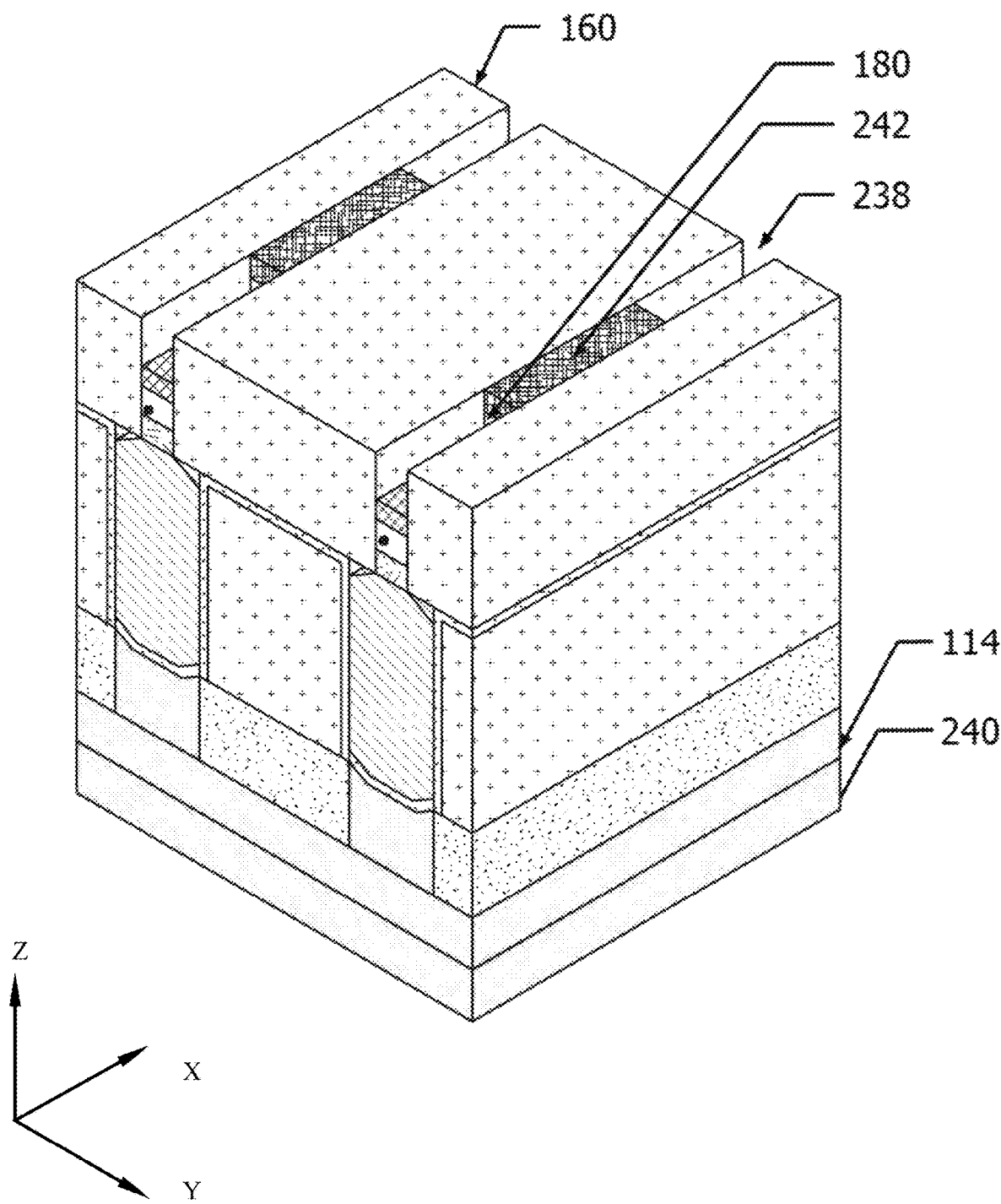

As shown in a perspective view of FIG. 7, in some embodiments, an etch stop layer 148 is formed over the substrate 140, and a stacked structure 150 is formed over the etch stop layer 148. The etch stop layer 148 may server as an etch stop layer for subsequent substrate removal process as shown in FIG. 22. The etch stop layer 148 is made of a material having a different etching rate than the semiconductor substrate layer 146 and may be made of Si, a Si compound, SiGe, Ge or a Ge compound. The stacked structure 150 includes first semiconductor layers 152 and second semiconductor layers 154 stacked alternately. The first semiconductor layers 152 will serve as channel regions of the semiconductor transistor device. The second semiconductor layers 154 are sacrificial layers which will be subsequently removed and replaced with a gate material. The first semiconductor layers 152 and the second semiconductor layers 154 are made of materials having different lattice constants, and may include one or more layers of Si, Ge, SiGe, GaAs, InSb, GaP, GaSb, InAlAs, InGaAs, GaSbP, GaAsSb or InP. In some embodiments, the first semiconductor layers 152 and the second semiconductor layers 154 are made of Si, a Si compound, SiGe, Ge or a Ge compound. The stacked structure 150 may be formed on the substrate 140 through epitaxy, such that the stacked structure 150 forms crystalline layers. Though FIG. 7 shows four layers of the first semiconductor layer 152 and three layers of the second semiconductor layer 154, the number of the layers are not so limited, and may be as small as 1 for each layer. In some embodiments, 2-10 layers of each of the first and second semiconductor layers are formed. By adjusting the numbers of the stacked layers, a driving current of the semiconductor transistor device can be adjusted.

In some embodiments, the first semiconductor layers 152 may be pure silicon layers that are free from germanium. The first semiconductor layers 152 may also be substantially pure silicon layers, for example, with a germanium atomic percentage lower than about 1 percent. Furthermore, the first semiconductor layers 152 may be intrinsic, which are not doped with p-type and n-type impurities. In some embodiments, a thickness of the first semiconductor layers 152 is in a range between about 3 nm and about 15 nm.

In some embodiments, the second semiconductor layers 154 can be SiGe layers having a germanium atomic percentage greater than zero. In some embodiments, the germanium percentage of the second semiconductor layers 154 is in a range between about 10 percent and about 50 percent. In some embodiments, a thickness of the second semiconductor layers 154 is in a range between about 2 nm and about 10 nm.

Figure 8:
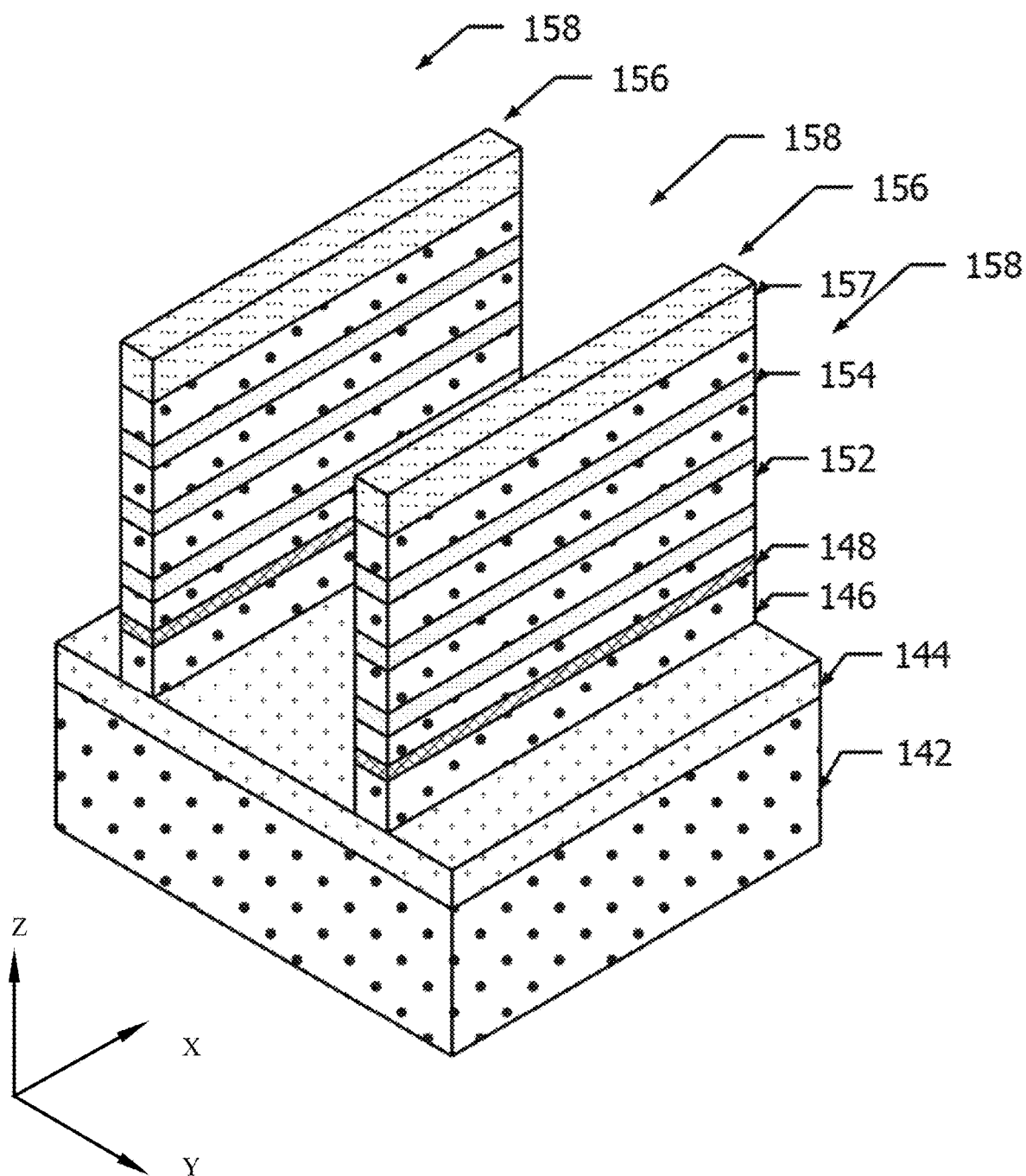

As shown in a perspective view of FIG. 8, in some embodiments, the stacked structure 150 (see FIG. 7) is patterned to form fin structures 156 and trenches 158 extending in the X direction. In some embodiments, the stacked structure 150 is patterned by an etching process using a patterned mask layer 157 as an etch mask, such that portions of the stacked structure 150 not covered by the mask layer 157 are removed. The semiconductor substrate layer 146 and the etch stop layer 148 not covered by the mask layer 157 may also be partially or fully removed in this process. The mask layer 157 may include a first mask layer and a second mask layer. The first mask layer may be a pad oxide layer made of a silicon oxide, which can be formed by a thermal oxidation process. The second mask layer may be made of a silicon nitride (SiN), which is formed by chemical vapor deposition (CVD), including low pressure CVD (LPCVD) and plasma enhanced CVD (PECVD), physical vapor deposition (PVD), atomic layer deposition (ALD), or other suitable process. The mask layer 157 may be patterned using varies multiple patterning techniques, such as self-aligned double patterning (SADP), self-aligned quadruple patterning (SAQP), and the like. FIG. 8 shows two fin structures 156 arranged in the Y direction and parallel to each other, but the number of the fin structures is not limited to, and may be as small as one and three or more. In some embodiments, one or more dummy fin structures are formed on both sides of the fin structures 156 to improve pattern fidelity in the patterning operations.

Figure 9:
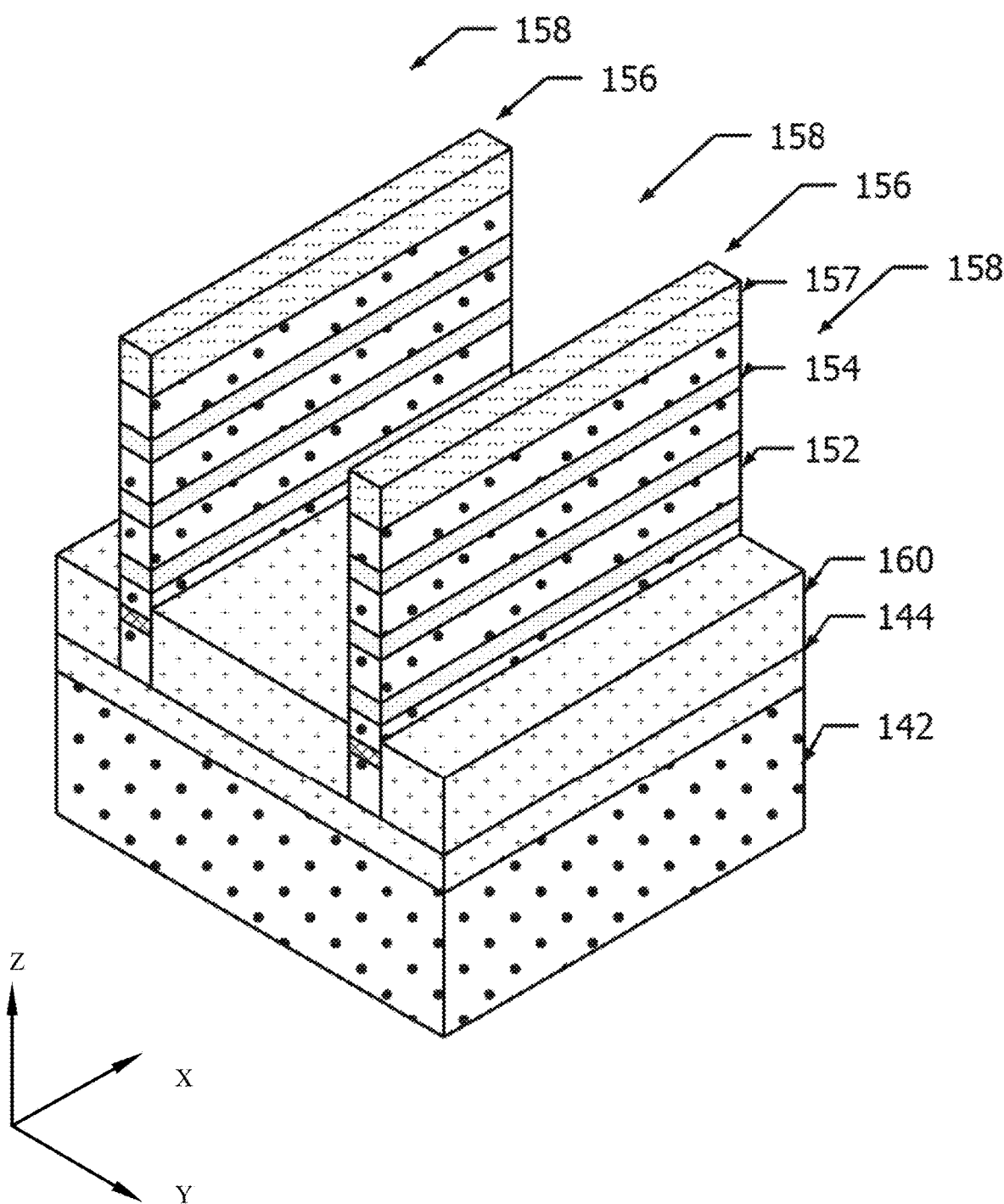

As shown in a perspective view of FIG. 9, in some embodiments, a lower isolation structure 160 is formed over the insulator substrate layer 144 in lower portions of the trenches 158, which is also referred to as a shallow trench isolation (STI) structure. Upper portions of the fin structures 156 are exposed from the lower isolation structure 160. The lower isolation structure 160 may be formed by forming an insulating material over the insulator substrate layer 144 followed by a planarization operation. The insulating material is then recessed to form the lower isolation structure 160 so that the upper portions of the fin structures 156 are exposed. The insulating material may comprise a dielectric material such as, for example, a nitride (e.g., silicon nitride, silicon oxynitride, silicon oxygen carbon nitride, silicon carbon nitride), a carbide (e.g., silicon carbide, silicon oxygen carbide), an oxide (e.g., silicon oxide), borosilicate glass (BSG), phosphoric silicate glass (PSG), borophosphosilicate glass (BPSG), a low-κ dielectric material with a dielectric constant less than 7 (e.g., a carbon doped oxide, SiCOH), or the like. In some embodiments, the lower isolation structures 160 are formed through various steps comprising a thermal oxidation or deposition process (e.g., physical vapor deposition (PVD), chemical vapor deposition (CVD), plasma enhanced chemical vapor deposition (PECVD), atomic layer deposition (ALD), sputtering, etc.), and removal processes (e.g., wet etching, dry etching, chemical mechanical planarization (CMP), etc.).

Figure 10:
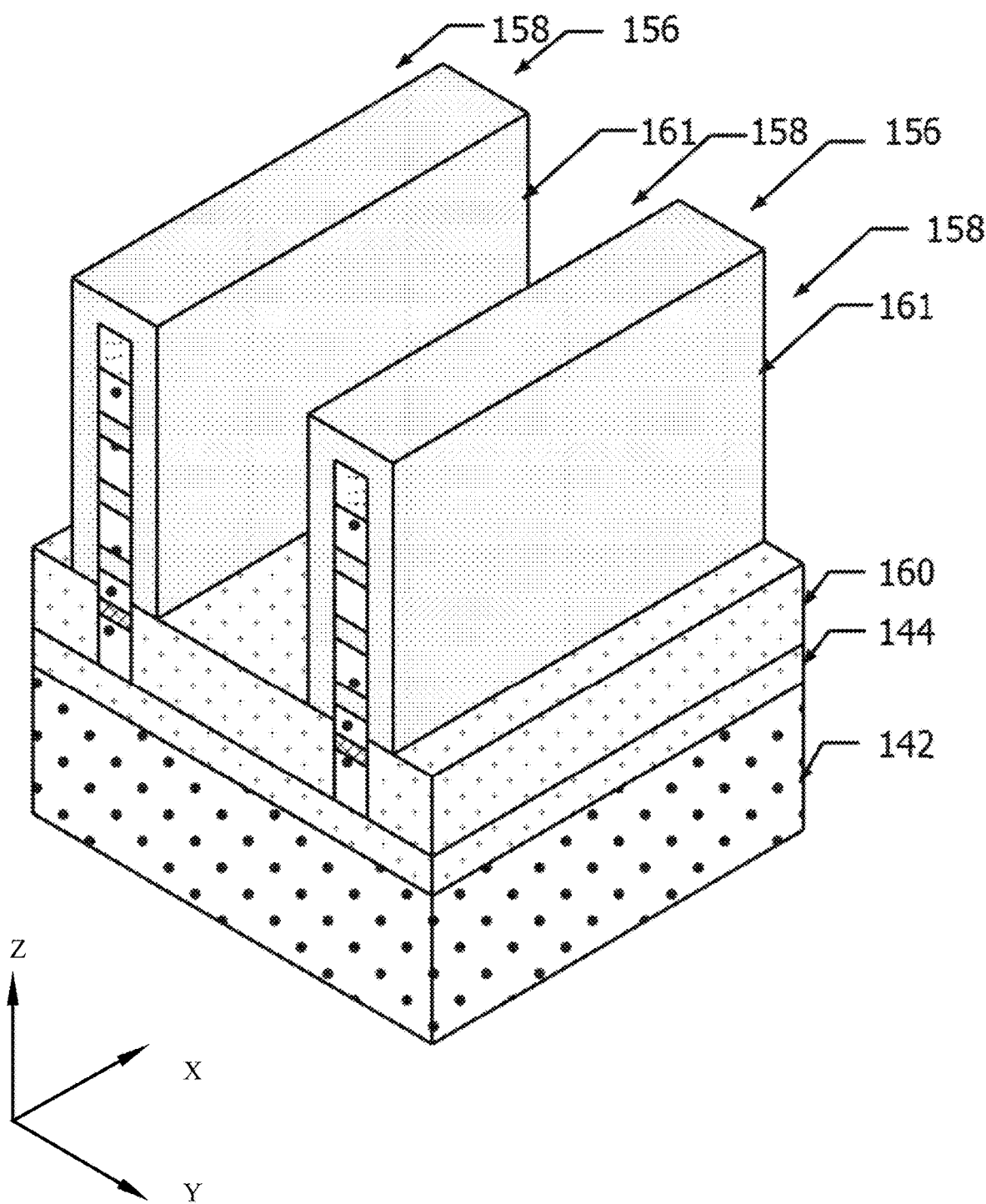

As shown in a perspective view of FIG. 10, in some embodiments, a cladding semiconductor layer 161 is formed over outer surfaces of the fin structures 156. In some embodiments, the cladding semiconductor layer 161 comprises a semiconductor material, such as germanium, silicon germanium, or the like. In some embodiments, the cladding semiconductor layer 161 comprises the same material as the second semiconductor layers 154. Further, in some embodiments, the cladding semiconductor layer 161 may be formed by an epitaxy growth process or a deposition process (e.g., PVD, CVD, PECVD, ALD, sputtering, etc.).

Figure 11:
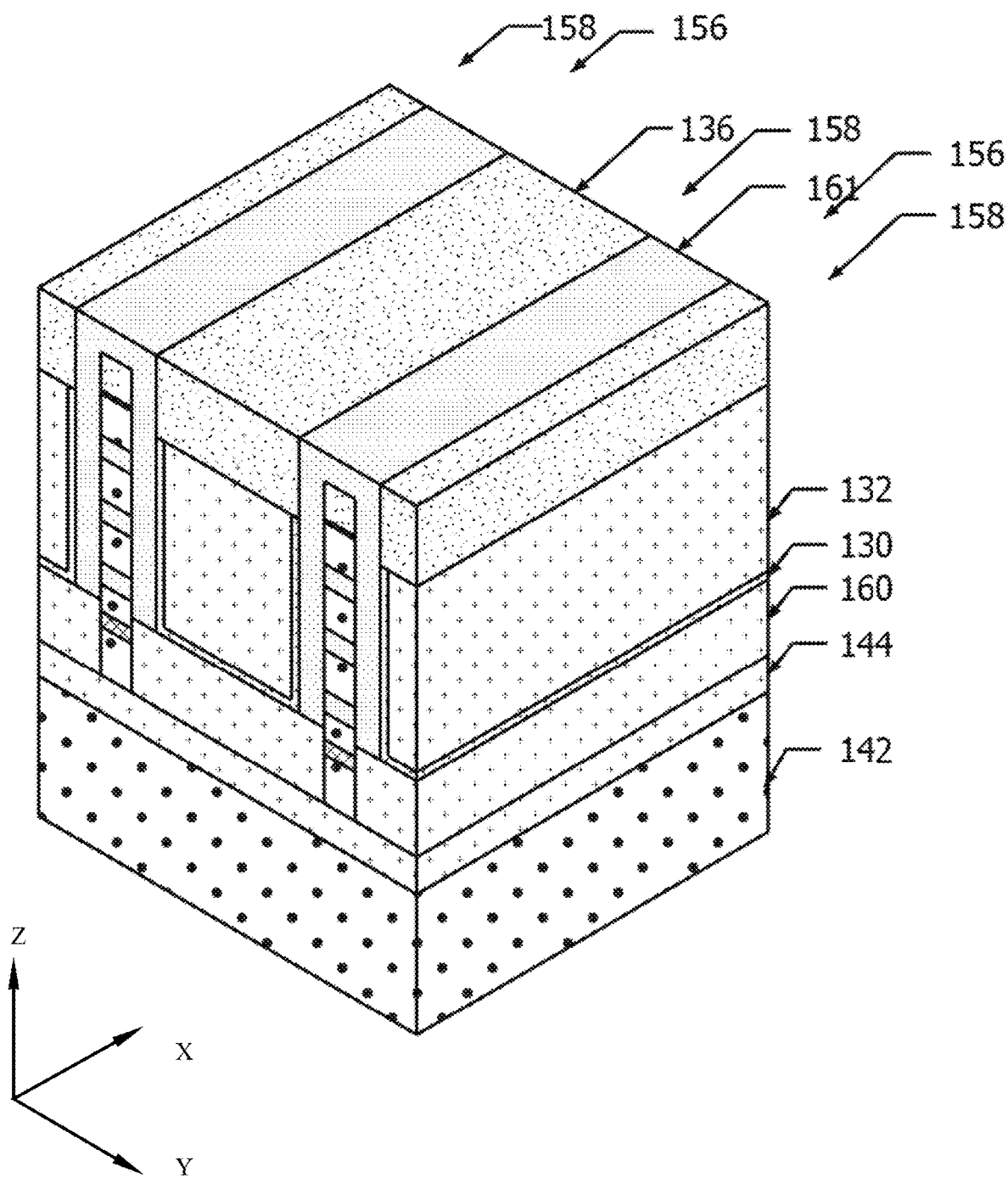

As shown in a perspective view of FIG. 11, in some embodiments, a middle isolation structure 132 is formed over the lower isolation structure 160 between the fin structures 156. A dielectric liner 130 may be formed between the middle isolation structure 132 and the lower isolation structure 160 along sidewalls of the cladding semiconductor layer 161 and the lower isolation structure 160. A hard mask 136 may then be formed on top of the middle isolation structure 132 and the dielectric liner 130. The middle isolation structure 132 and the dielectric liner 130 provide electrical insulation between the fin structures 156, and the hard mask 136 prevents loss of the middle isolation structure 132 during future patterning steps.

In some embodiments, the dielectric liner 130, the middle isolation structure 132, and the hard mask 136 are formed by deposition (e.g., PVD, CVD, PECVD, ALD, sputtering, etc.) and removal (e.g., etching, chemical mechanical planarization (CMP), etc.) processes. The middle isolation structure 132 may have a top surface below that of the fin structures 156. In some embodiments not shown in FIG. 11, the planarization process of the hard mask 136 may also remove the cladding semiconductor layer 161 from above the fin structures 156. The hard mask 136 may have a top surface coplanar with that of the fin structures 156. In some embodiments, the middle isolation structure 132 and the lower isolation structures 160 may each comprise a low-κ dielectric material, wherein the dielectric constant is less than 7, such as, for example, silicon oxynitride, silicon carbon nitride, silicon oxygen carbide, silicon oxygen carbon nitride, silicon nitride, or some other suitable low-κ dielectric material. The dielectric liner 130 may comprise a different material than the middle isolation structure 132 for selective removal processes. The hard mask 136 may comprise a high-κ dielectric material, wherein the dielectric constant is greater than 7, such as, for example, hafnium oxide, zirconium oxide, hafnium aluminum oxide, hafnium silicon oxide, aluminum oxide, or some other suitable high-κ dielectric material.

Figure 12:
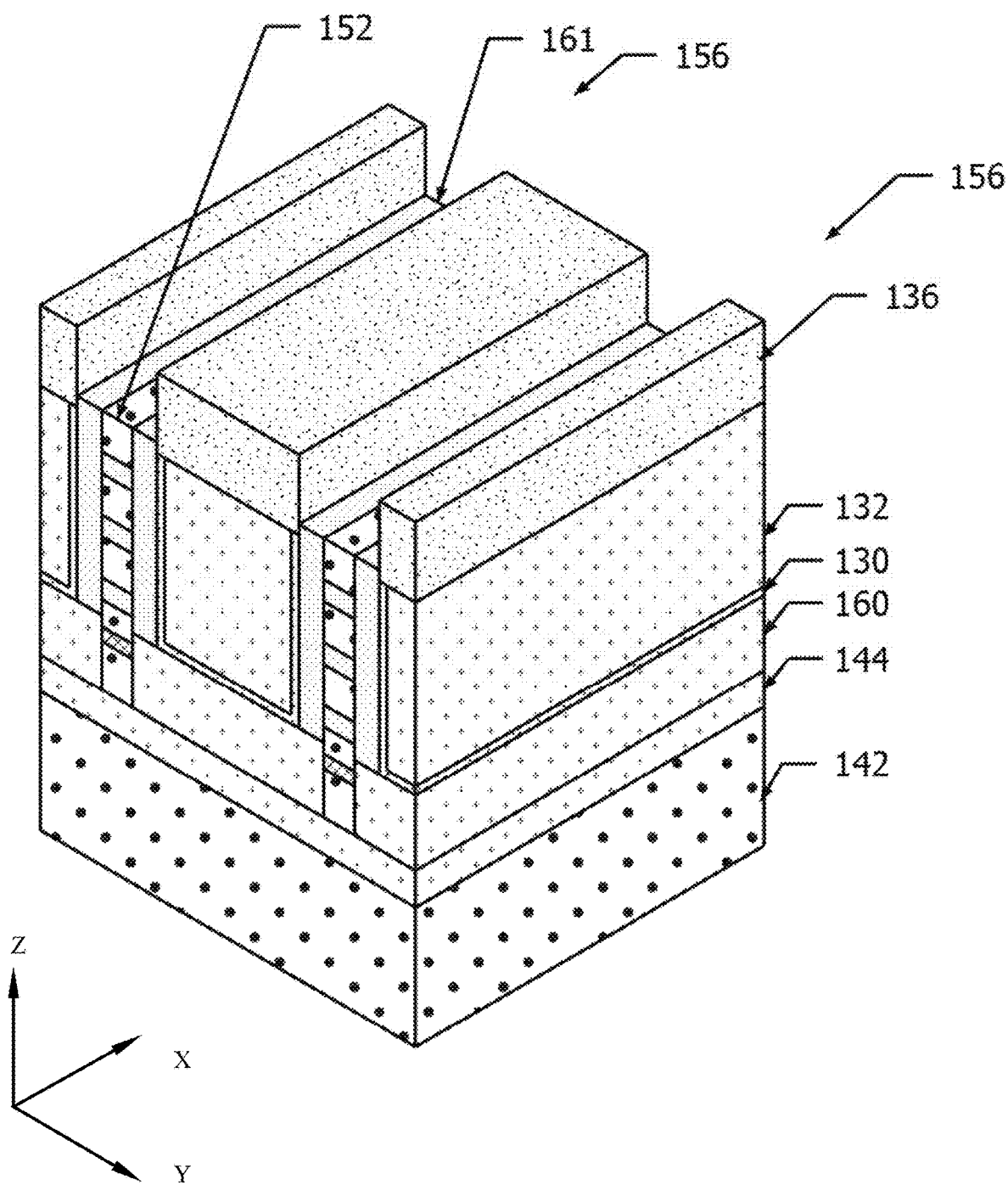

As shown in the perspective view of FIG. 12, in some embodiments, the cladding semiconductor layer 161 and the mask layer 157 are etched from top of the fin structures 156. Top surfaces of the first semiconductor layer 152 and the cladding semiconductor layer 161 may be exposed from the removal process. In some embodiments, the hard mask 136 is selectively etched by a dry etching process and/or a wet etching process, for example.

Figure 13:
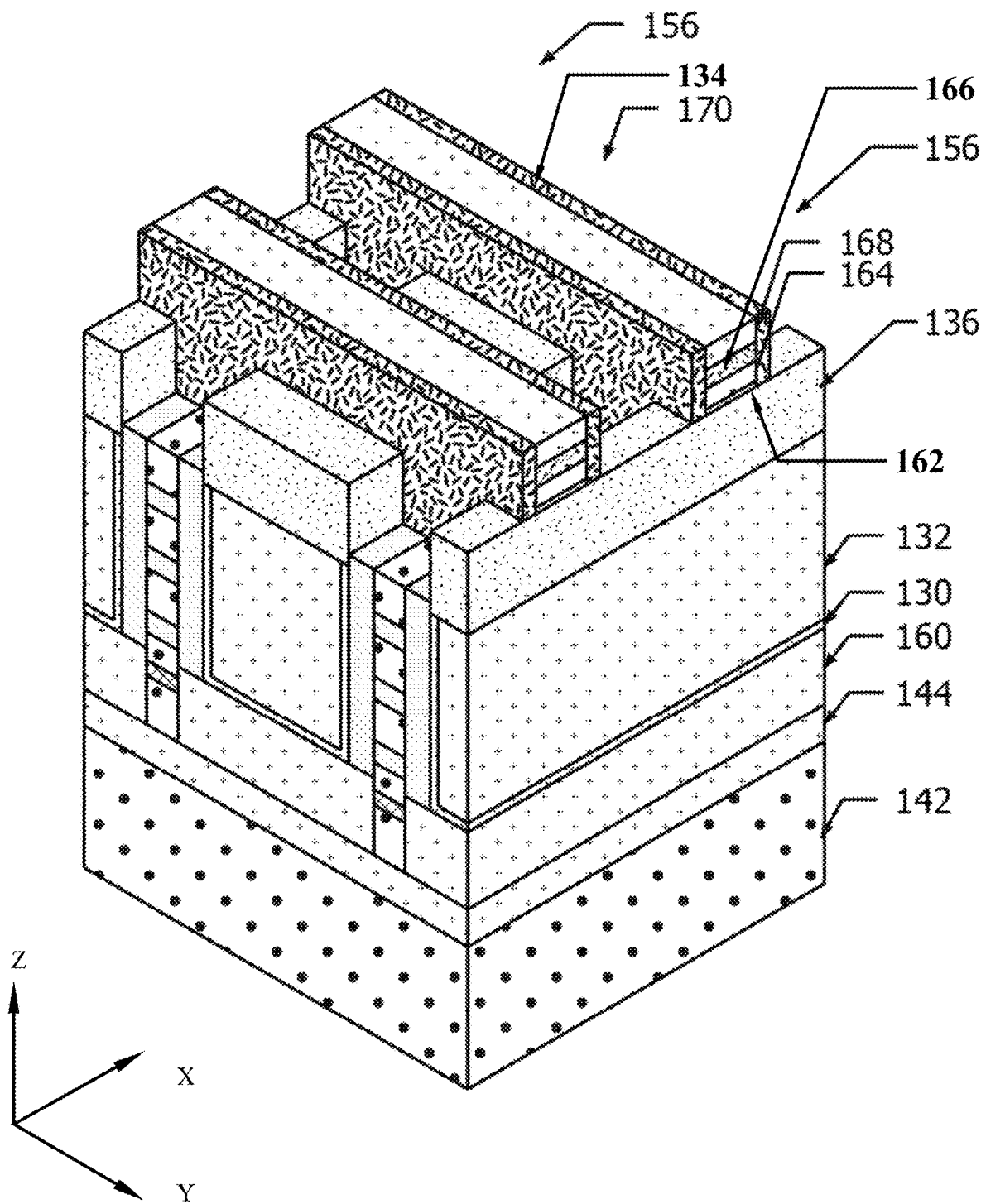

As shown in the perspective view of FIG. 13, in some embodiments, dummy gate structures 170 are formed over the fin structures 156 along the y-direction spaced apart from one another in the x-direction. In some embodiments, the dummy gate structures 170 may comprise a sacrificial gate dielectric layer 162, a sacrificial gate electrode layer 164, a pad layer 166, and a mask layer 168 one stacked over another in the order stated. Though two dummy gate structures 170 are shown in FIG. 13, but the number of the dummy gate structures 170 are not limited to, and may be more or fewer than two. In some embodiments, the sacrificial gate dielectric layer 162 may comprise, for example, a dielectric material such as a nitride (e.g., silicon nitride, silicon oxynitride), a carbide (e.g., silicon carbide), an oxide (e.g., silicon oxide), or some other suitable material. The sacrificial gate electrode layer 164 may comprise, for example, polysilicon. The pad layer 166 and the mask layer 168 may comprise thermal oxide, nitride, and/or other hard mask materials and are formed by way of photolithography processes.

Subsequently, gate spacers 134 may be formed along opposite sidewalls of the dummy gate structures 170. For example, a blanket layer of an insulating material for sidewall spacers is conformally formed to cover the dummy gate structures 170 by using plasma enhanced chemical vapor deposition (PECVD), low-pressure chemical vapor deposition (LPCVD), sub-atmospheric chemical vapor deposition (SACVD), or the like. The blanket layer is deposited in a conformal manner so that it is formed to have substantially equal thicknesses on vertical surfaces, such as the sidewalls, horizontal surfaces, and the top of the dummy gate structures 170. In some embodiments, the insulating material of the blanket layer may comprise a silicon nitride-based material. The blanket layer is then etched using an anisotropic process to form the gate spacers 134 on opposite sidewalls of the dummy gate structures 170.

Figure 14A:
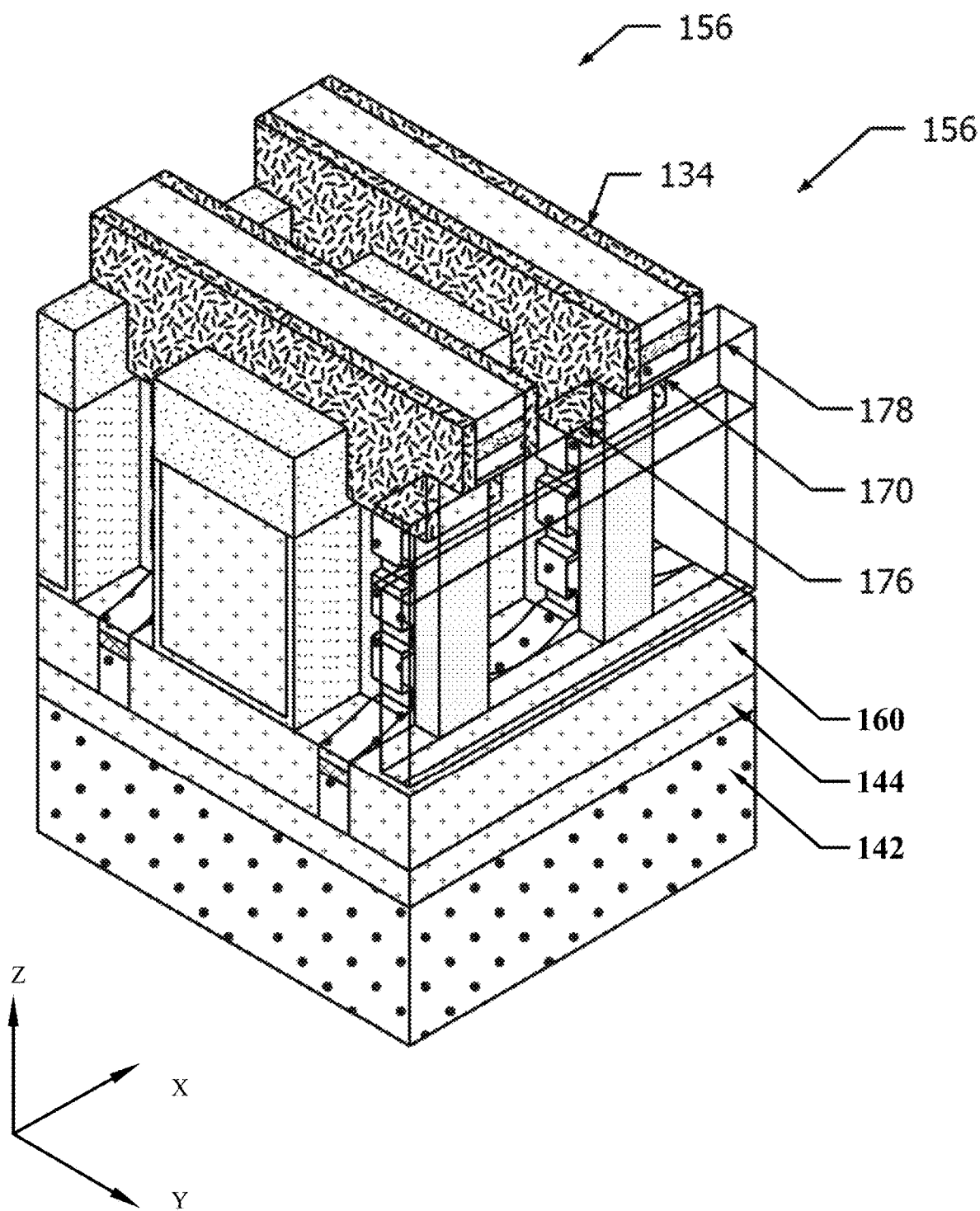
Figure 14B:
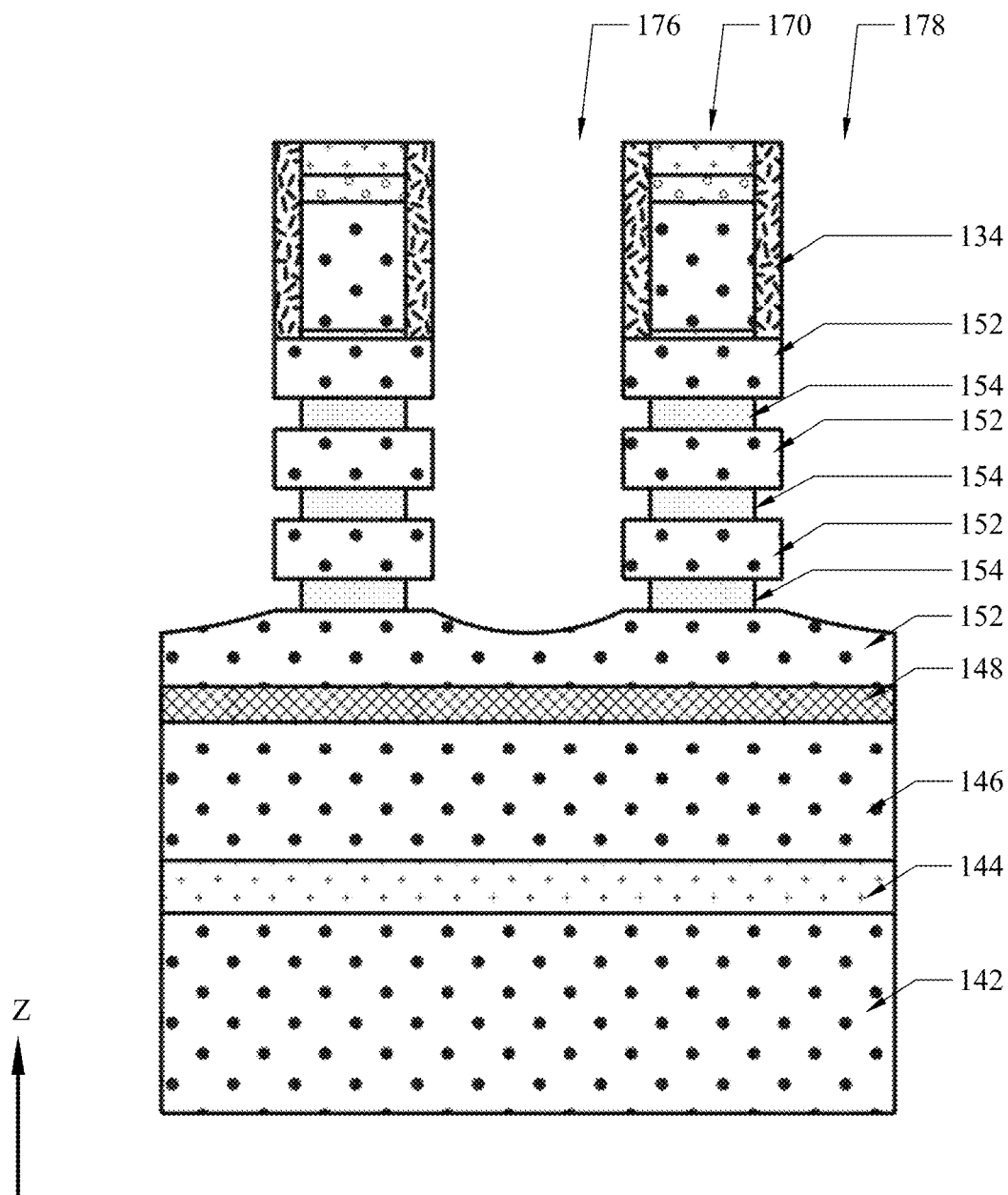
Figure 14C:
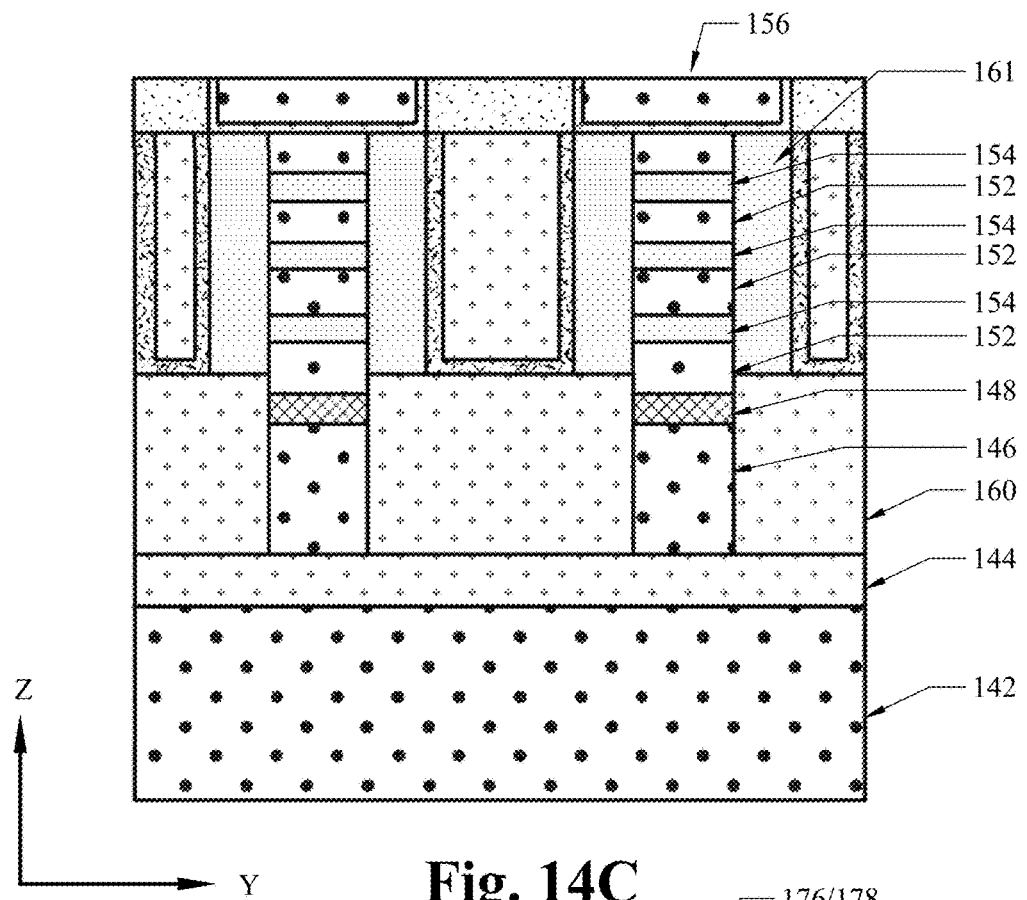
Figure 14D:
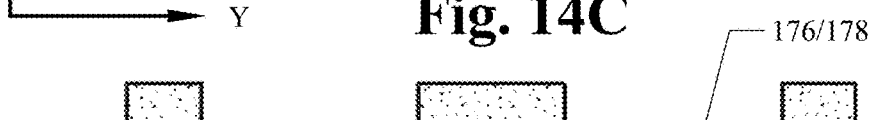

As shown in the perspective view of FIG. 14A, the x-direction cross-sectional view of FIG. 14B, the y-direction cross-sectional view of FIG. 14C in a gate region, and the y-direction cross-sectional view of FIG. 14D in a source region or a drain region, in some embodiments, a removal process is performed to remove fin structures 156 from a first source/drain region 176 and a second source/drain region 178 according to the dummy gate structures 170. As a result, the first semiconductor layers 152 and the second semiconductor layers 154 are shortened along x-direction and may be vertically aligned with the gate spacers 134 (See FIG. 14B). As an example, the exposed portions of the fin structures 156 are removed by using a strained source/drain (SSD) etching process. The SSD etching process may be performed in a variety of ways. In some embodiments, the SSD etching process may be performed by a dry chemical etch with a plasma source and a reaction gas. The plasma source may be an inductively coupled plasma (ICR) etch, a transformer coupled plasma (TCP) etch, an electron cyclotron resonance (ECR) etch, a reactive ion etch (RIE), or the like and the reaction gas may be a fluorine-based gas, chloride (Cl2), hydrogen bromide (HBr), oxygen ($O_2$), the like, or combinations thereof. In some other embodiments, the SSD etching process may be performed by a wet chemical etch, such as ammonium peroxide mixture (APM), ammonium hydroxide ($NH_4OH$), tetramethylammonium hydroxide (TMAH), combinations thereof, or the like. In yet some other embodiments, the SSD etch step may be performed by a combination of a dry chemical etch and a wet chemical etch. Further, in some embodiments, the removal process may partially or completely remove the bottommost first semiconductor layer 152 between the dummy gate structures 170. The bottommost first semiconductor layer 152 may have a concave top surface along the x-direction in the first source/drain region 176 and the second source/drain region 178 (See FIG. 14B). In some embodiments, the top surface of the bottommost first semiconductor layer 152 may be recessed between the lower isolation structure 160 and lower than a top surface of the lower isolation structure 160.

In addition, the removal process may also comprise an isotropic etchant to further remove ending portions of the second semiconductor layers 154 under the gate spacers 134 and/or the dummy gate structures 170. Thus, after the removal process, the first semiconductor layers 152 are wider than the second semiconductor layers 154 in the x-direction. The first semiconductor layers 152 may be formed as the channel structure of the transistor device after the removal process. It will be appreciated that the channel structure may exhibit stacked rectangle-like shapes as illustrated in the cross-sectional view of FIG. 14B and other figures, whereas in other embodiments, the channel structure may exhibit other shapes such as circles, octagons, ovals, diamonds, or the like.

Figure 15A:
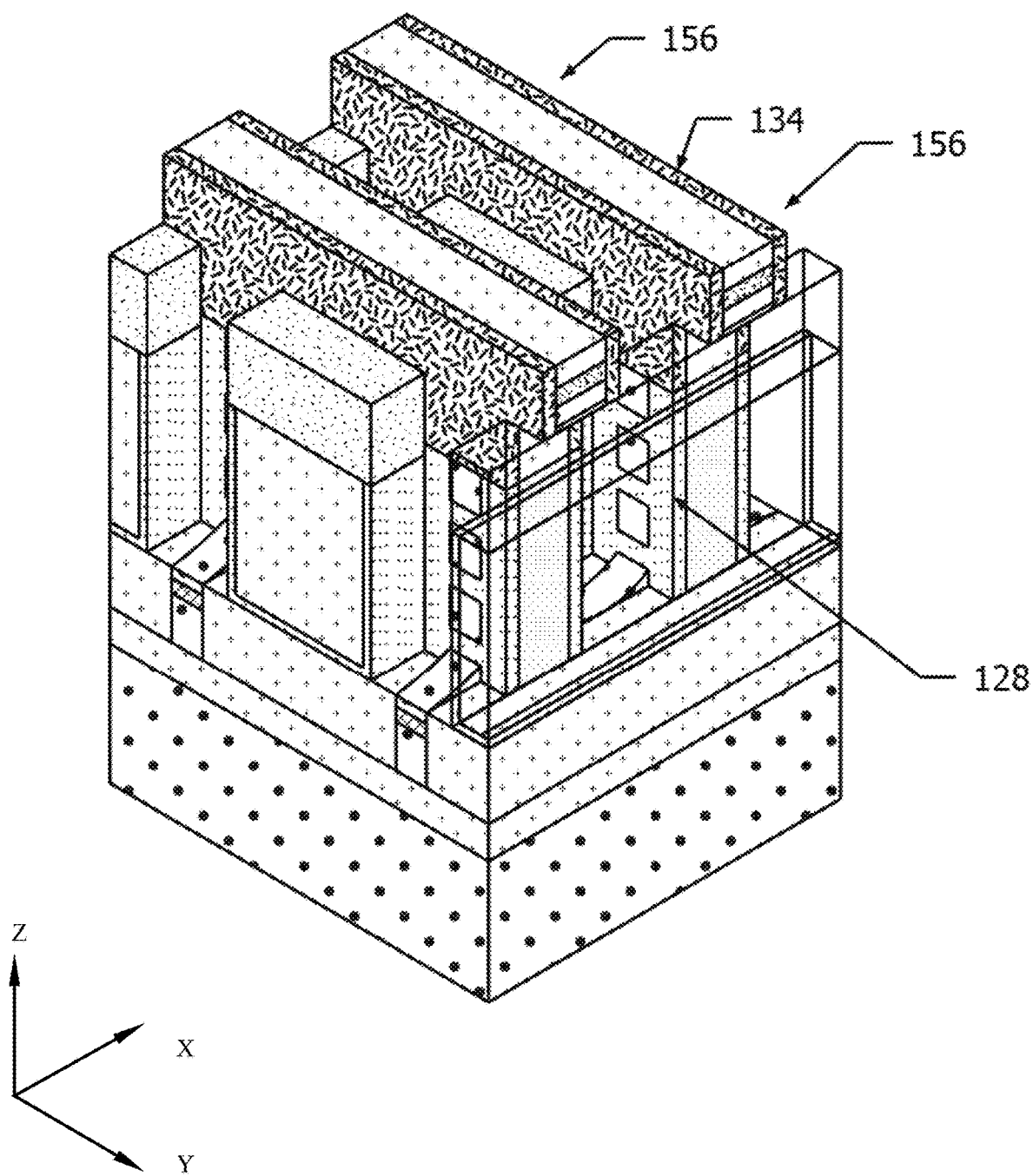
Figure 15B:
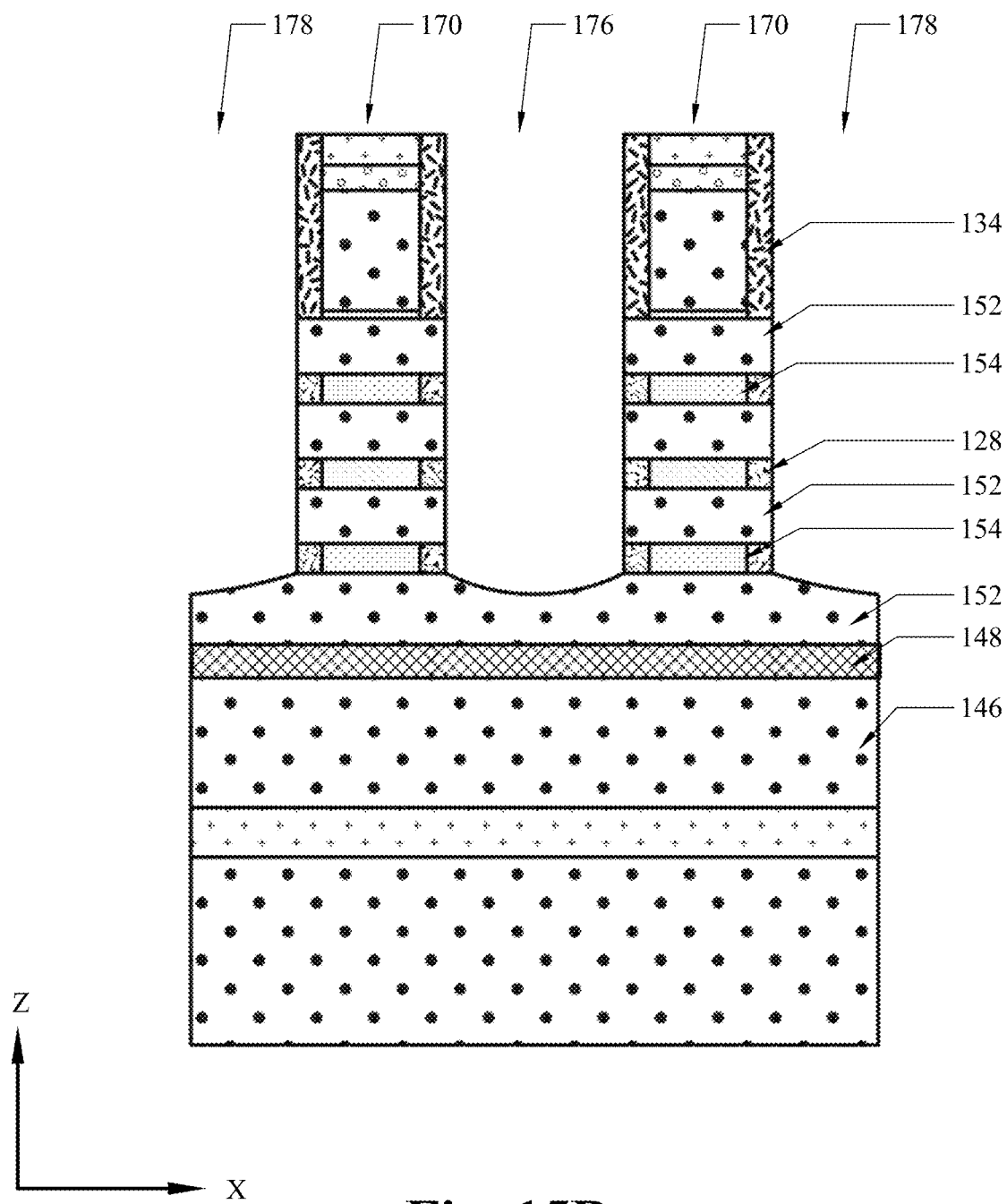

As shown in the perspective view of FIG. 15A and the x-direction cross-sectional view of FIG. 15B, in some embodiments, inner spacers 128 are formed on the endings of the second semiconductor layers 154 in the x-direction. Outer surfaces of the inner spacers 128 may be substantial coplanar with outer surfaces of the first semiconductor layers 152 and/or the gate spacers 134. In some embodiments, the inner spacers 128 are formed by a deposition process (e.g., CVD, PVD, PECVD, ALD, sputtering, etc.) followed by a selective removal process. For example, in some embodiments, a continuous layer may first be formed along sidewalls and over the dummy gate structures 170. Then, a vertical etching process can be conducted to remove portions of the continuous layer not vertically covered by the gate spacers 134 to form the inner spacers 128. Further, in some embodiments, the inner spacers 128 comprise a dielectric material such as, for example, silicon oxynitride, silicon carbon nitride, silicon oxygen carbide, silicon oxygen carbon nitride, silicon nitride or some other suitable material.

Figure 16A:
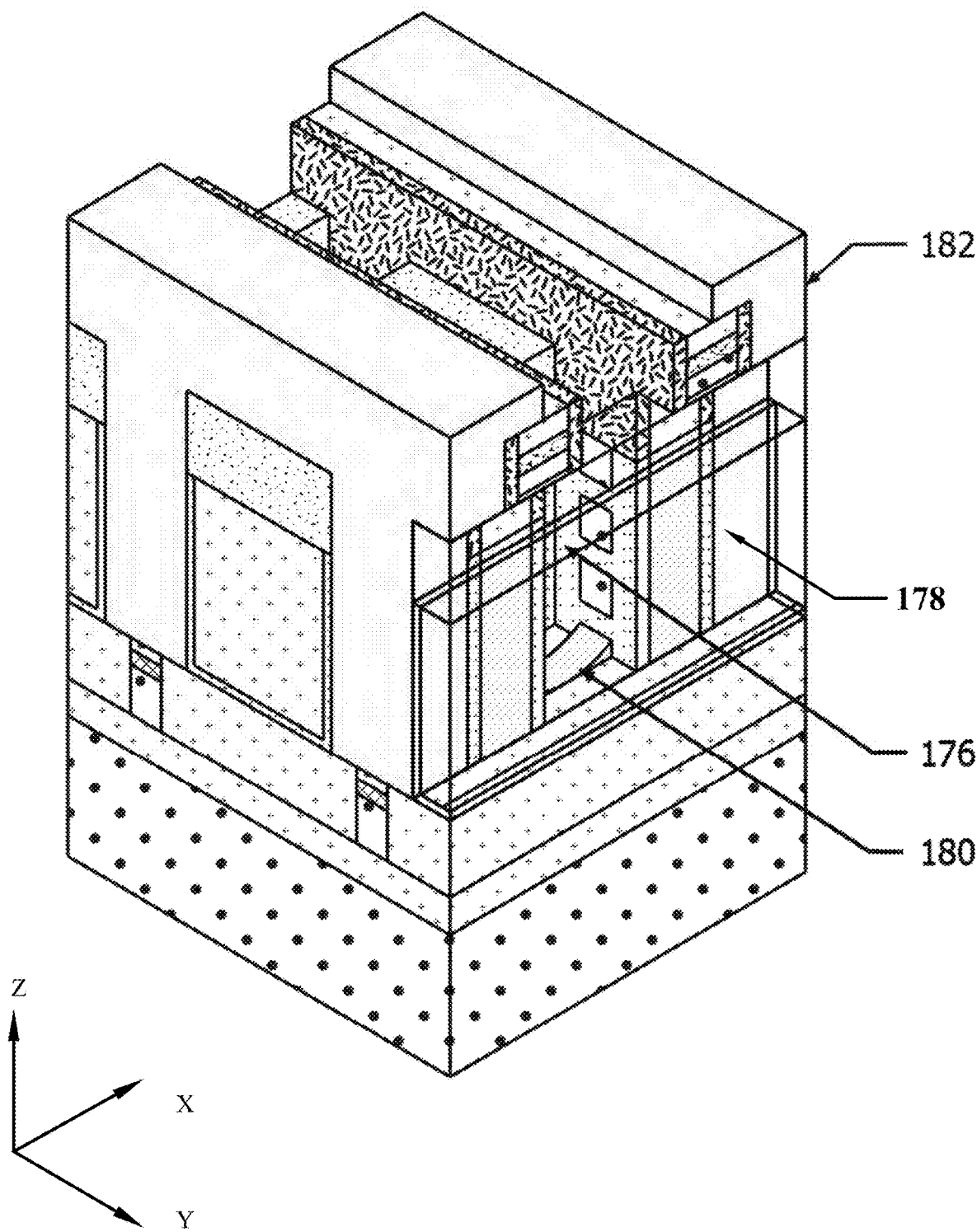
Figure 16B:
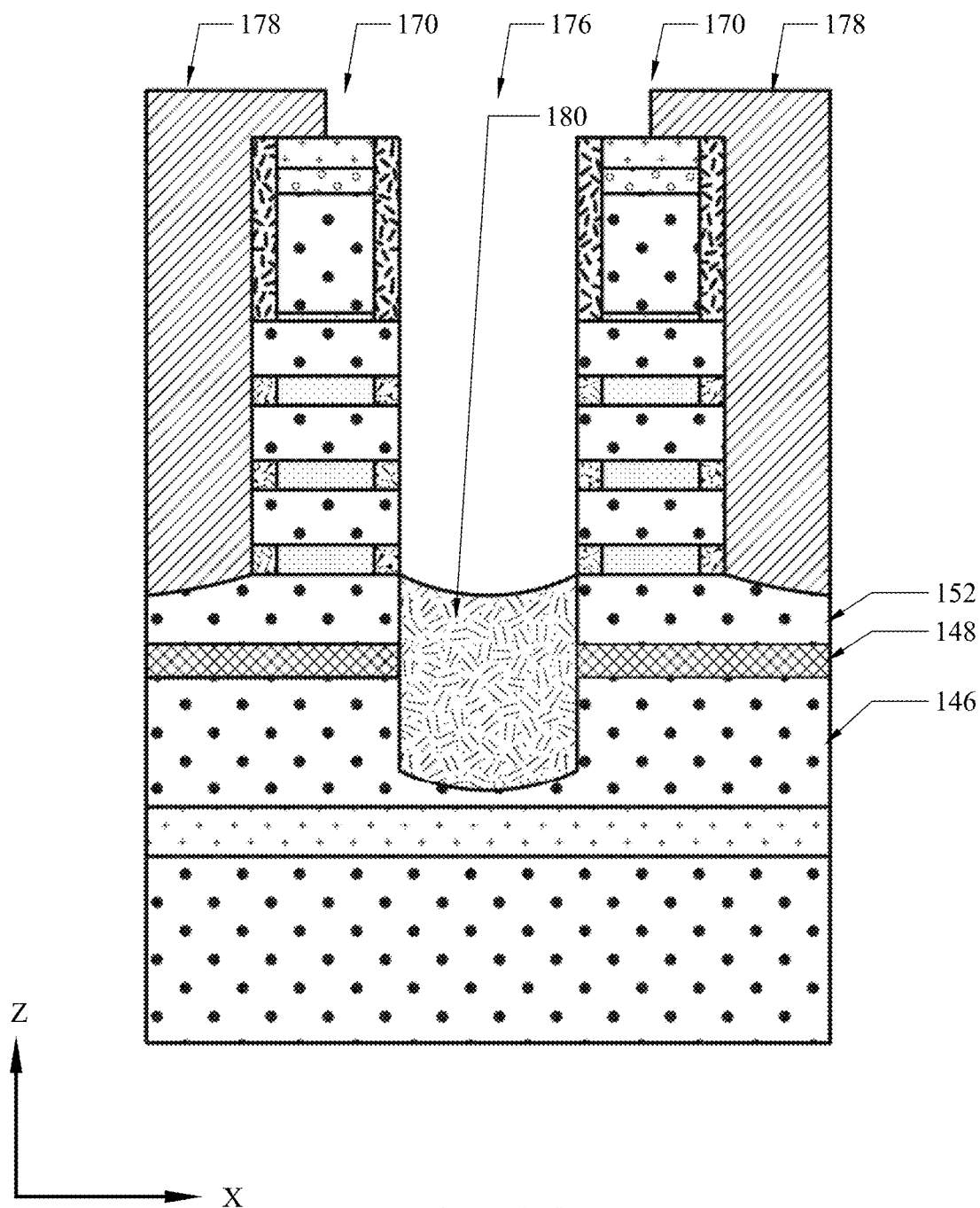
Figure 16C:
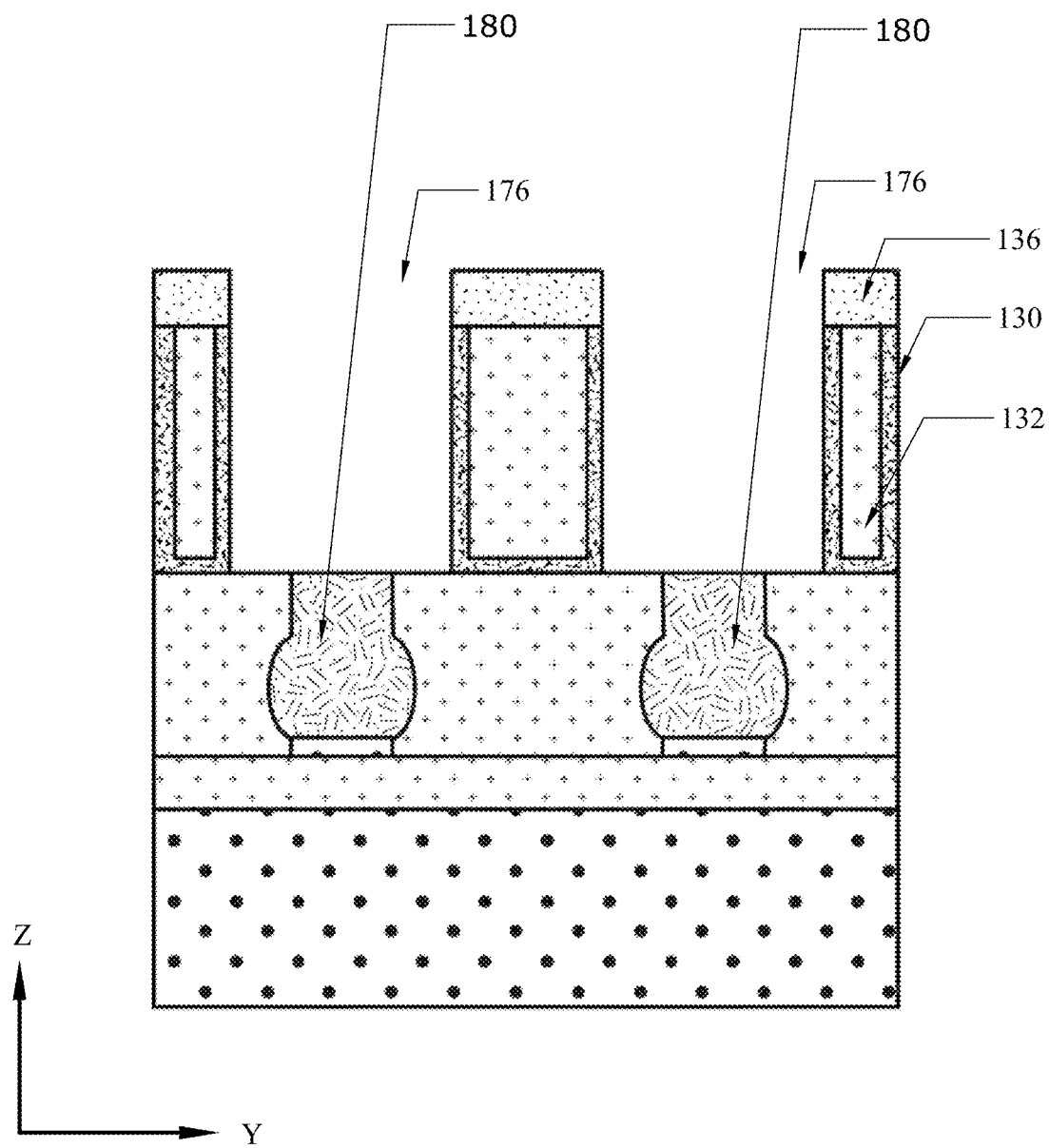

As shown in the perspective view of FIG. 16A, the x-direction cross-sectional view of FIG. 16B, and the y-direction cross-sectional view of FIG. 16C in the first source/drain region, in some embodiments, a sacrificial source/drain contact 180 is formed under the first source/drain region 176 with a hard mask layer 182 covering the second source/drain region 178. In some embodiments, the sacrificial source/drain contact 180 is formed through the etch stop layer 148 and extends deep in the semiconductor substrate layer 146. As an example, the sacrificial source/drain contact 180 may have a thickness of about 50 nm. In some embodiments, a trench is formed firstly by etching the bottommost first semiconductor layer 152, the etch stop layer 148, and/or at least a portion of the semiconductor substrate layer 146 directly under the first source/drain region 176. Then, a sacrificial material is filled in the trench to form the sacrificial source/drain contact 180. In some embodiments, the sacrificial source/drain contact 180 may comprise intrinsic SiGe material having a germanium atomic percentage greater than zero. In some embodiments, the germanium percentage of the sacrificial source/drain contact 180 is in a range between about 10 percent and about 50 percent. In some embodiments, the sacrificial source/drain contact 180 comprises the same material as the second semiconductor layers 154. Further, in some embodiments, the sacrificial source/drain contact 180 may be formed by an epitaxy growth process or a deposition process (e.g., PVD, CVD, PECVD, ALD, sputtering, etc.). By forming the trench and the sacrificial source/drain contact 180 therein, a source/drain contact can be formed self-aligned later by replacing the sacrificial source/drain contact 180, such that an overlay shift of contact landing is eliminated.

Figure 17A:
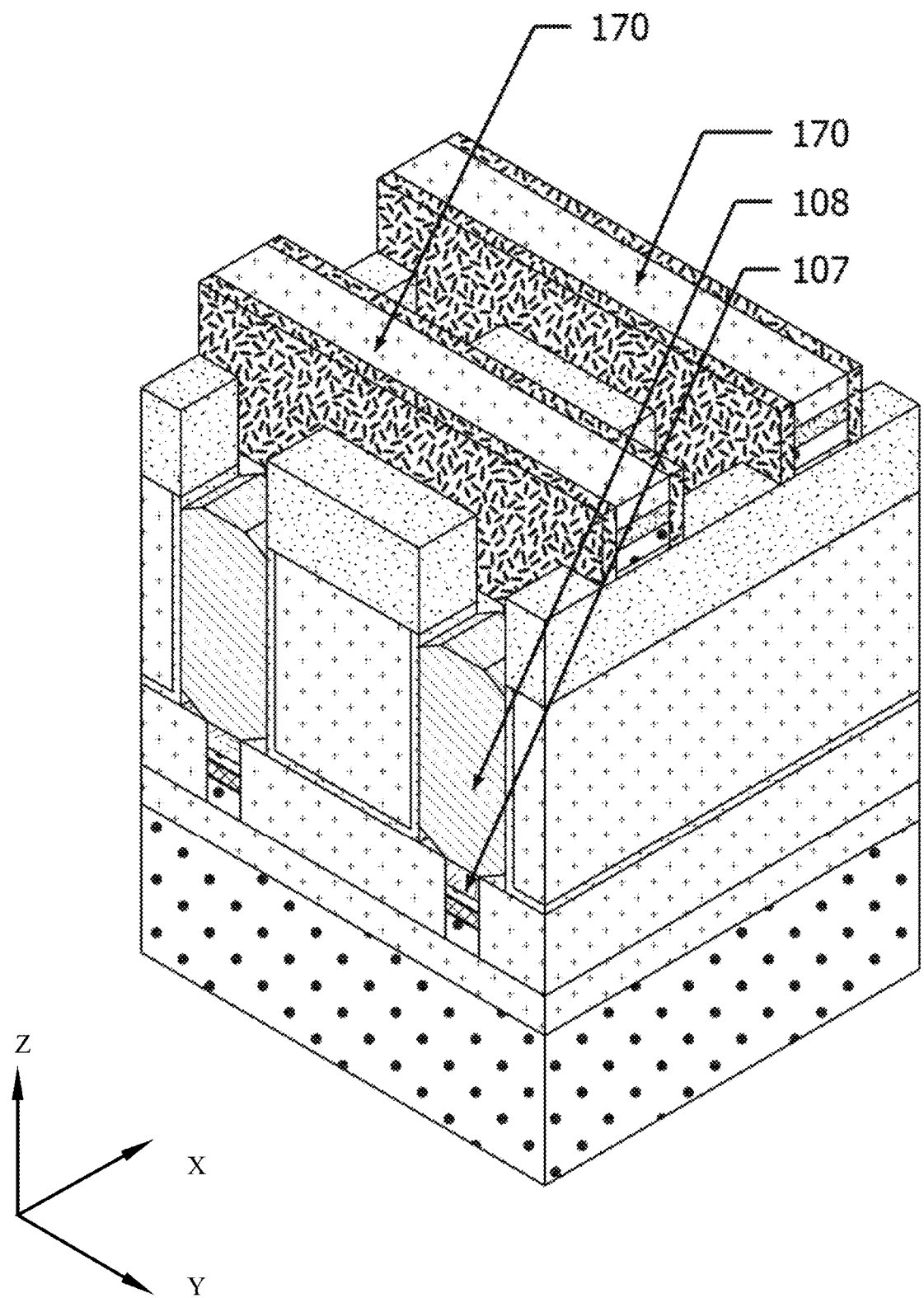
Figure 17B:
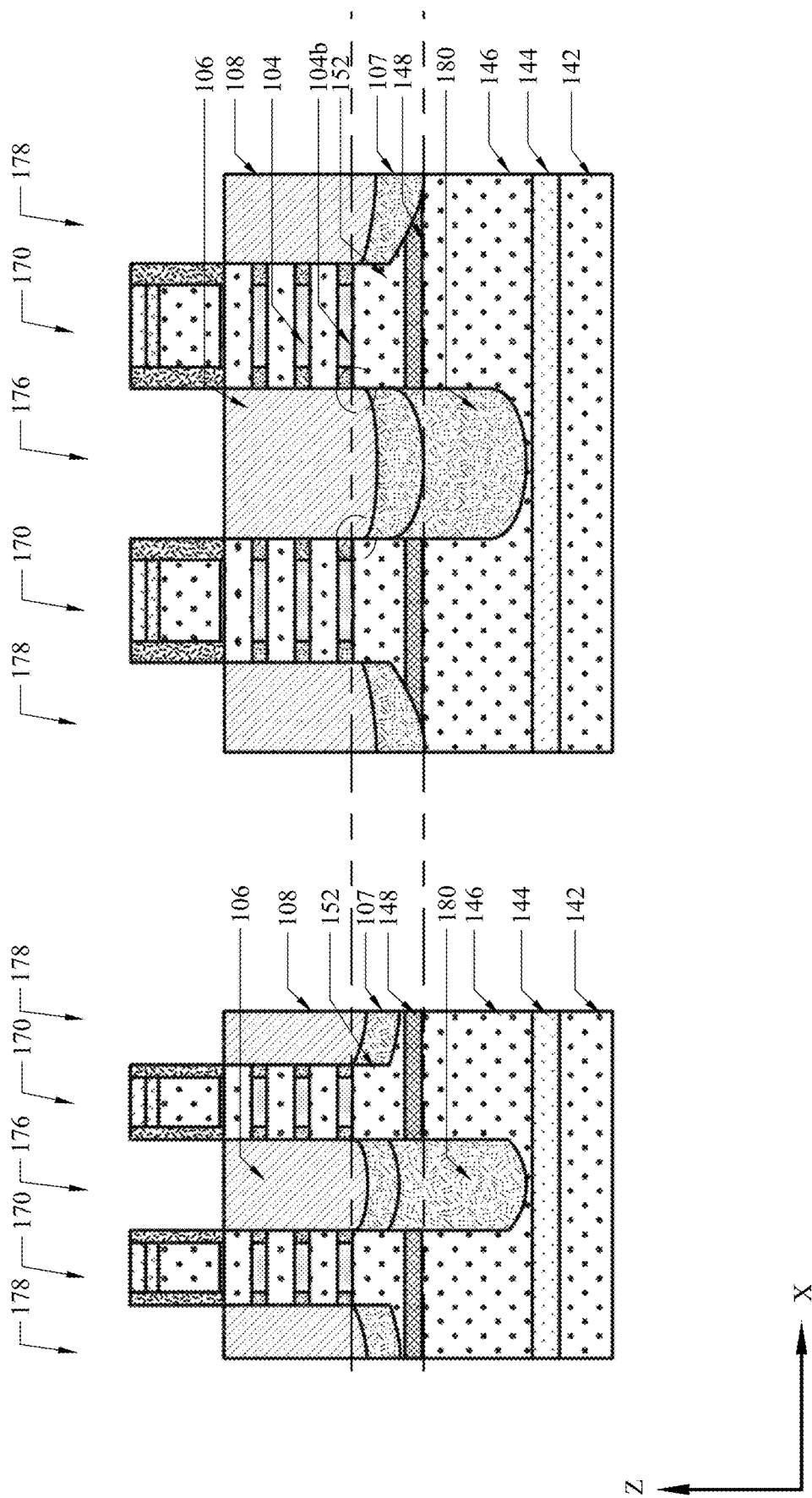
Figure 17C:
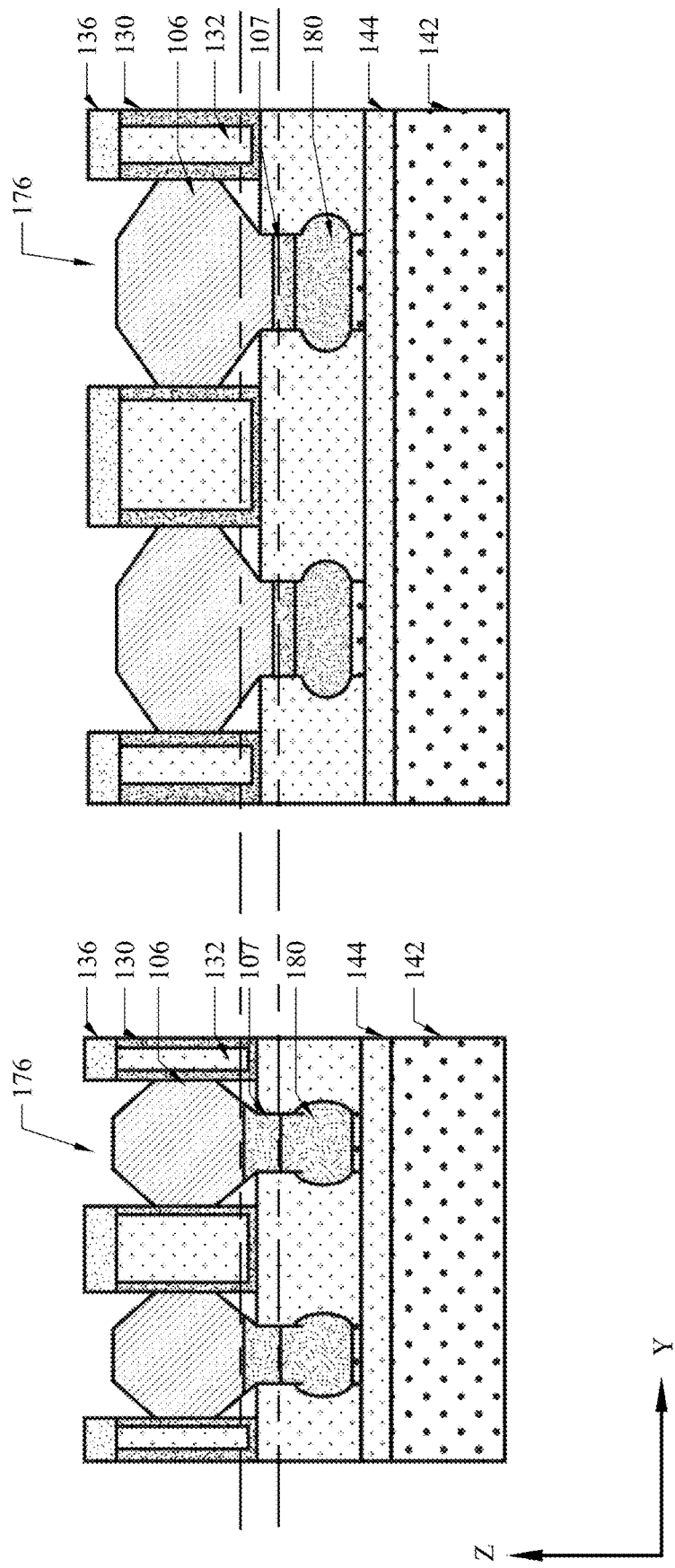
Figure 17D:
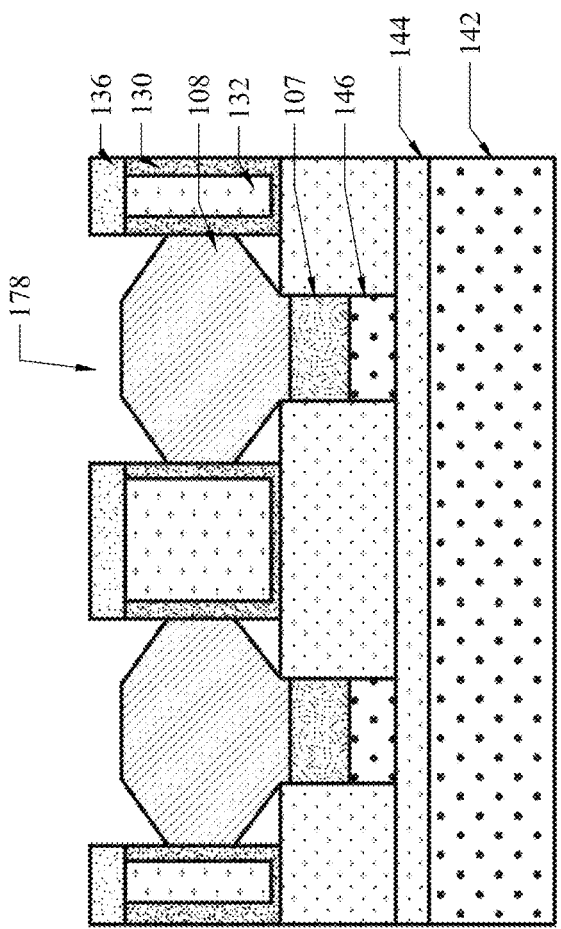
Figure 17D:
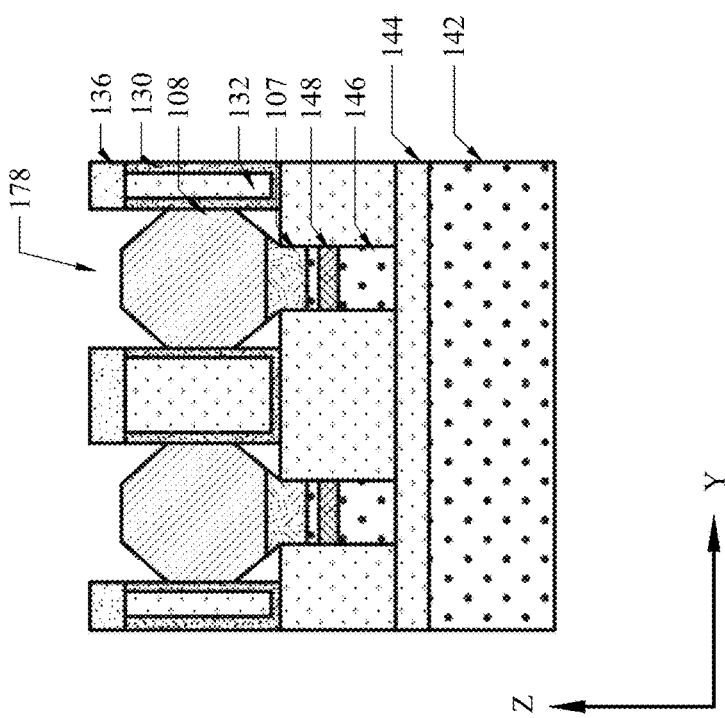

As shown in the perspective view of FIG. 17A, the x-direction cross-sectional view of FIG. 17B, the y-direction cross-sectional view of FIG. 17C in the first source/drain region, and the y-direction cross-sectional view of FIG. 17D in the second source/drain region, in some embodiments, a first source/drain epitaxial structure 106 and a second source/drain epitaxial structure 108 are formed respectively in the first source/drain region 176 and the second source/drain region 178 on opposite sides of the dummy gate structure 170. In some embodiments, the first source/drain epitaxial structure 106 may be formed on the sacrificial source/drain contact 180. The second source/drain epitaxial structure 108 may be formed on the bottommost first semiconductor layer 152 or the semiconductor substrate layer 146. The first and second source/drain epitaxial structures 106, 108 may respectively be a source and a drain of the semiconductor transistor device. In some embodiments, the first and second source/drain epitaxial structures 106, 108 comprise a semiconductor material. For example, the first and second source/drain epitaxial structures 106, 108 may comprise doped silicon, germanium, or silicon germanium such as boron doped silicon germanium (SiGeB). In some embodiments, the first and second source/drain epitaxial structures 106, 108 are formed by way of an epitaxy growth process. The first and second source/drain epitaxial structures 106, 108 may be hexagonal or diamond-like shapes. Air gaps 192 may be formed surrounding lower portions of the first source/drain epitaxial structure 106 and the second source/drain epitaxial structure 108. In some embodiments, an intermediate source/drain layer 107 is formed underneath the first and second source/drain epitaxial structures 106, 108 prior to forming the first and second source/drain epitaxial structures 106, 108. The intermediate source/drain layer 107 may comprise boron doped silicon germanium (SiGeB). As an example, the intermediate source/drain layer 107 may have a thickness of about 20 nm.

In some embodiments, depths of the epitaxial growth layers are affected by loading effect. Devices with greater dimensions may be formed thicker epitaxial layers than devices with smaller dimensions. FIGS. 17B-17D and some figures hereafter show a short channel transistor on left and a long channel transistor on right to illustrate this issue side by side. As shown in FIGS. 17B-17D, the intermediate source/drain layer 107 and the first and second source/drain epitaxial structures 106, 108 are formed deeper in the long channel transistor than in the short channel transistor. In some embodiments, the intermediate source/drain layer 107 is formed with its bottom surface exceeding the etch stop layer 148 under both the first source/drain region 176 and the second source/drain region 178 in the long channel transistor. In some embodiments, the first and second source/drain epitaxial structures 106, 108 are formed with edges of bottom surfaces exceeding a bottom surface 104b of the gate structure 104 in the long channel transistor. For example, the intermediate source/drain layer 107 and the first and second source/drain epitaxial structures 106, 108 may be about 5-10 nm deeper in the long channel transistor than in the short channel transistor. Thus, bottom portions of the first and second source/drain epitaxial structures 106, 108 contact the bottommost first semiconductor layer 152. The bottommost first semiconductor layer 152 would be removed during subsequent processes (see FIGS. 28A-28D for example), and thus the bottom portions of the first and second source/drain epitaxial structures 106, 108 may be exposed to unwanted etching processes and could be damages and form pits that would affect performance or even fail the long channel transistor. Therefore, some embodiments of a method of forming a protective spacer to protect the long channel transistor from said damage is illustrated below associated with FIGS. 22A-28D.

Figure 18A:
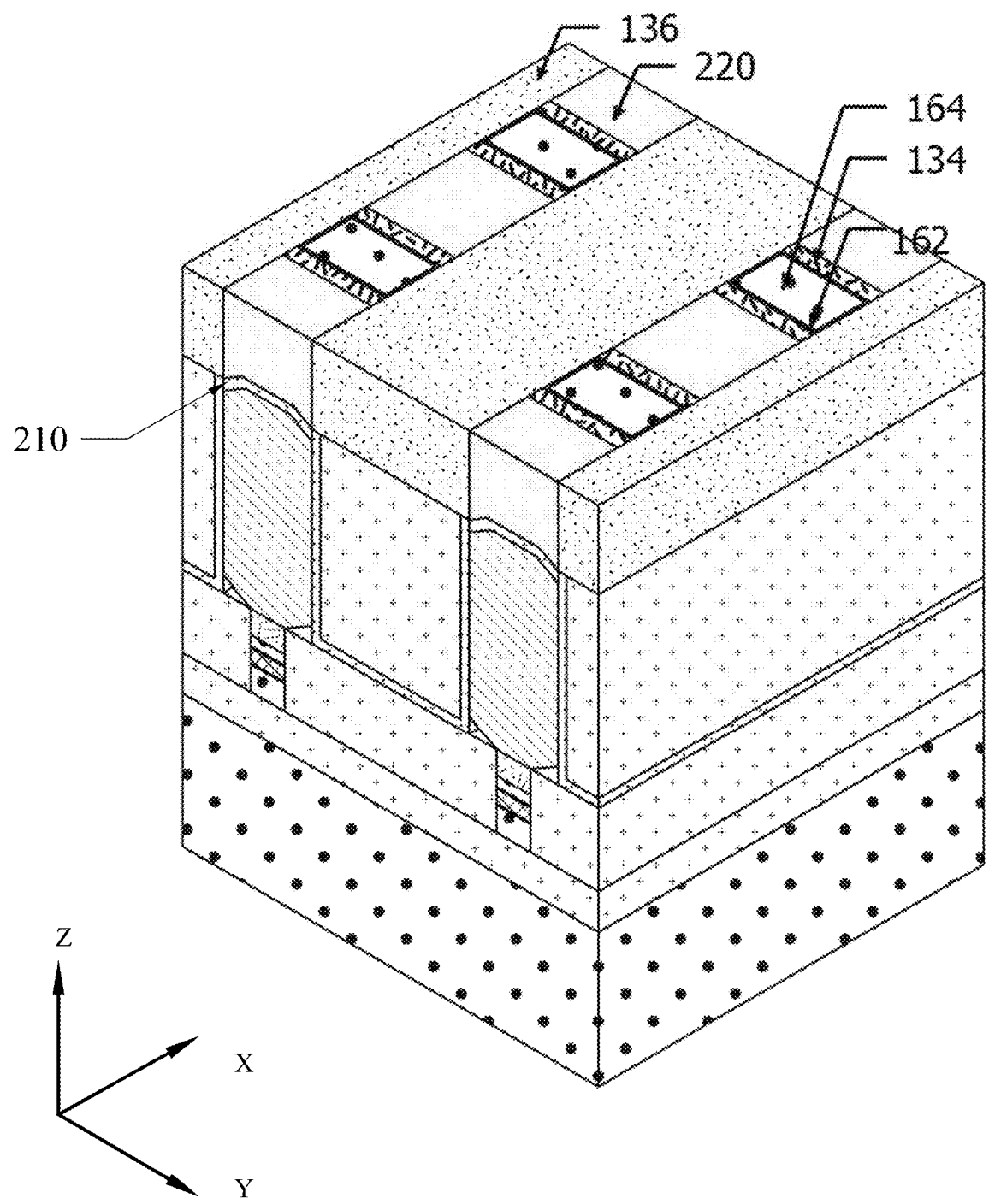
Figure 18B:
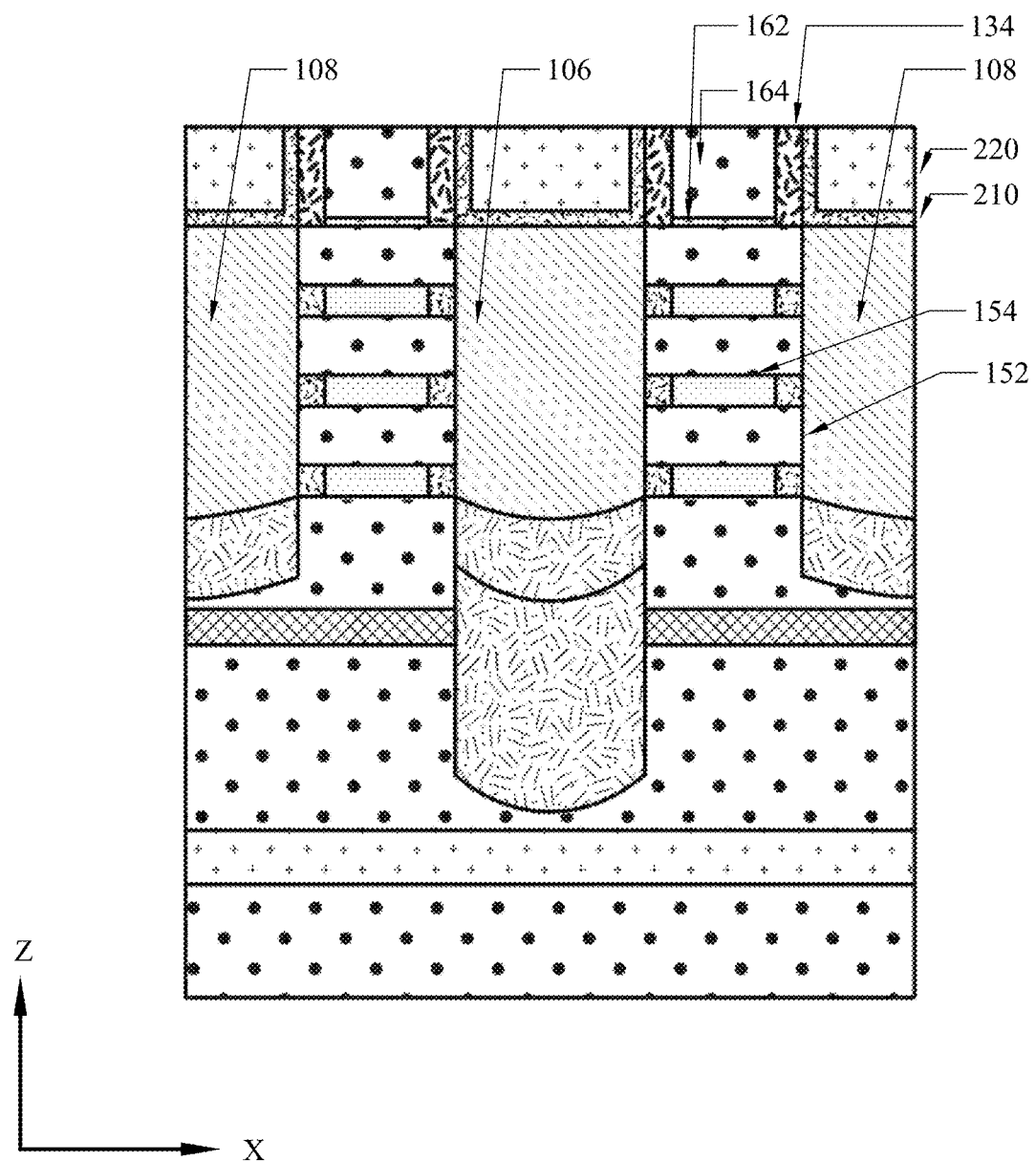
Figure 18C:
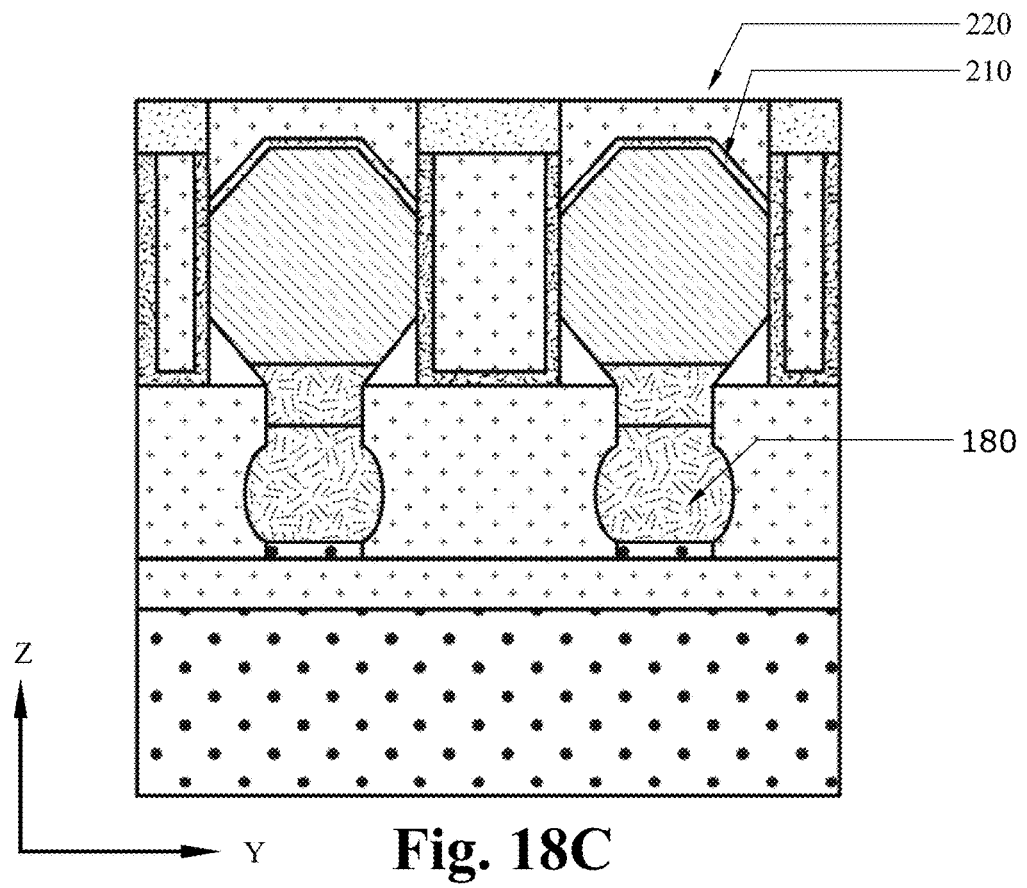
Figure 18D:
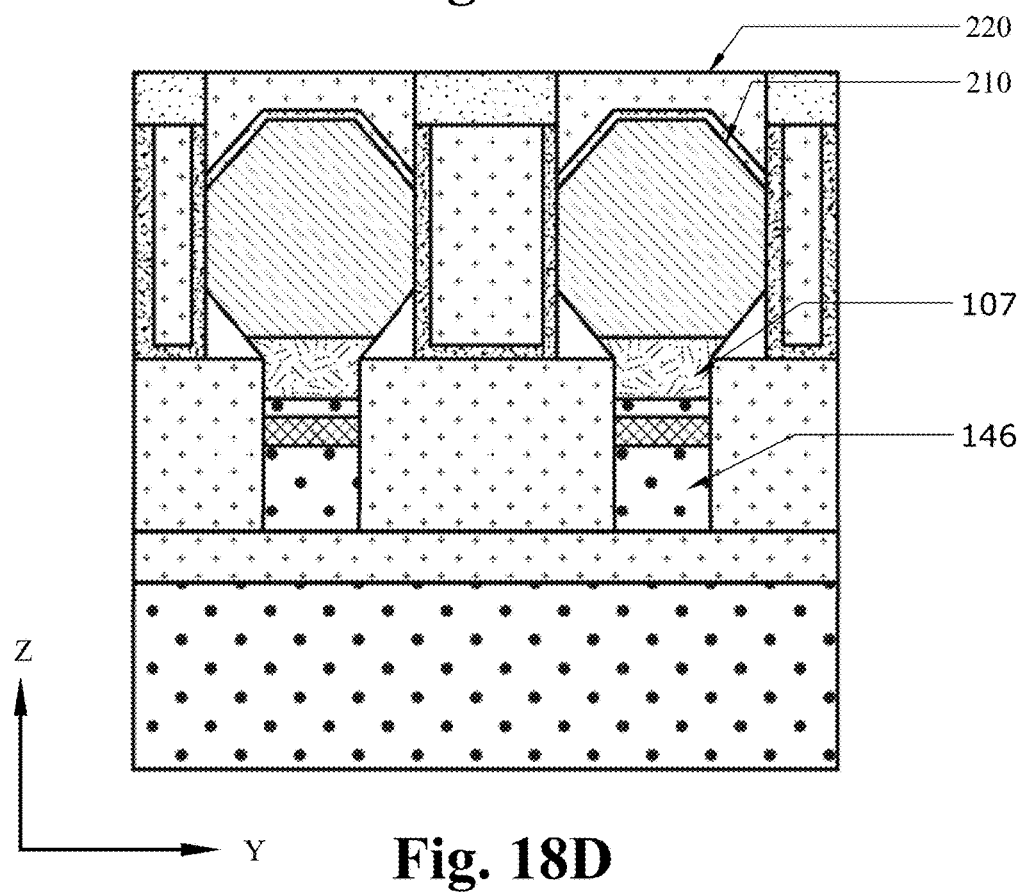

As shown in the perspective view of FIG. 18A, the x-direction cross-sectional view of FIG. 18B, the y-direction cross-sectional view of FIG. 18C in the first source/drain region, and the y-direction cross-sectional view of FIG. 18D in the second source/drain region, in some embodiments, an upper isolation structure 220 is formed over the structure previously formed covering the first and second source/drain epitaxial structures 106, 108. A planarization process is subsequently performed to lower the gate spacers 134 and expose the sacrificial gate dielectric layer 162 and the sacrificial gate electrode layer 164 on a same horizontal plane. In some embodiments, an etch stop liner 210 may be conformally formed lining the structure previously formed prior to forming the upper isolation structure 220. In some embodiments, the etch stop liner 210 may comprise silicon nitride. In some other embodiments, the etch stop liner 210 may comprise other dielectric materials such as silicon dioxide, silicon oxynitride, or the like. The etch stop liner 210 can be formed using plasma enhanced CVD (PECVD), however, other suitable methods, such as low pressure CVD (LPCVD), atomic layer deposition (ALD), and the like, can also be used. The upper isolation structure 220 may be formed by chemical vapor deposition (CVD), high-density plasma CVD, spin-on, sputtering, or other suitable methods. In some embodiments, the upper isolation structure 220 may comprise silicon dioxide. In some other embodiments, the upper isolation structure 220 may comprise other dielectric materials such as carbon doped oxide dielectrics including Si, O, C and/or H (SiCOH or SiOC), a low-κ material, or organic materials (e.g., polymers). The planarization operation may comprise a chemical-mechanical process (CMP).

Figure 19A:
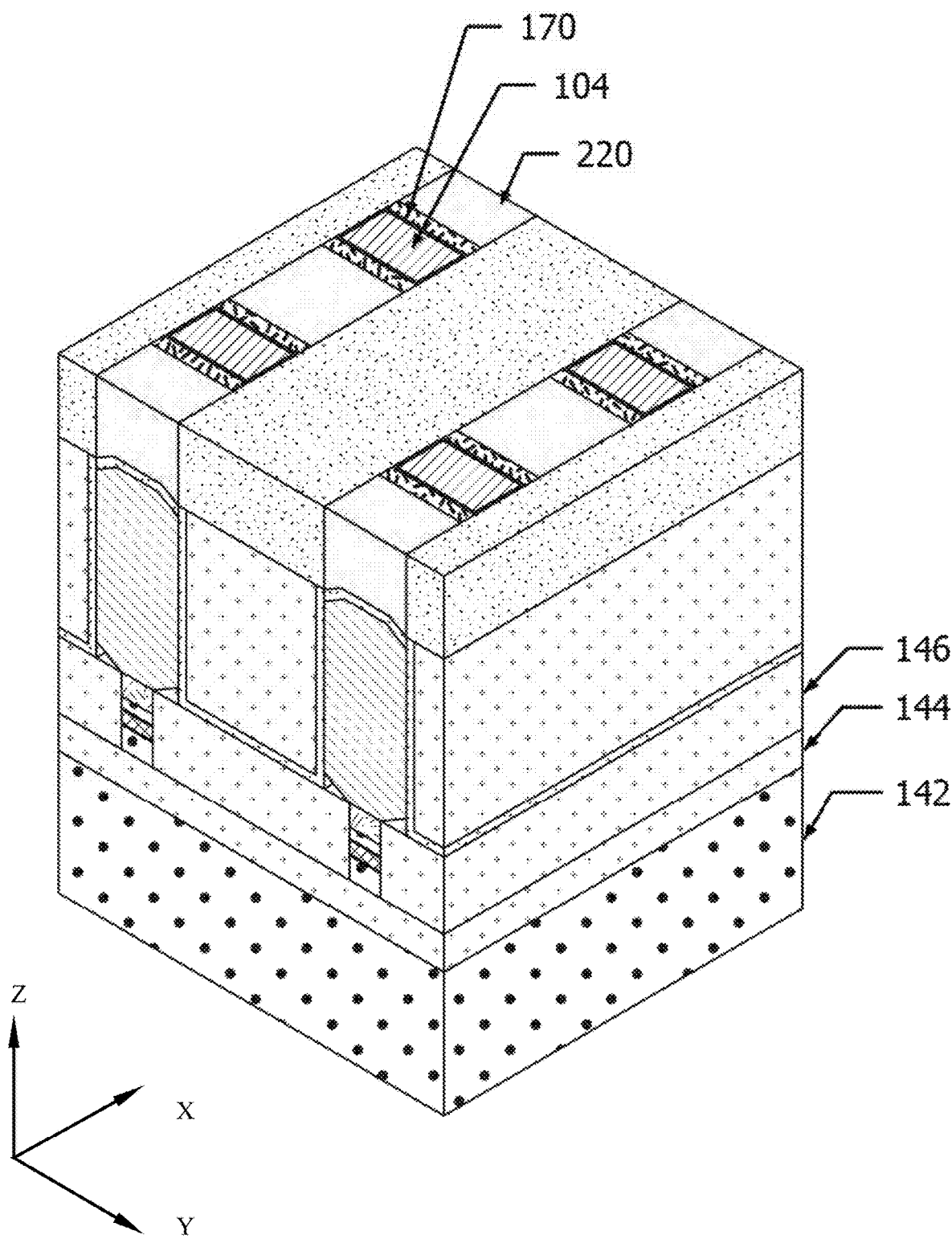
Figure 19B:
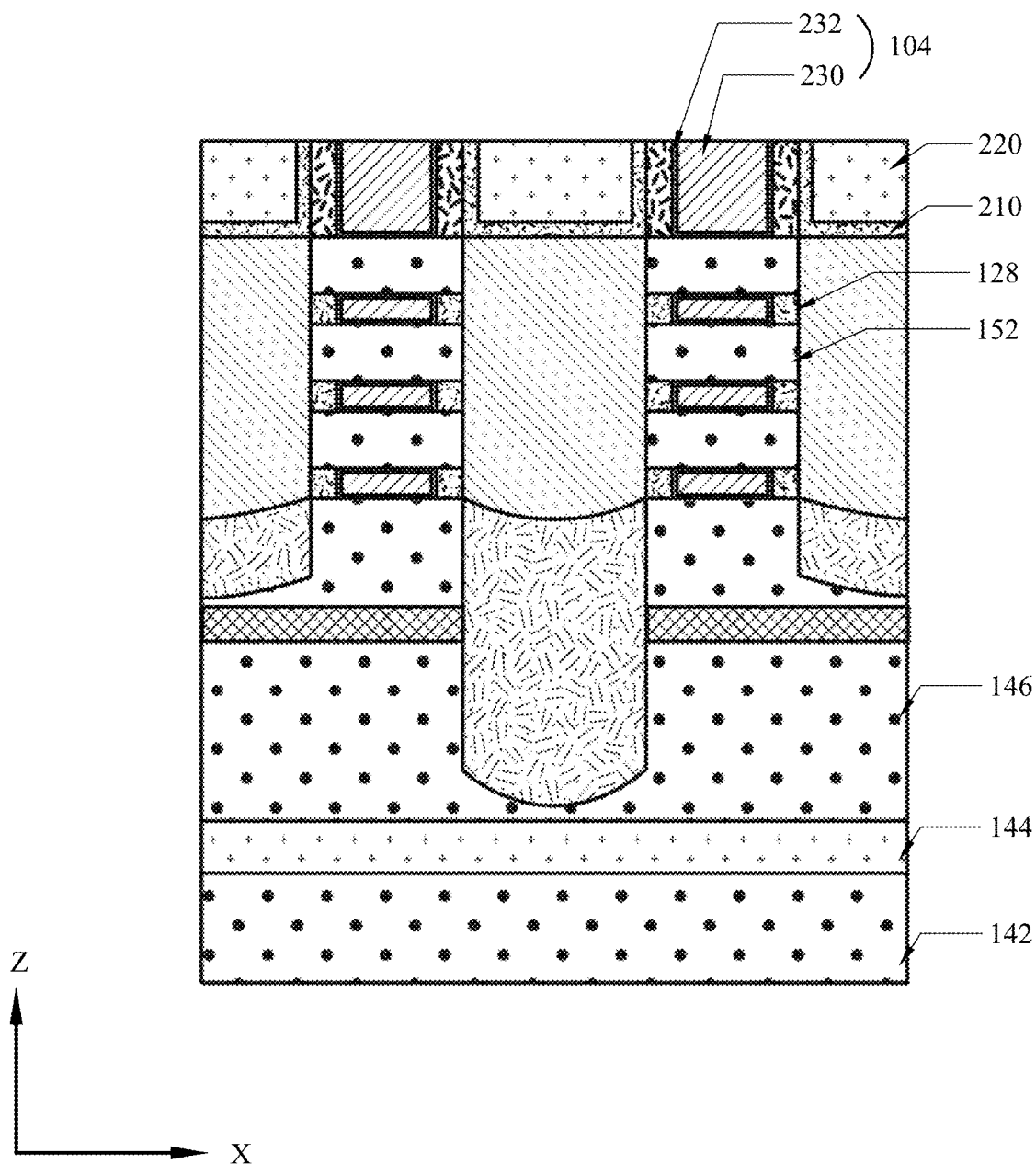
Figure 19C:
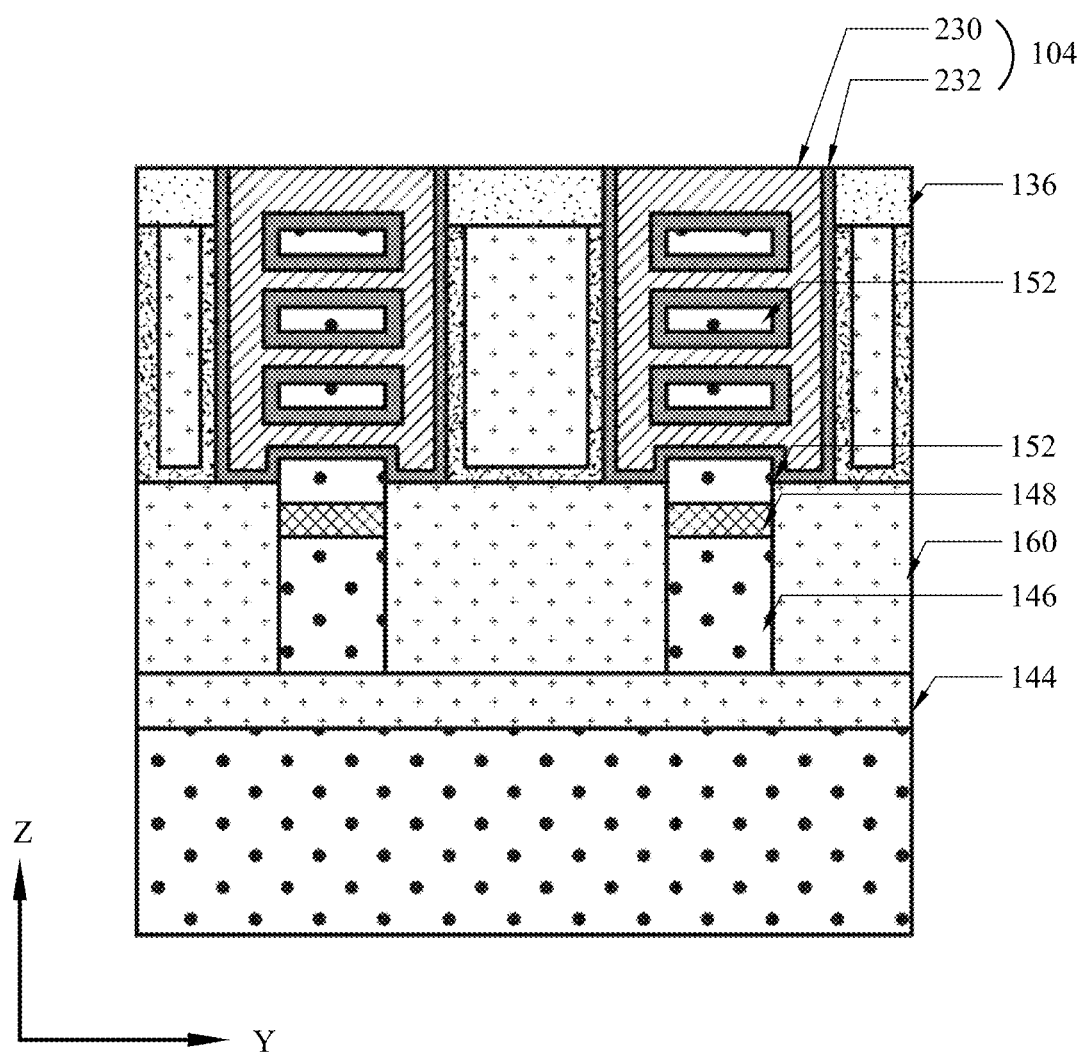

As shown in the perspective view of FIG. 19A, the x-direction cross-sectional view of FIG. 19B, the y-direction cross-sectional view of FIG. 19C in the gate region, in some embodiments, a replacement gate process is performed to form a gate structure 104. In some embodiments, the gate structure 104 is formed by firstly removing the sacrificial gate dielectric layer 162 and the sacrificial gate electrode layer 164, thereby exposing the first and second semiconductor layers 152, 154 (see FIG. 18B). The upper isolation structure 220 protects the first and second source/drain epitaxial structures 106, 108 during the removal of the sacrificial gate dielectric layer 162 and the sacrificial gate electrode layer 164. The sacrificial gate electrode layer 164 can be removed using plasma dry etching and/or wet etching. When the sacrificial gate electrode layer 164 is polysilicon and the upper isolation structure 220 is silicon oxide, a wet etchant such as a TMAH solution can be used to selectively remove the sacrificial gate electrode layer 164. The sacrificial gate electrode layer 164 can be removed using plasma dry etching and/or wet etching. Subsequently, the sacrificial gate dielectric layer 162 is removed as well. As such, the first and second semiconductor layers 152, 154 are exposed.

The second semiconductor layers 154 and the cladding semiconductor layer 161 (see FIG. 14C) are then removed or etched using an etchant that can selectively etch the second semiconductor layers 154 and the cladding semiconductor layer 161 at a faster etching rate than etching the first semiconductor layers 152. The inner spacers 128 protect the first and second source/drain epitaxial structures 106, 108 from the etchant used in etching the second semiconductor layers 154 and the cladding semiconductor layer 161 since the inner spacers 128 is made of a material that has etching selectivity to that of the second semiconductor layers 154 and the cladding semiconductor layer 161.

A gate structure 104 is then formed and/or filled between the gate spacers 134 and the inner spacers 128. That is, the gate structure 104 encircles (or surrounds or wraps) the first semiconductor layers 152, in which the first semiconductor layers 152 are referred to as channels of the semiconductor transistor device. The gate spacers 134 are disposed on opposite sides of the gate structure 104. The gate structure 104 comprises a gate dielectric layer 232 and a gate electrode 230. The gate electrode 230 includes one or more work function metal layer (s) and a filling metal. The gate dielectric layer 232 may be conformally formed. That is, the gate dielectric layer 232 is in contact with the lower isolation structure 160 and the first semiconductor layers 152 (See FIG. 19C). In some embodiments, the gate dielectric layer 232 includes a high-κ material (κ is greater than 7) such as hafnium oxide (HfO2), zirconium oxide (ZrO2), lanthanum oxide (La2O3), hafnium aluminum oxide (HfAlO2), hafnium silicon oxide (HfSiO2), aluminum oxide (Al2O3), or other suitable materials. In some embodiments, the gate dielectric layer 232 may be formed by performing an ALD process or other suitable process.

The work function metal layer of the gate electrode 230 is formed on the gate dielectric layer 232, and the work function metal layer surrounds the first semiconductor layers 152 in some embodiments. The work function metal layer may include materials such as titanium nitride (TiN), tantalum (TaN), titanium aluminum silicon (TiAlSi), titanium silicon nitride (TiSiN), titanium aluminum (TiAl), tantalum aluminum (TaAl), or other suitable materials. In some embodiments, the work function metal layer may be formed by performing an ALD process or other suitable process. The filling metal of the gate electrode 230 fills the remained space between the gate spacers 134 and between the inner spacers 128. That is, the work function metal layer(s) is in contact with and between the gate dielectric layer 232 and the filling metal. The filling metal may include material such as tungsten or aluminum. After the deposition of the gate dielectric layer 232 and the gate electrode 230, a planarization process, such as a CMP process, may be then performed to remove excess portions of the gate dielectric layer 232 and the gate electrode 230 to form the gate structure 104.

In some embodiments, an interfacial layer (not shown) is optionally formed prior to forming the gate structure 104 to surround exposed surfaces of the first semiconductor layers 152 and exposed surfaces of the semiconductor substrate layer 146 (See FIG. 19B, FIG. 19C). In various embodiments, the interfacial layer may include a dielectric material such as silicon oxide ($SiO_2$) or silicon oxynitride (SiON), and may be formed by chemical oxidation, thermal oxidation, atomic layer deposition (ALD), chemical vapor deposition (CVD), and/or other suitable methods.

Figure 20:
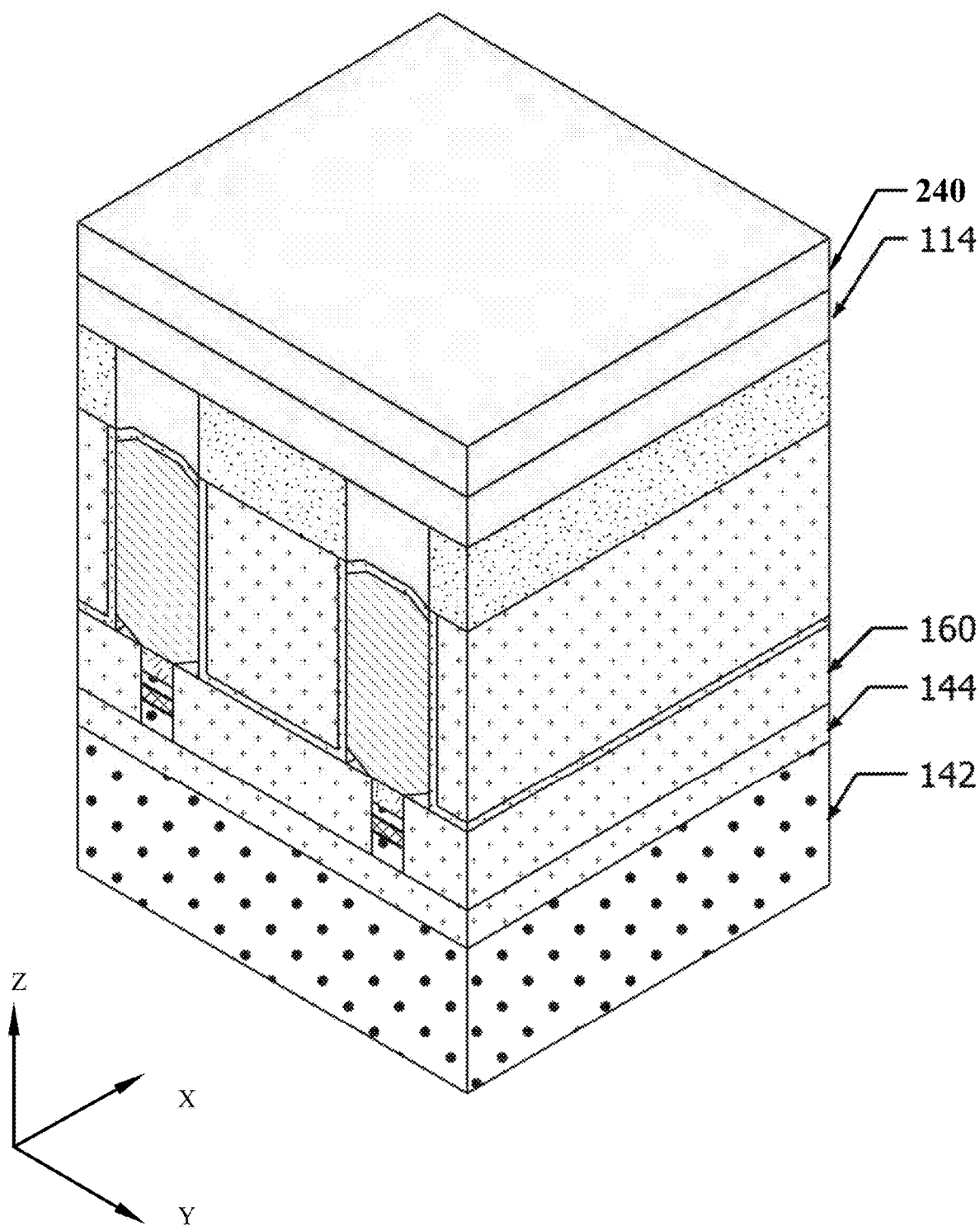
Figure 22B:
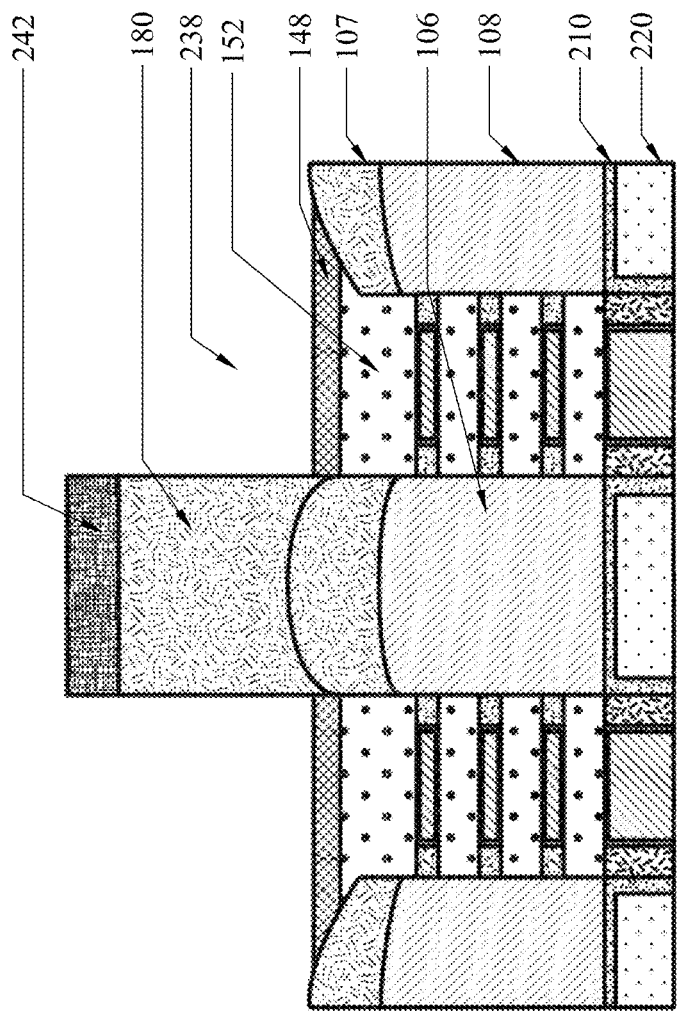
Figure 22B:
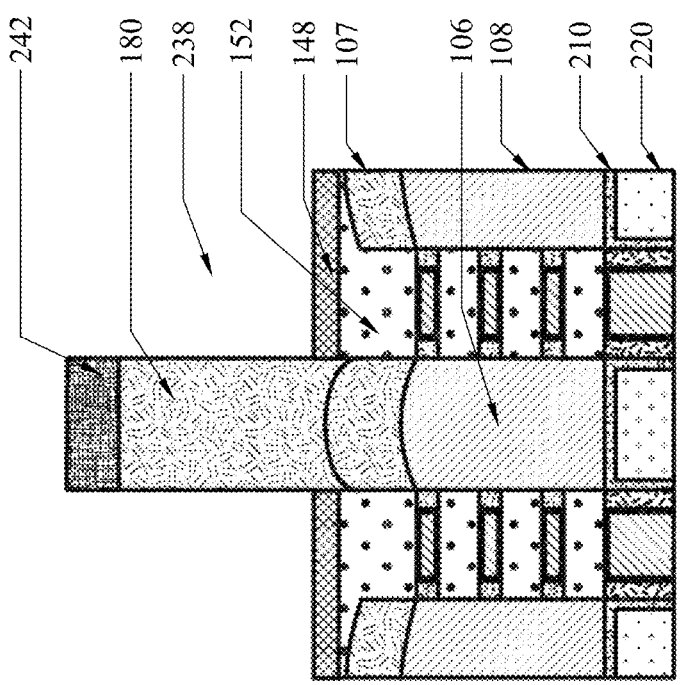

As shown in the perspective view of FIG. 20, in some embodiments, a front-side interconnect structure 114 is formed over the gate structure 104 and the first and second source/drain epitaxial structures 106, 108 (see FIG. 22B). The front-side interconnect structure 114 may comprise a plurality of front-side metal layers 116 disposed within and surrounded by a front-side interlayer dielectric layer 112. The front-side interconnect structure 114 electrically connects various features or structures (e.g., a gate contact 110 and/or other contacts) of the semiconductor transistor device. The front-side metal layers 116 includes vertical interconnects, such as vias or contacts, and horizontal interconnects, such as metal lines. The various interconnection features may implement various conductive materials including copper, tungsten and silicide. In some examples, a damascene process is used to form copper multilayer interconnection structure. Subsequently, a carrier substrate 240 is formed above the front-side interconnect structure 114. For example, the carrier substrate 240 is bond to the front-side interconnect structure 114. In some embodiments, carrier substrate 240 is sapphire. In some other embodiments, the carrier substrate 240 is silicon, a thermoplastic polymer, oxide, carbide, or other suitable material.

Figure 21A:
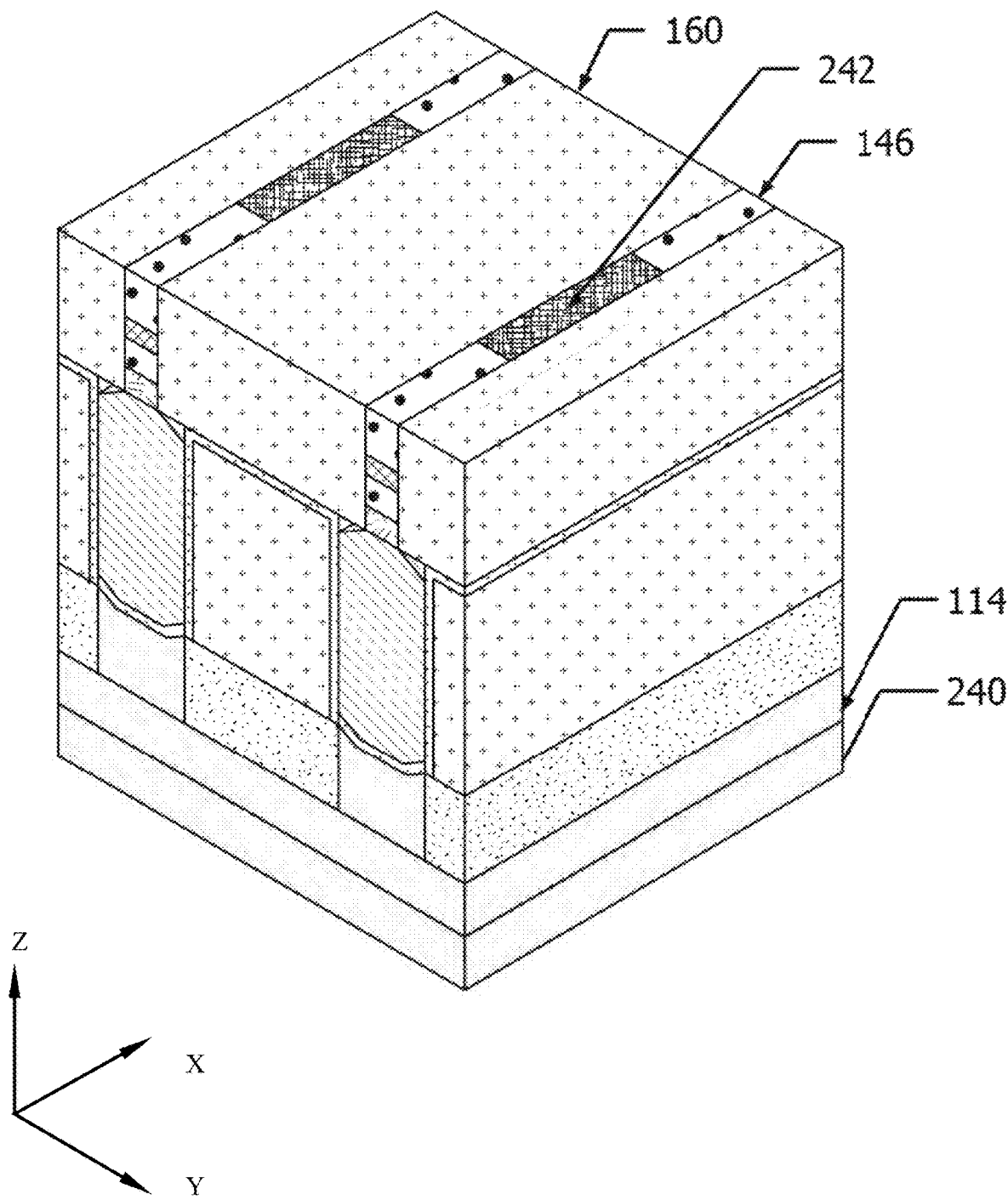
Figure 21B:
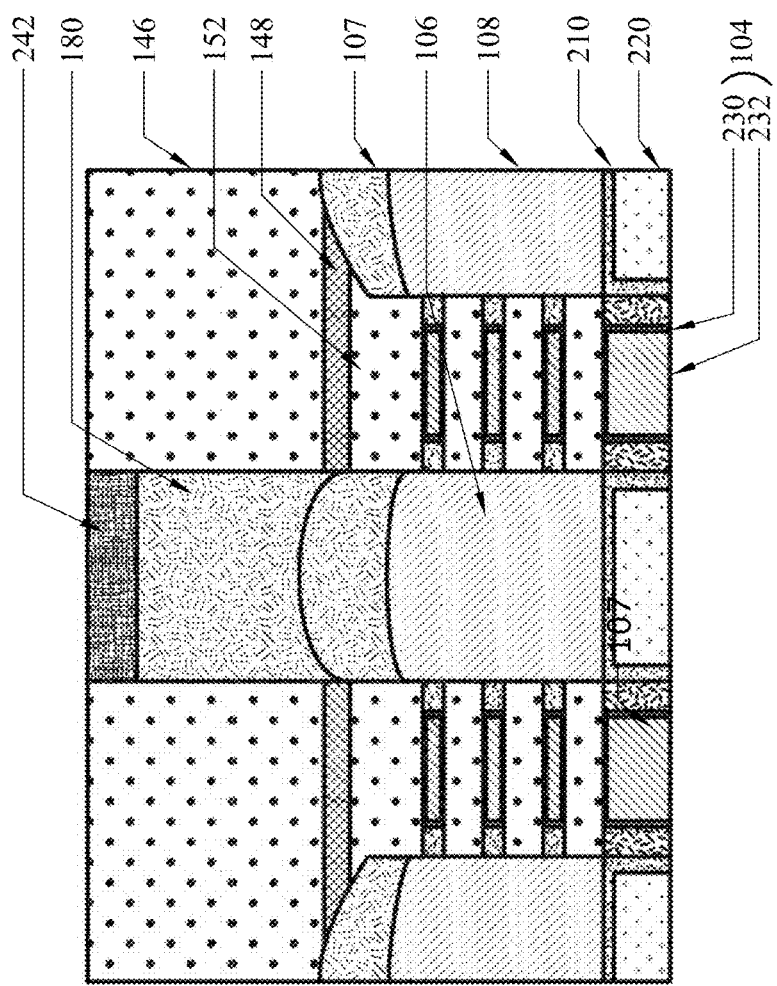
Figure 21B:
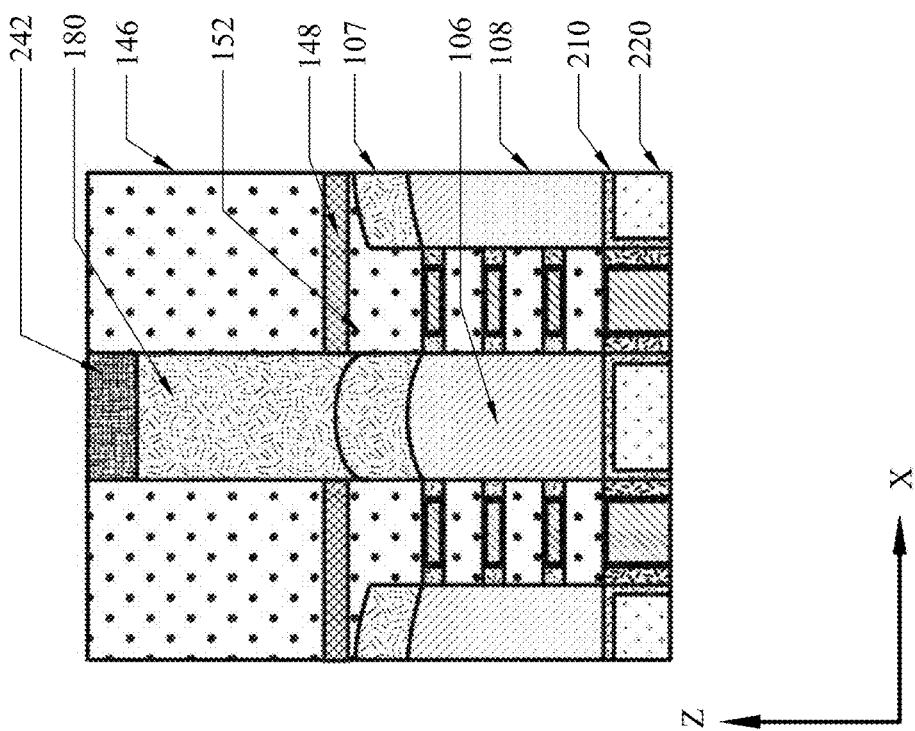

As shown in the perspective view of FIG. 21A and the x-direction cross-sectional view of FIG. 21B, in some embodiments, the workpiece is "flipped" upside down and thinned down from a back-side. The bulk substrate 142, the insulator substrate layer 144, and upper portions of the semiconductor substrate layer 146 and the lower isolation structure 160 are removed. The sacrificial source/drain contact 180 is further etched below the semiconductor substrate layer 146, and a masking layer 242 is formed on the sacrificial source/drain contact 180 and between the semiconductor substrate layer 146. The bulk substrate 142, the insulator substrate layer 144, the semiconductor substrate layer 146, and the lower isolation structure 160 may be removed in a plurality of process operations using, for example, CMP, and/or TMAH etching. In some embodiments, the masking layer 242 may be made of polymer. Alternatively, the masking layer 242 may be made of a dielectric material.

As shown in the perspective view of FIG. 22A and the x-direction cross-sectional view of FIG. 22B, in some embodiments, the semiconductor substrate layer 146 is removed to form back-side capping trenches 238 above the second source/drain epitaxial structure 108 and the gate structure 104. The semiconductor substrate layer 146 may be removed by an isotropic etching process, and the etch stop layer 148 may act as a stop layer of the etching process.

Figure 23:
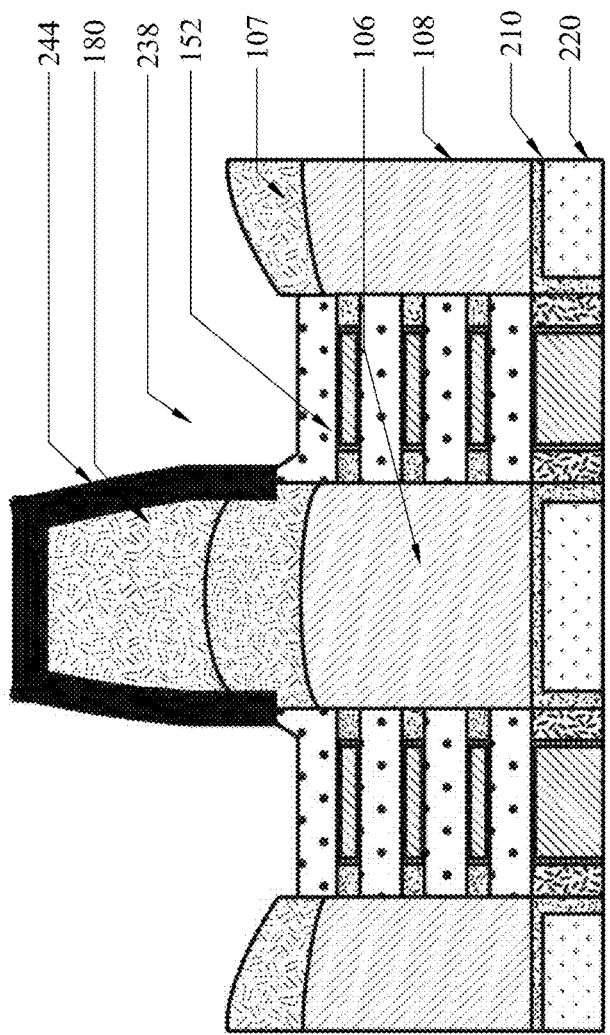
Figure 23:
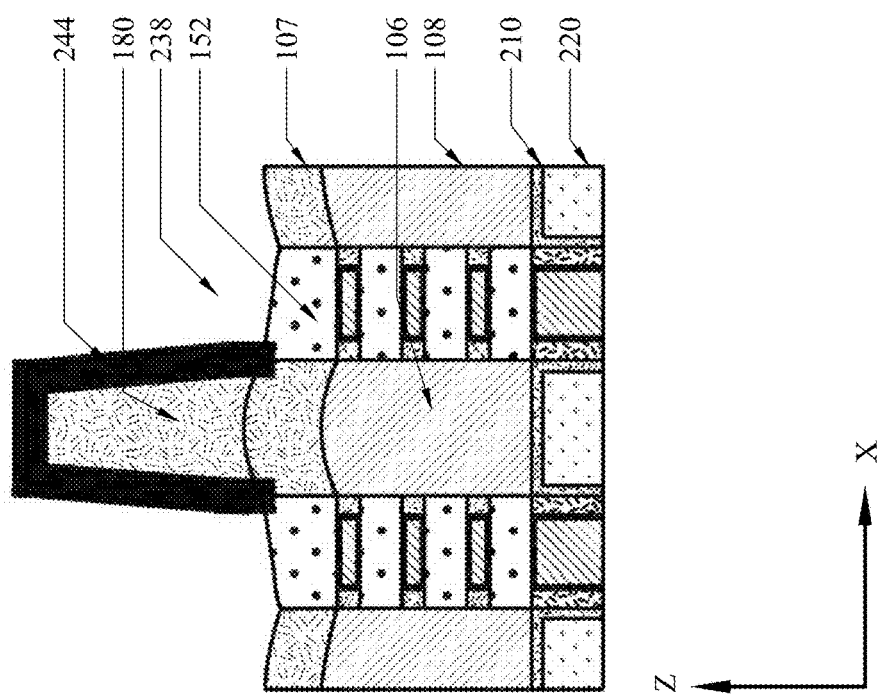

As shown in the x-direction cross-sectional view of FIG. 23, in some embodiments, the etch stop layer 148 is removed to expose the bottommost first semiconductor layer 152. In some embodiments, the masking layer 242 may be removed from top of the sacrificial source/drain contact 180. Then, a sidewall layer 244 is formed along top and/or sidewall surfaces of the sacrificial source/drain contact 180. In some embodiments, the sidewall layer 244 is formed by a deposition process of a dielectric material such as aluminum oxide followed by a selective removal process. The sidewall layer 244 may have a thickness of about 5-6 nm for example.

Figure 24:
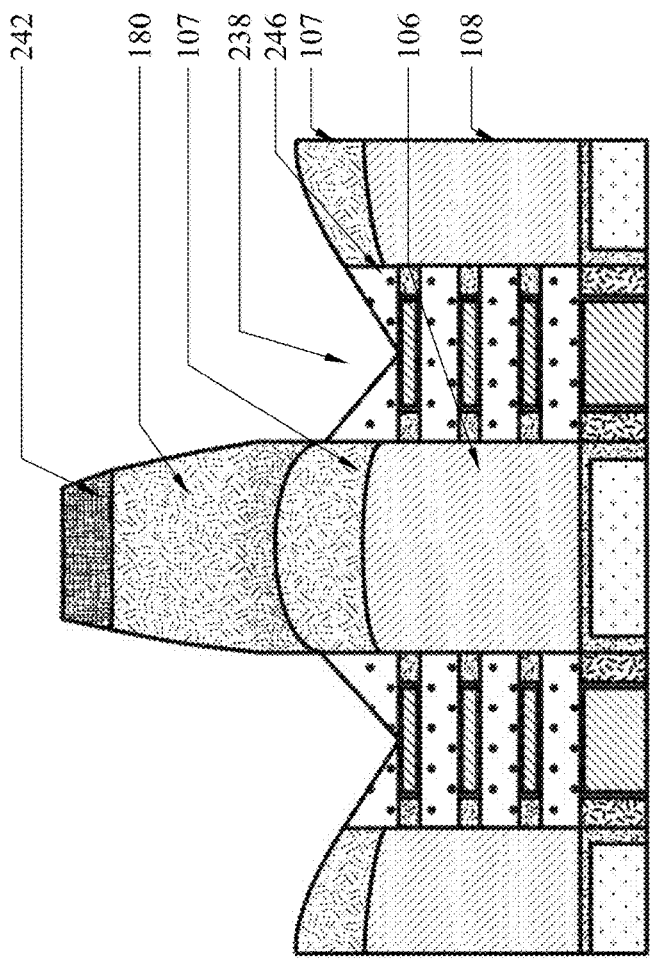
Figure 24:
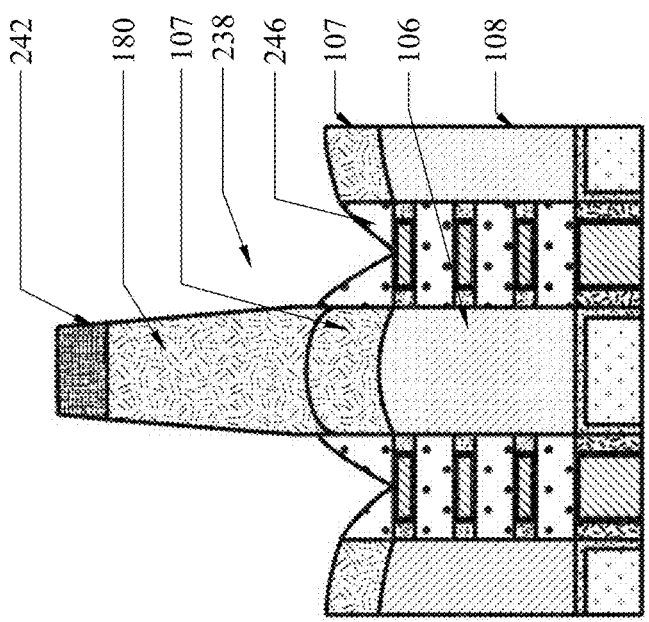
Figure 25A:
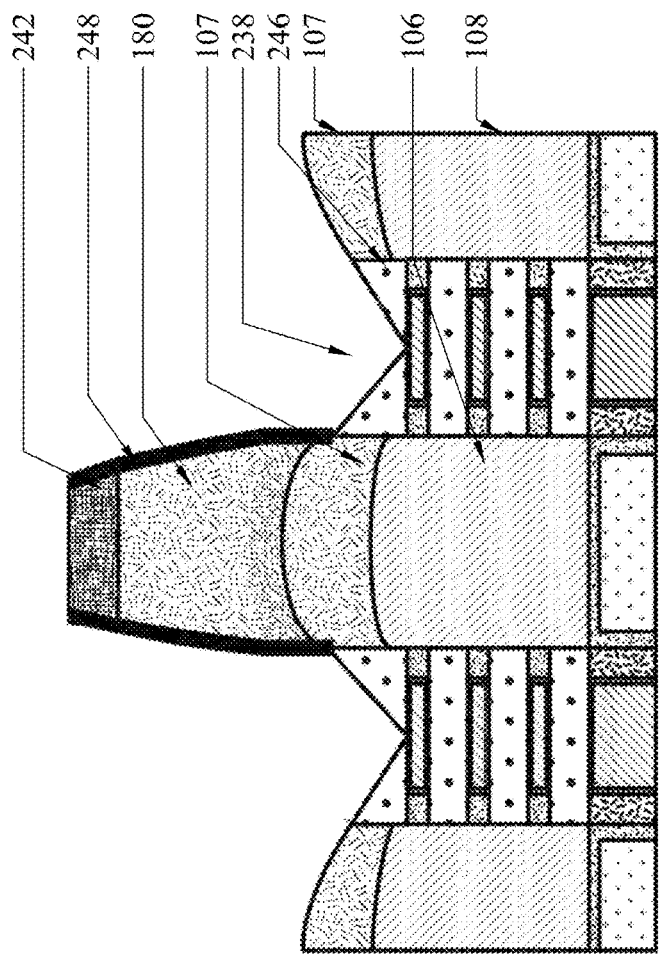
Figure 25B:
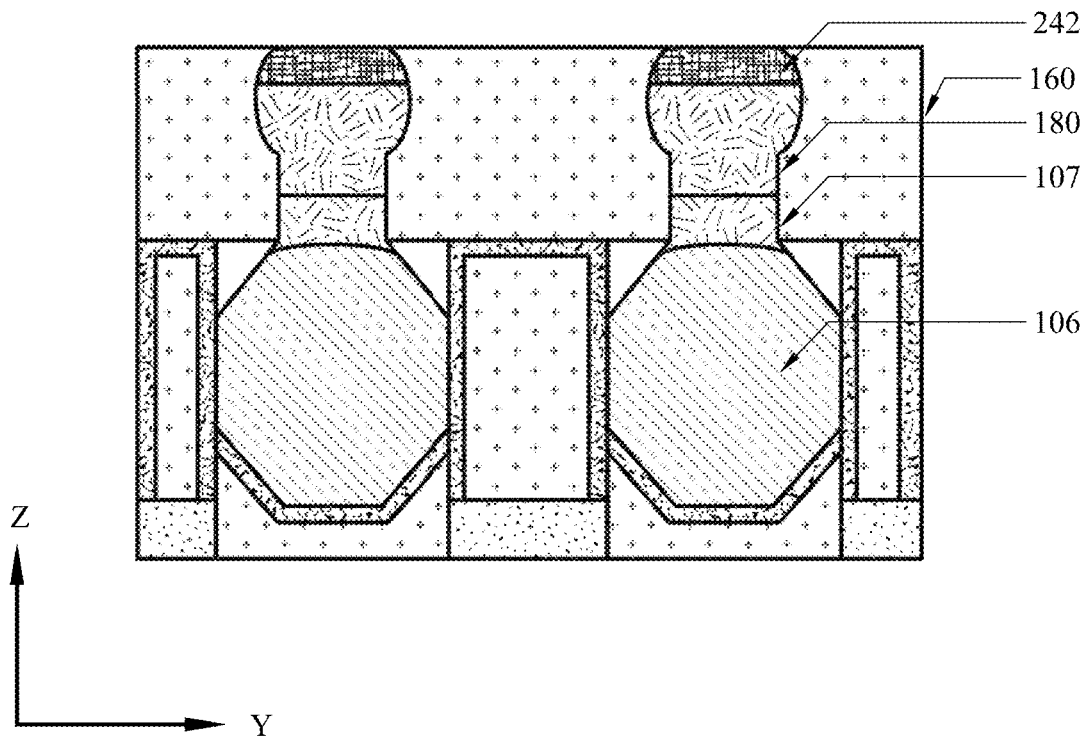
Figure 25C:
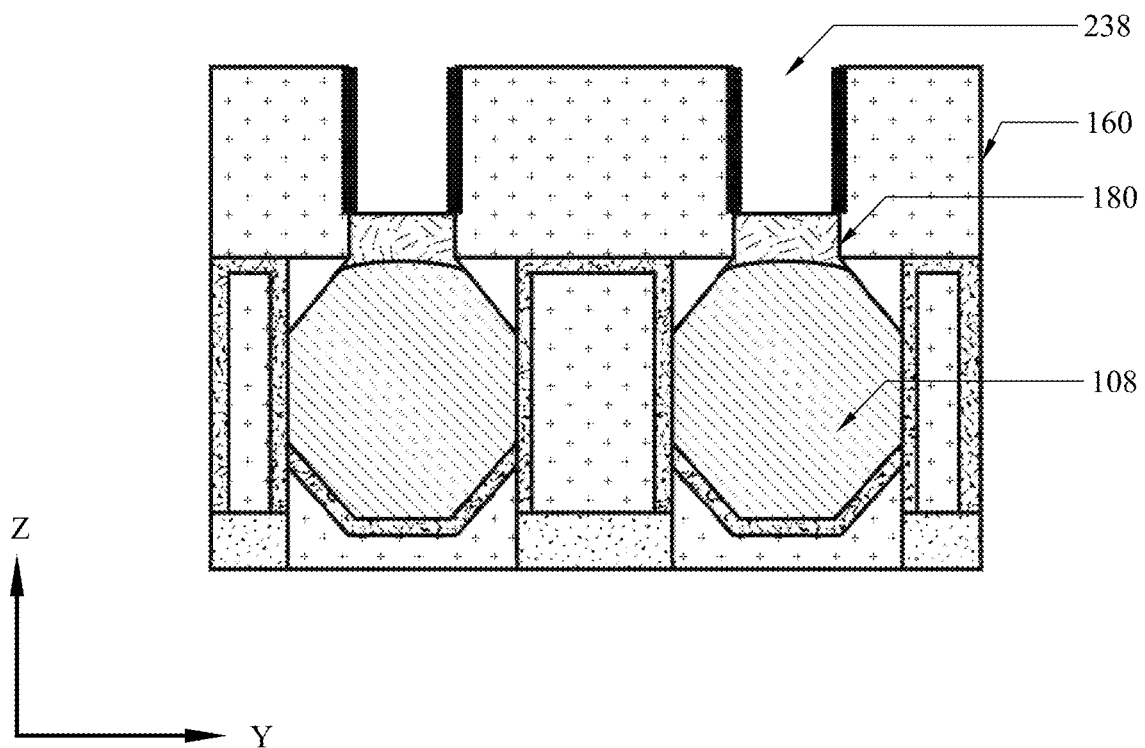
Figure 25D:
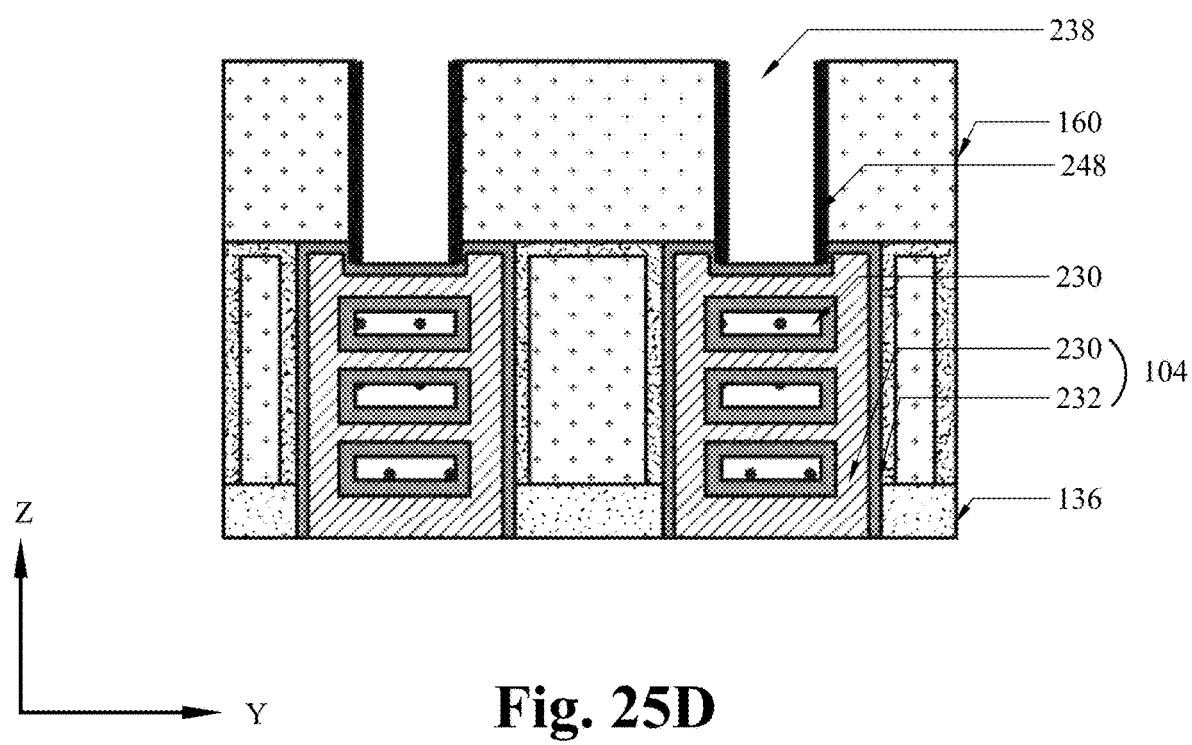
Figure 26:
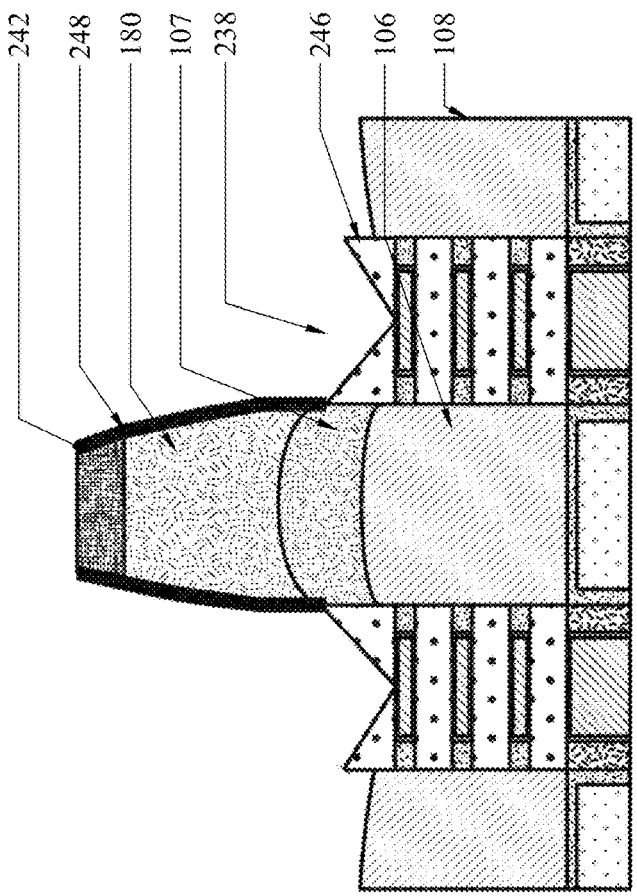
Figure 26:
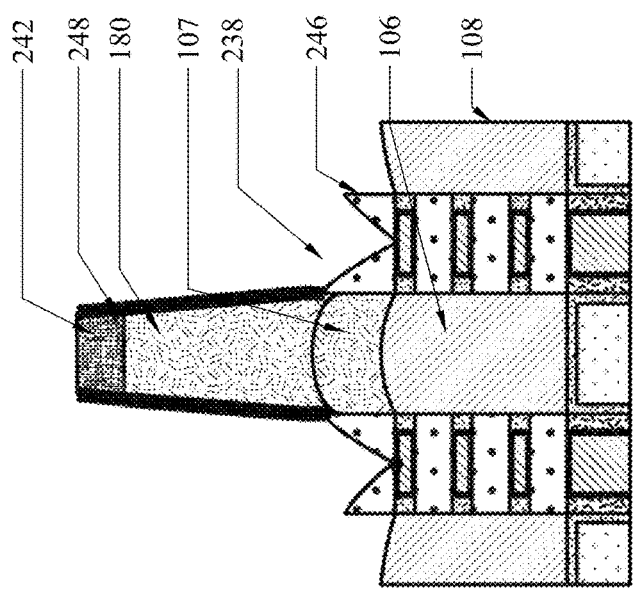
Figure 27:
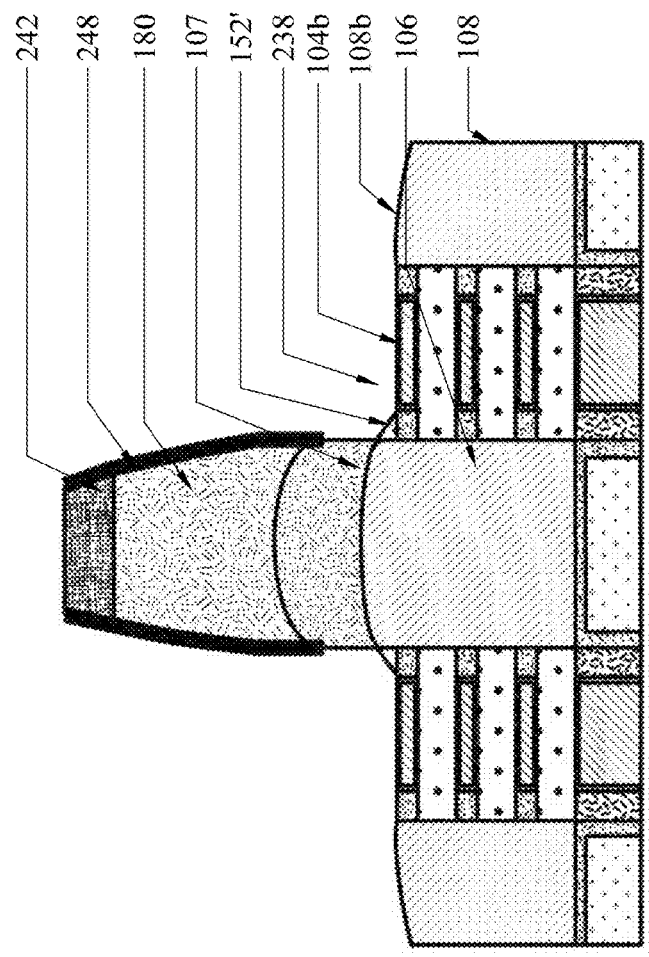
Figure 27:
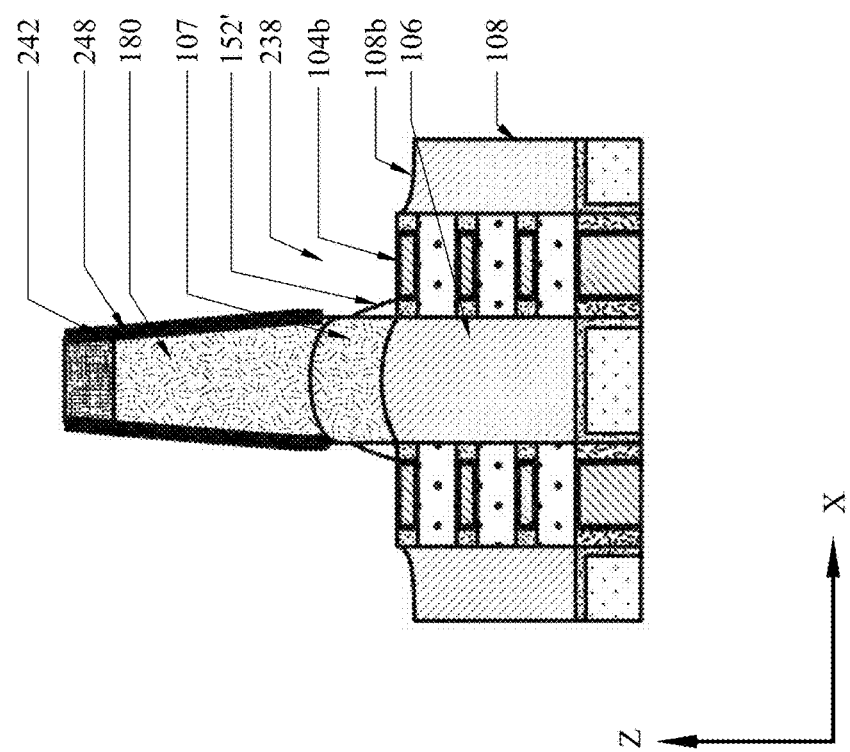

The sidewall layer 244 covers a portion of the bottommost first semiconductor layer 152 close to the sacrificial source/drain contact 180 and the first source/drain epitaxial structure 106, and thus protects the first source/drain epitaxial structure 106 from being damaged during subsequent removal of the bottommost first semiconductor layer 152 and recessing of the second source/drain epitaxial structure 108 (see FIGS. 26-27.) FIGS. 24-25 show an alternative embodiment of forming a protective spacer to protect the first source/drain epitaxial structure 106. Manufacturing steps of FIG. 23 continues from FIG. 26.

As shown in the x-direction cross-sectional view of FIG. 24, in some embodiments alternative to FIG. 23, the etch stop layer 148 is removed, and the bottommost first semiconductor layer 152 is partially removed while leaving a corner portion of the bottommost first semiconductor layer 152 along upper sidewalls of the first source/drain epitaxial structure 106, the second source/drain epitaxial structure 108, and/or the intermediate source/drain layer 107 as a protective spacer 246. In some embodiments, the bottommost first semiconductor layer 152 is partially removed by an isotropic wet etching process. The etching process may expose top and/or sidewall surfaces of the sacrificial source/drain contact 180.

As shown in the x-direction cross-sectional view of FIG. 25A, the y-direction cross-sectional view of FIG. 25B in the first source/drain region, and the y-direction cross-sectional view of FIG. 25C in the second source/drain region, in some embodiments, a sidewall liner 248 is formed along the sacrificial source/drain contact 180. The sidewall liner 248 may be formed by depositing a conformal dielectric liner along exposed surfaces of the workpiece followed by an anisotropic etching process. The sidewall liner 248 may have a thickness of about 2-3 nm for example.

Figure 28A:
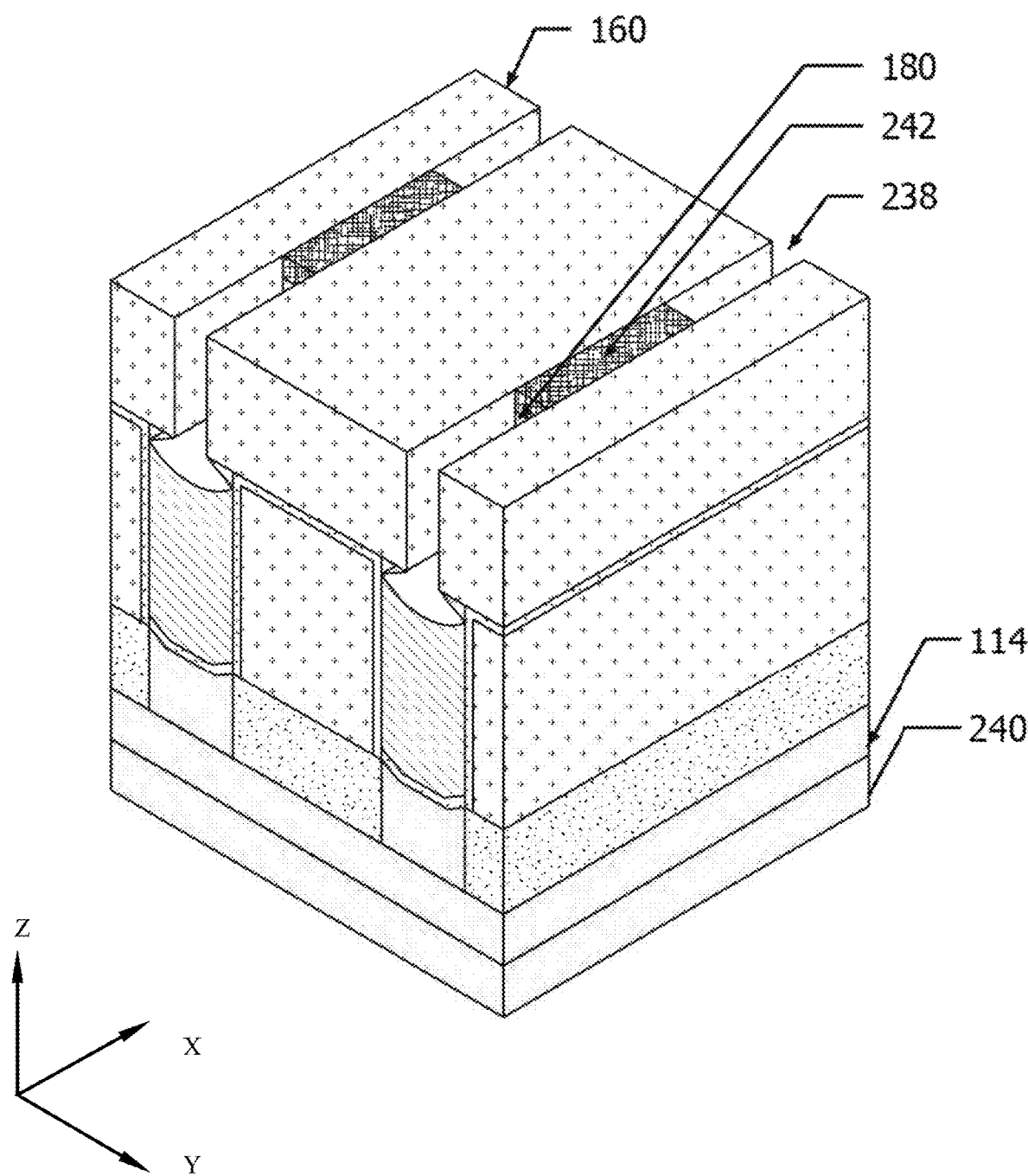
Figure 28B:
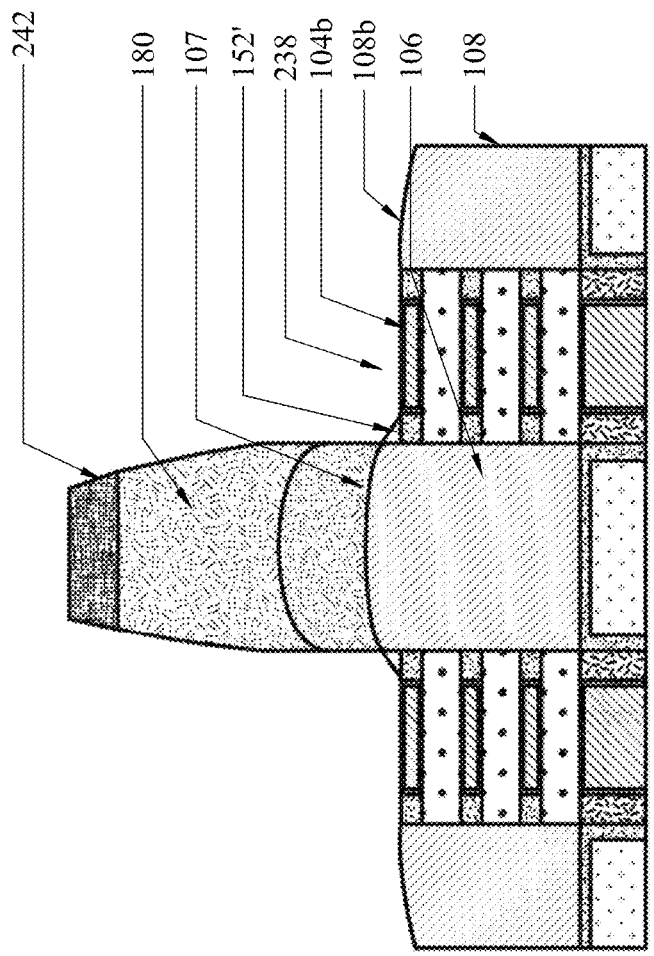
Figure 28B:
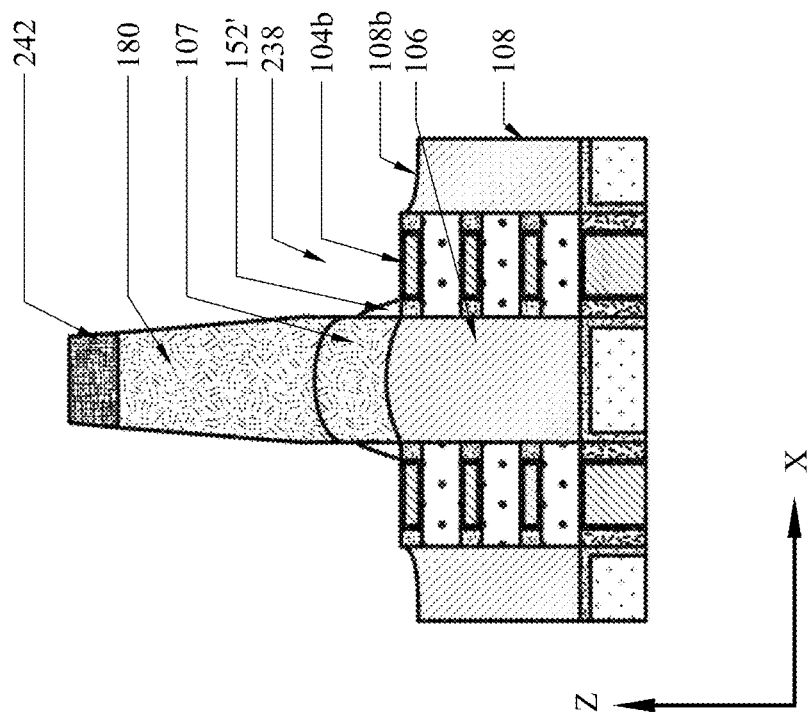
Figure 28C:
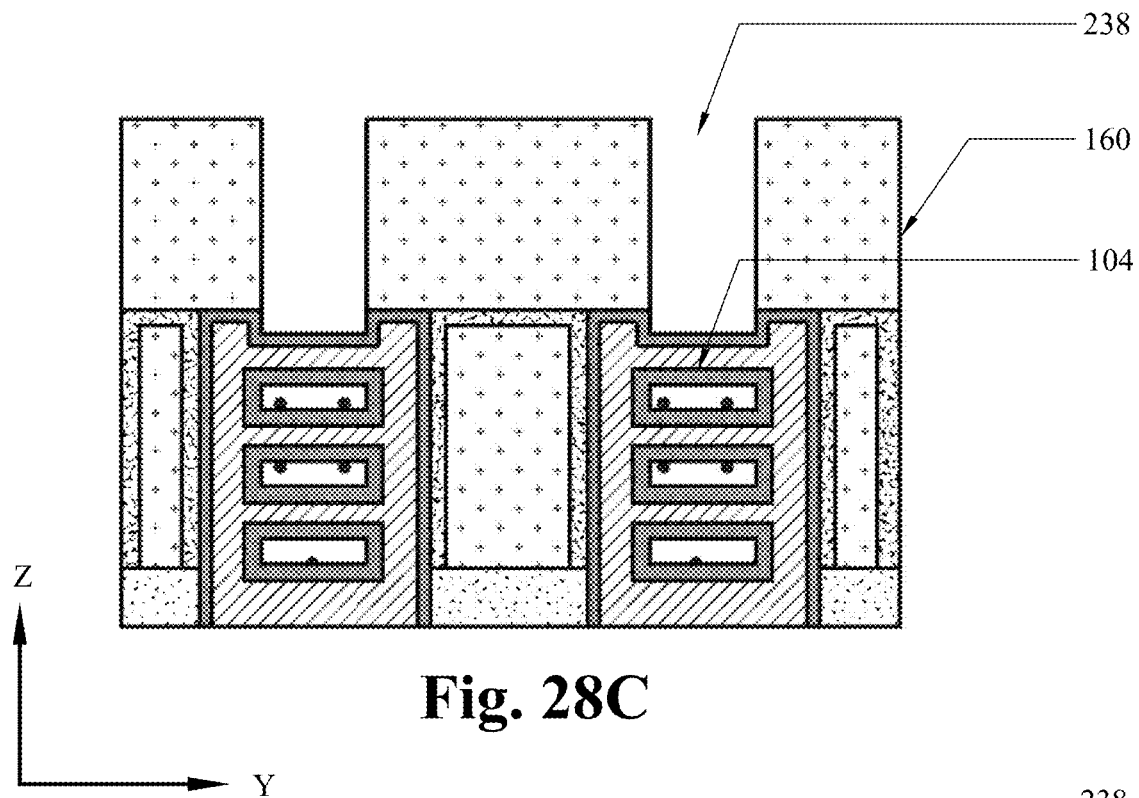
Figure 28D:
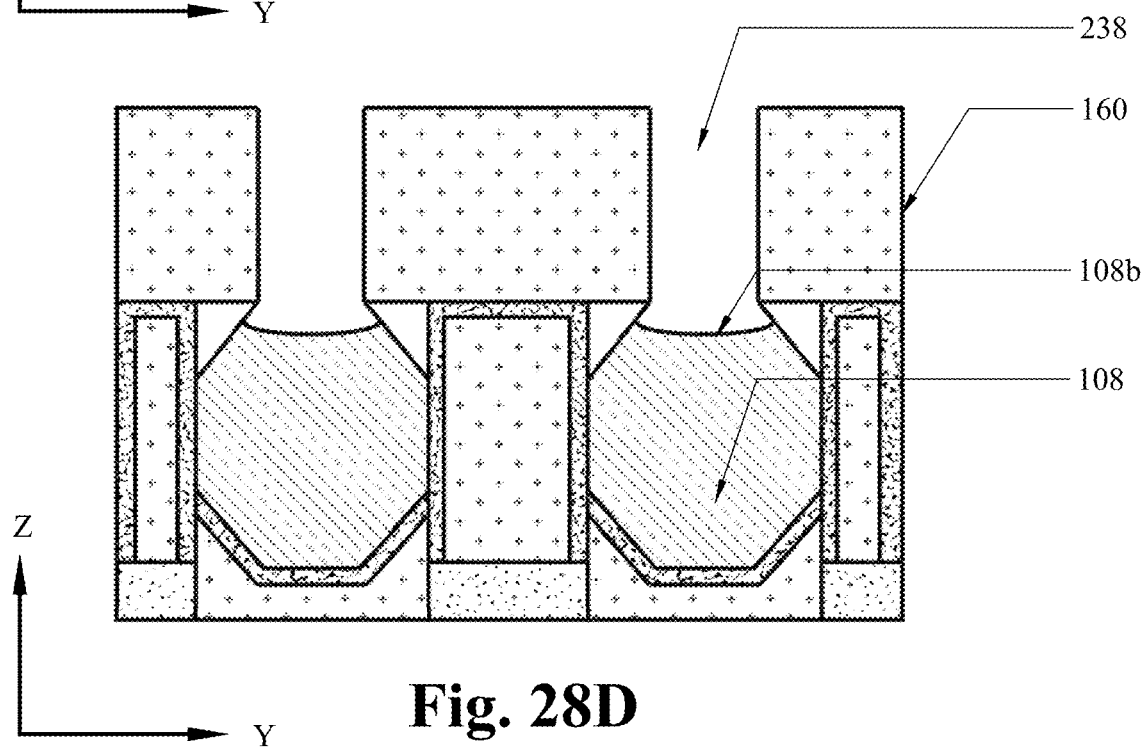

As shown in the x-direction cross-sectional views of FIGS. 26, 27, and 28B, the perspective view of FIG. 28A, the y-direction cross-sectional view of FIG. 28C in the second source/drain region, and the y-direction cross-sectional view of FIG. 28D in the gate region, in some embodiments, the second source/drain epitaxial structure 108 is recessed from top. As shown in FIG. 26, the intermediate source/drain layer 107 is firstly removed. The sidewall layer 244 and the underlying portion of the bottommost first semiconductor layer 152 (as shown in FIG. 23) or the sidewall liner 248 and the protective spacer 246 (as shown in FIG. 25A) protect the first source/drain epitaxial structure 106 from damage during the removal of the intermediate source/drain layer 107. Then, as shown in FIG. 27, the second source/drain epitaxial structure 108 is recessed. Then, as shown in FIG. 28B, the sidewall layer 244 (as shown in FIG. 23) or the sidewall liner 248 (as shown in FIG. 25A) is removed. The bottommost first semiconductor layer 152 or the protective spacer 246 may be partially removed when recessing the second source/drain epitaxial structure 108 and removing the sidewall layer 244 or the sidewall liner 248, and a corner residue 152' of the bottommost first semiconductor layer 152 or the protective spacer 246 may still be left along the upper sidewall of the second source/drain epitaxial structure 108. In some embodiments, the second source/drain epitaxial structure 108 is recessed by an isotropic etch or a combination of isotropic and anisotropic etch. The recessed bottom surface 108b of the second source/drain epitaxial structure 108 may be lower in the short channel transistor device than in the long channel transistor device. The bottom surface 108b of the second source/drain epitaxial structure 108 may be recessed as a convex shape both along the x-direction reaching a location vertically deeper than the bottom surface 104b of the gate structure 104 (See FIG. 28B) and along the y-direction (See FIG. 28D) in the short channel transistor device. In some embodiments, the bottom surface 108b of the second source/drain epitaxial structure 108 is vertically about 10 nm to 20 nm deeper than the bottom surface 104b of the gate structure 104 in the short channel transistor device. The bottom surface 108b may be recessed to a location vertically equal to or also deeper than the bottom surface 104b of the gate structure 104 in the long channel transistor device.

Figure 29A:
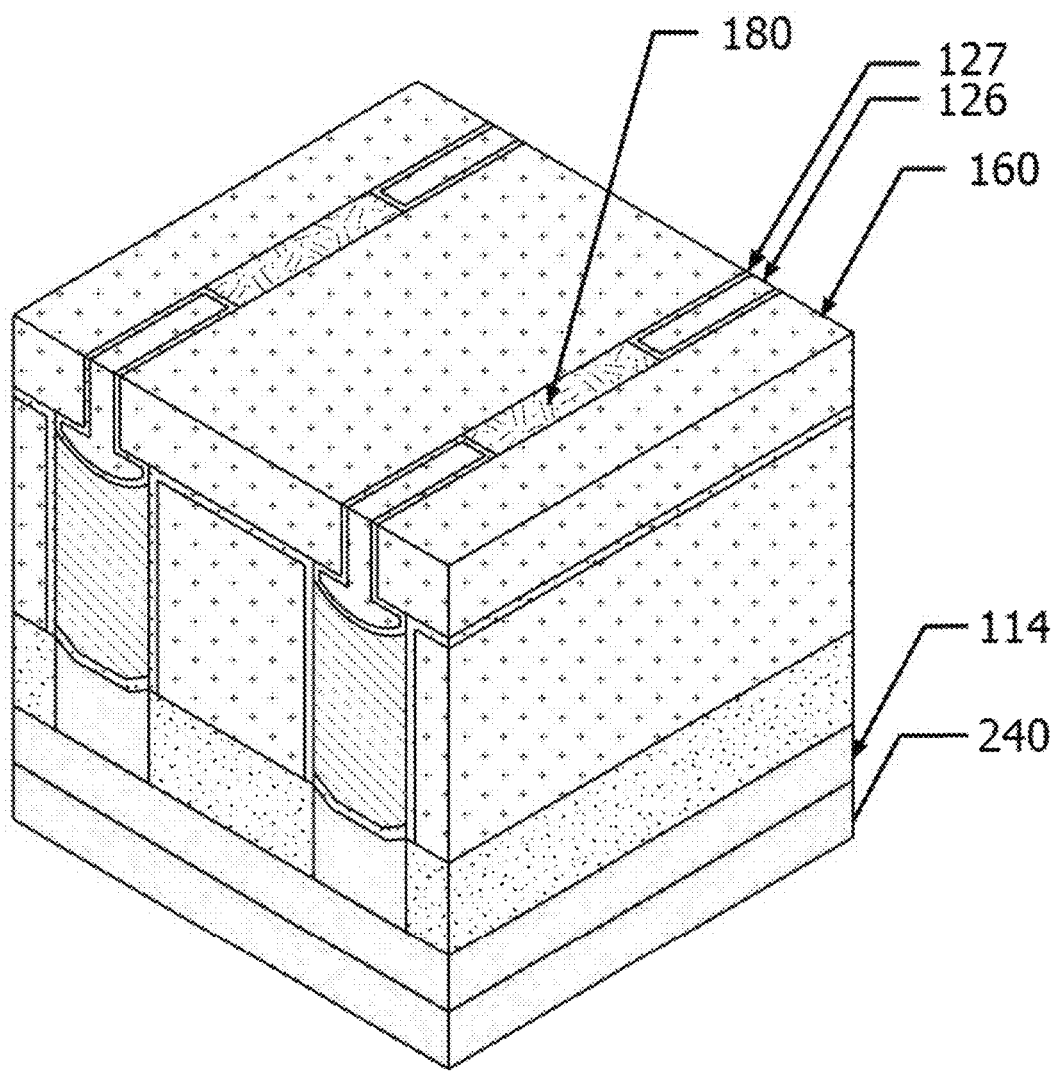
Figure 29B:
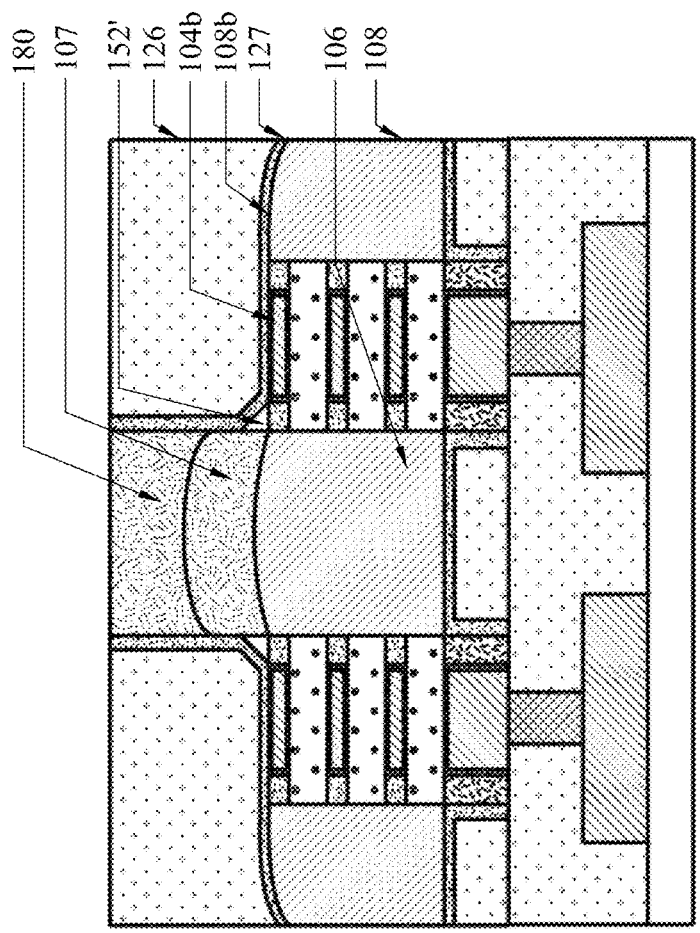
Figure 29B:
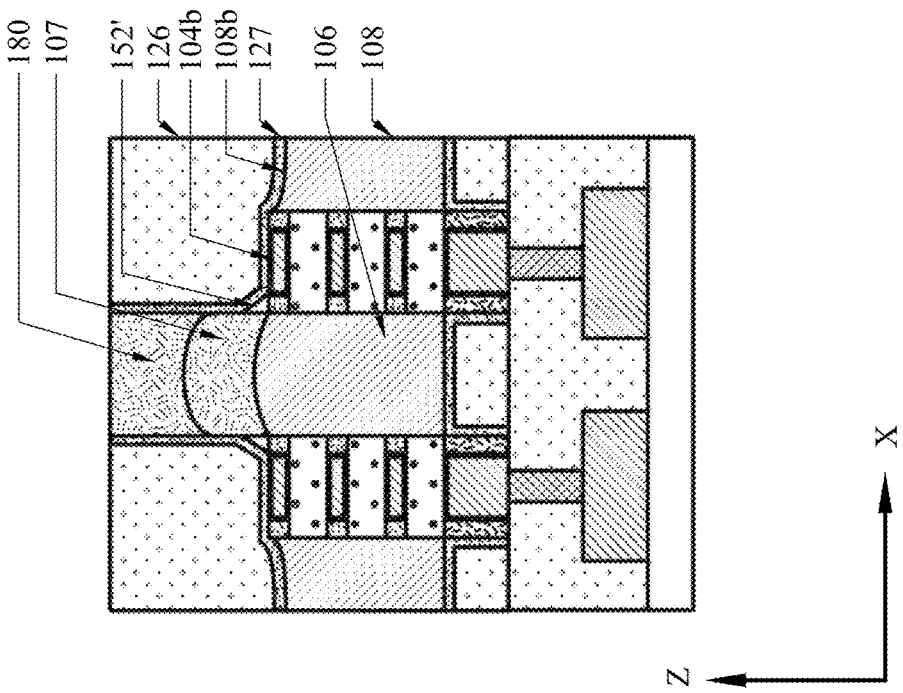
Figure 29C:
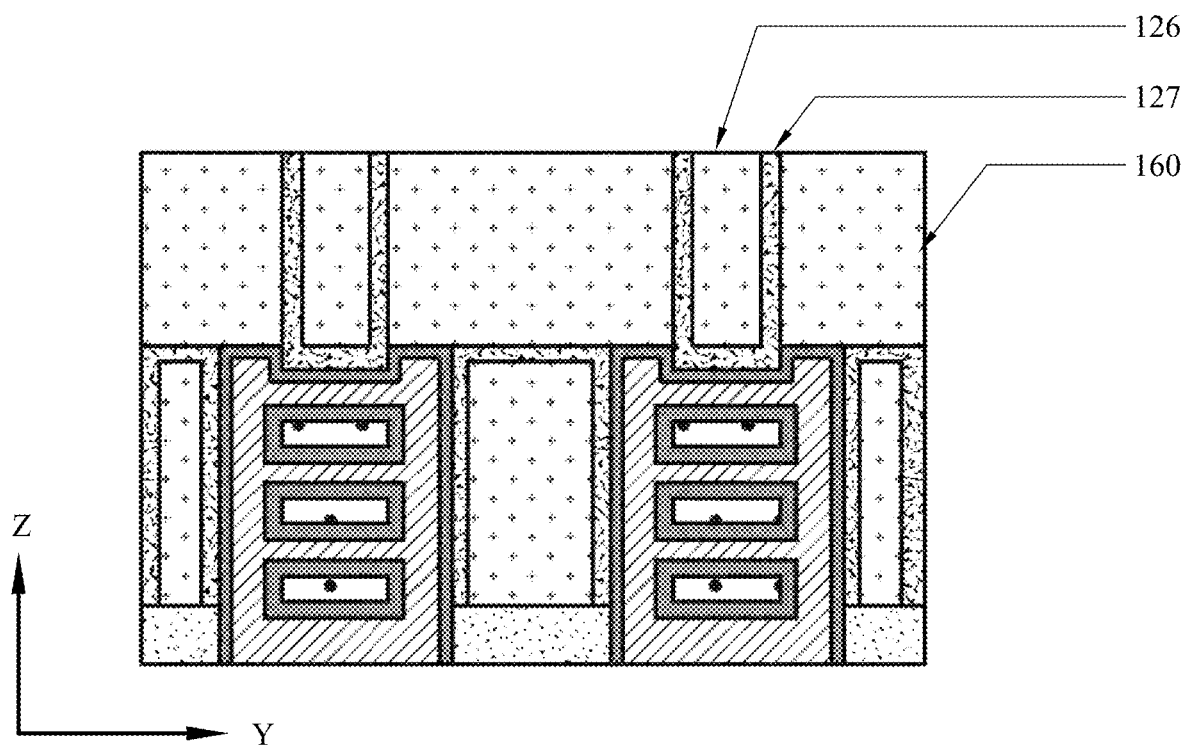
Figure 29D:
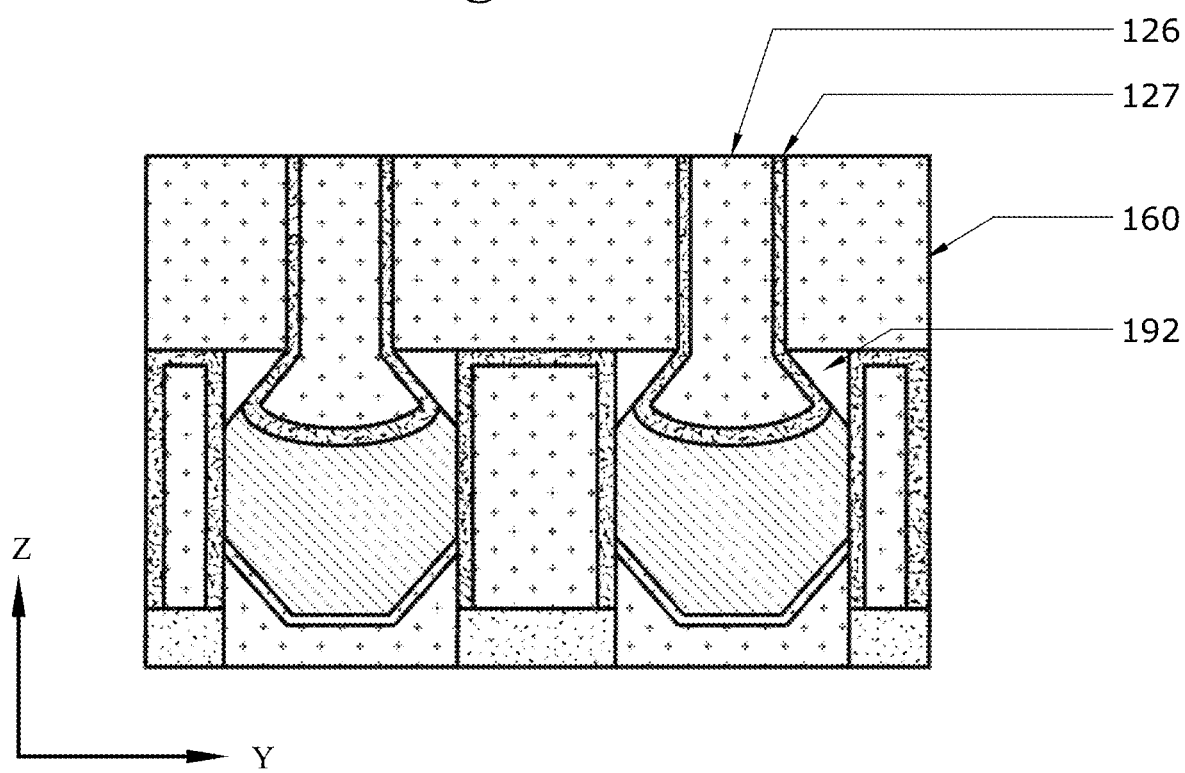

As shown in the perspective view of FIG. 29A, the x-direction cross-sectional view of FIG. 29B, the y-direction cross-sectional view of FIG. 29C in the gate region, and the y-direction cross-sectional view of FIG. 29D in the second source/drain region, in some embodiments, a second dielectric liner 127 and a back-side dielectric cap 126 are formed in the back-side capping trenches 238 (see FIG. 28A). The second dielectric liner 127 and the back-side dielectric cap 126 may be formed directly above the second source/drain epitaxial structure 108 and the gate structure 104. The second dielectric liner 127 protects the second source/drain epitaxial structure 108 from oxidation, and also prevents metal gate threshold shift during subsequent manufacturing processes. The second dielectric liner 127 may be formed by for example, a conformal deposition process to deposit a dielectric material in the back-side capping trenches 238, and the back-side dielectric cap 126 may be formed by for example, a deposition process to deposit a dielectric material on the second dielectric liner 127, followed by a CMP process to remove excess dielectric materials outside the back-side capping trenches 238. As an example, the second dielectric liner 127 may be made of low-κ material (κ<7) such as $SiO_2$, $Si_3N_4$, silicon carbonitride (SiCN), silicon oxycarbide (SiOC), silicon oxycarbonitride (SiOCN), and the like or high-κ material (κ>7) such as $HfO_2$, $ZrO_2$, ZrAlOx, HfAlOx, HfSiOx, AlOx, and the like. In some embodiments, the back-side dielectric cap 126 have a convex top surface 126s contacting the second source/drain epitaxial structure 108. As an example, the back-side dielectric cap 126 may be formed with a thickness T of about 40 nm from the bottom surface 108b to a top surface of the back-side dielectric cap 126 after the CMP process. As an example, the second dielectric liner 127 may have a thickness less than about 5 nm.

Figure 30A:
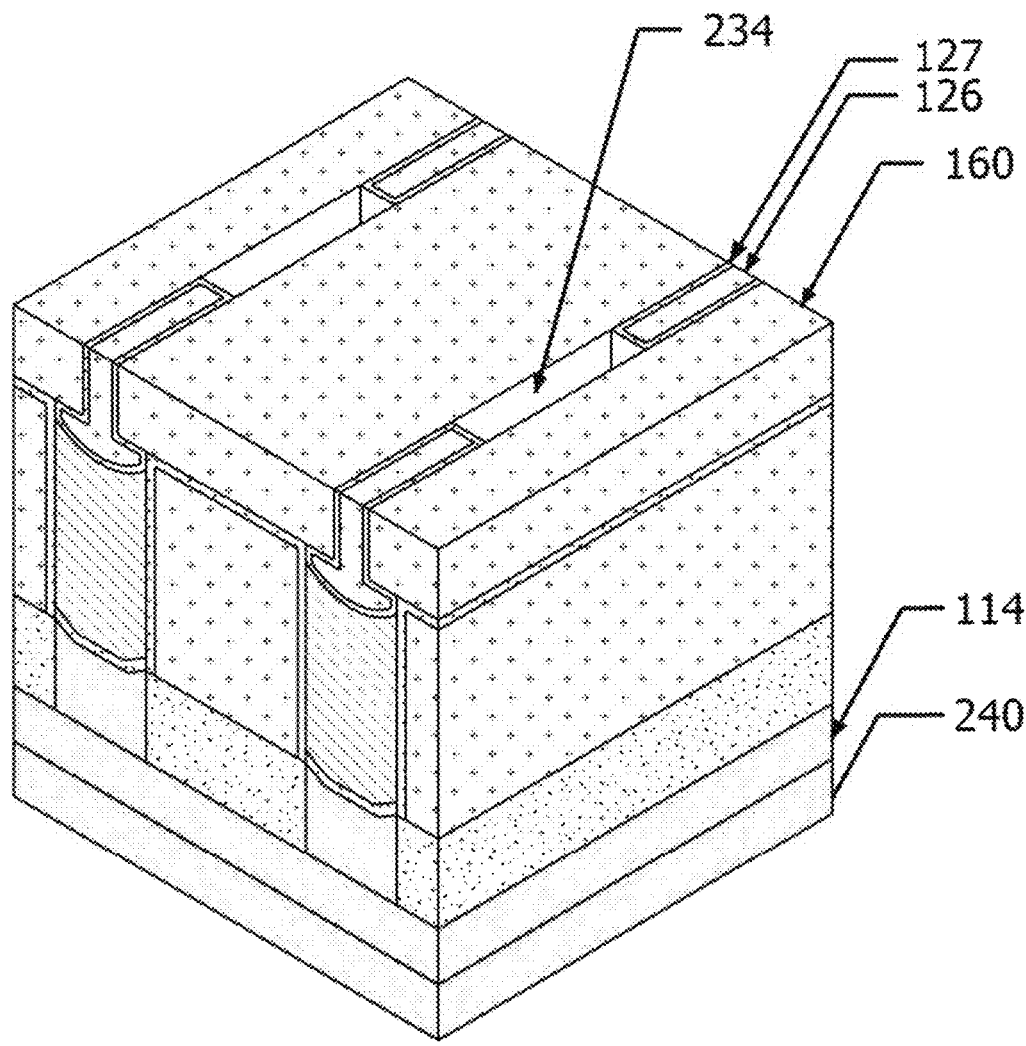
Figure 30B:
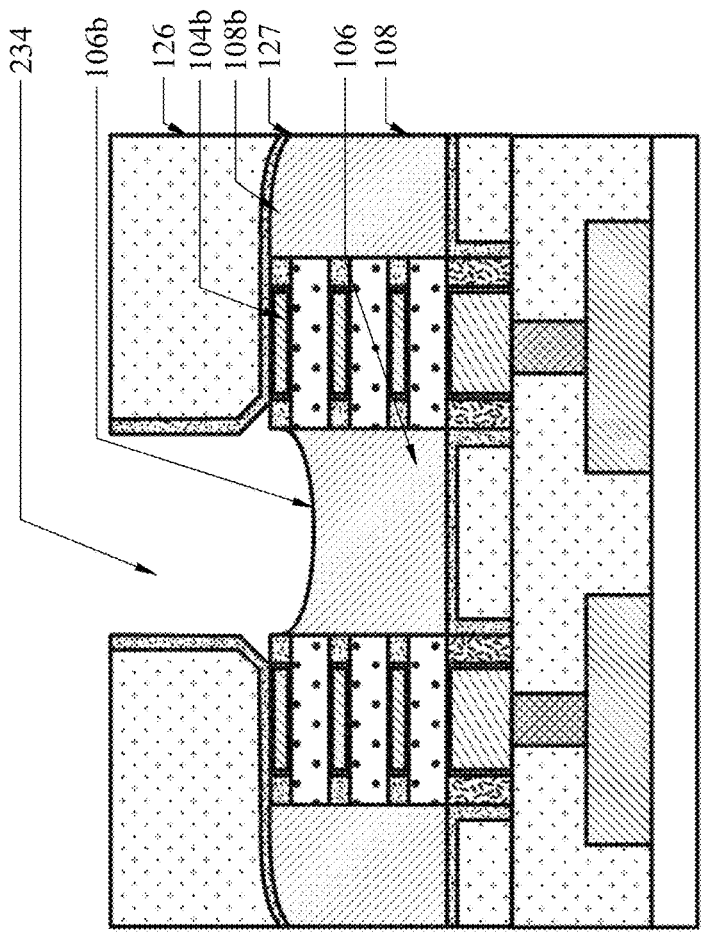
Figure 30B:
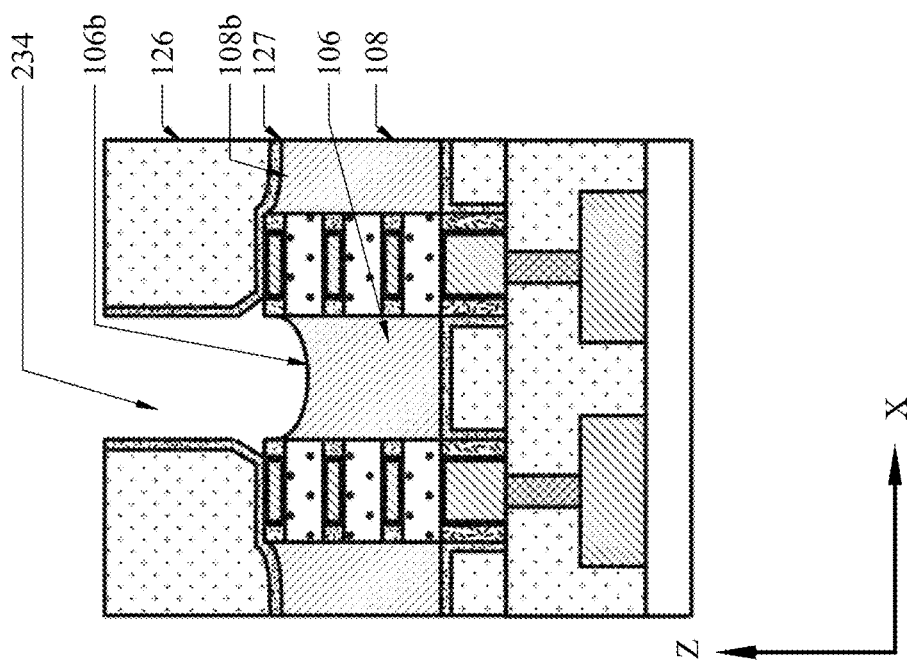
Figure 30C:
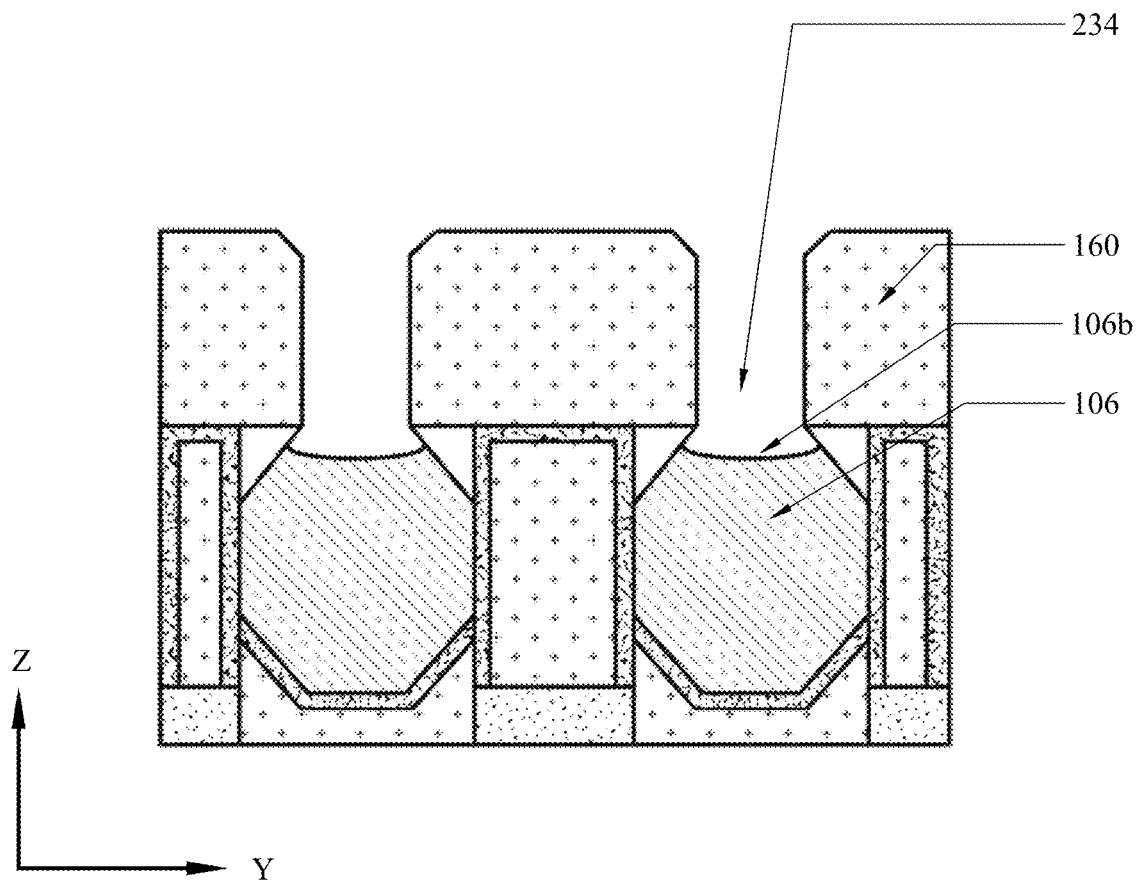

As shown in the perspective view of FIG. 30A, the x-direction cross-sectional view of FIG. 30B, and the y-direction cross-sectional view of FIG. 30C in the first source/drain region, in some embodiments, the sacrificial source/drain contact 180 is removed, and the underlying first source/drain epitaxial structure 106 is recessed from the back-side thereof to form a back-side source/drain contact trench 234 recessed into an upper portion of the first source/drain epitaxial structure 106. The first source/drain epitaxial structure 106 can be recessed or etched using an etchant that can selectively etch the first source/drain epitaxial structure 106 at a faster etching rate than etching surrounding dielectric materials. In some embodiments, the etching process is isotropic or includes an isotropic etching process, and a bottom surface 106b of the first source/drain epitaxial structure 106 may be recessed as a convex shape both along the x-direction (See FIG. 30B) and along the y-direction (See FIG. 30C) reaching a location vertically deeper than a bottom surface 104b of the gate structure 104 (See FIG. 30B). In some embodiments, the bottom surface 106b of the first source/drain epitaxial structure 106 is vertically about 10 nm to 20 nm deeper than the bottom surface 104b of the gate structure 104. In some embodiments, the corner residue 152' is removed when removing the sacrificial source/drain contact 180 and recessing the first source/drain epitaxial structure 106, leaving a void ledge in the back-side source/drain contact trench 234.

Figure 31A:
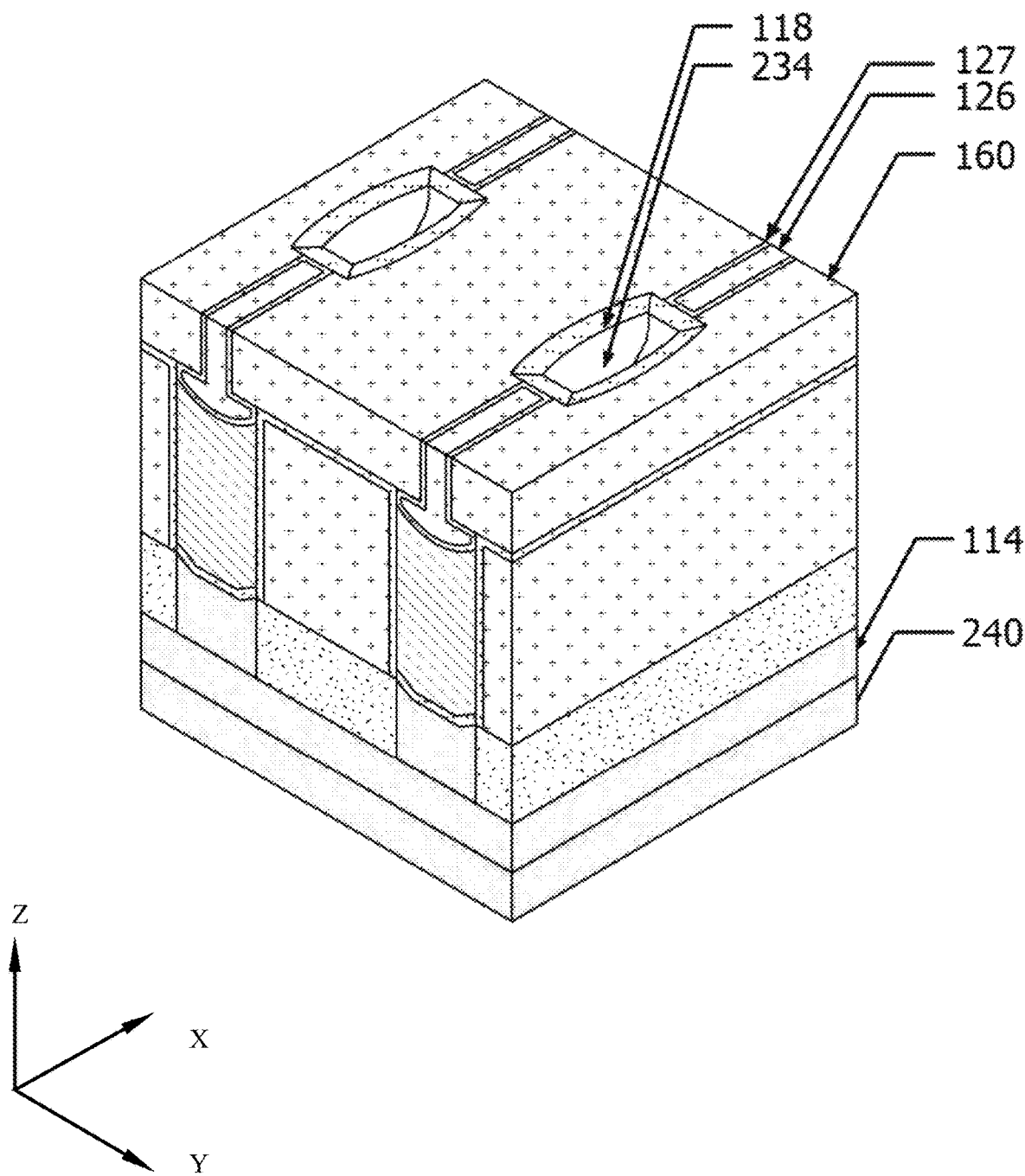
Figure 31B:
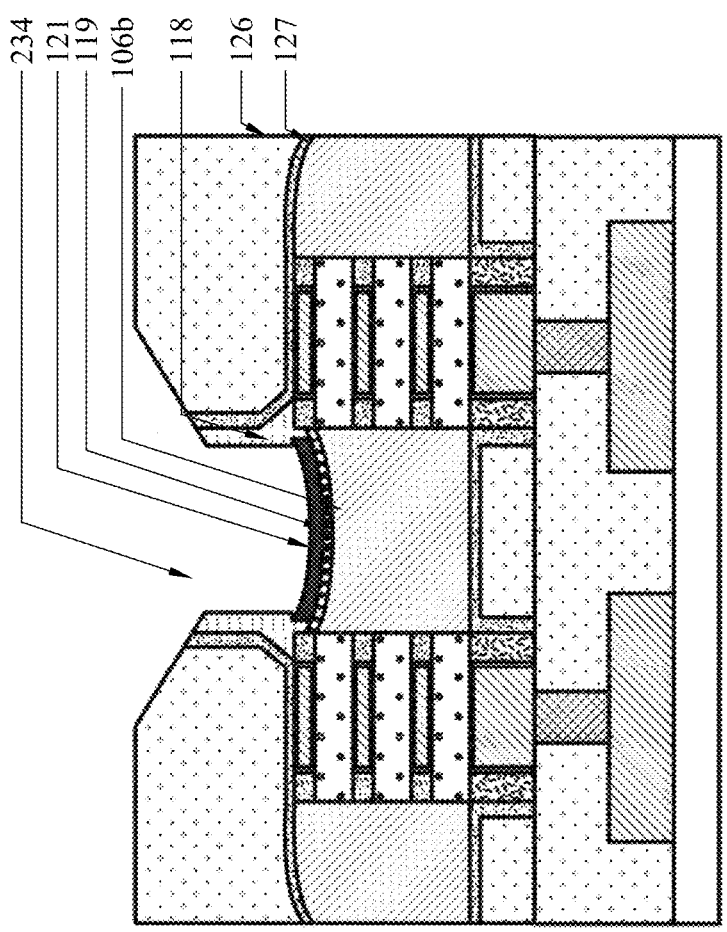
Figure 31B:
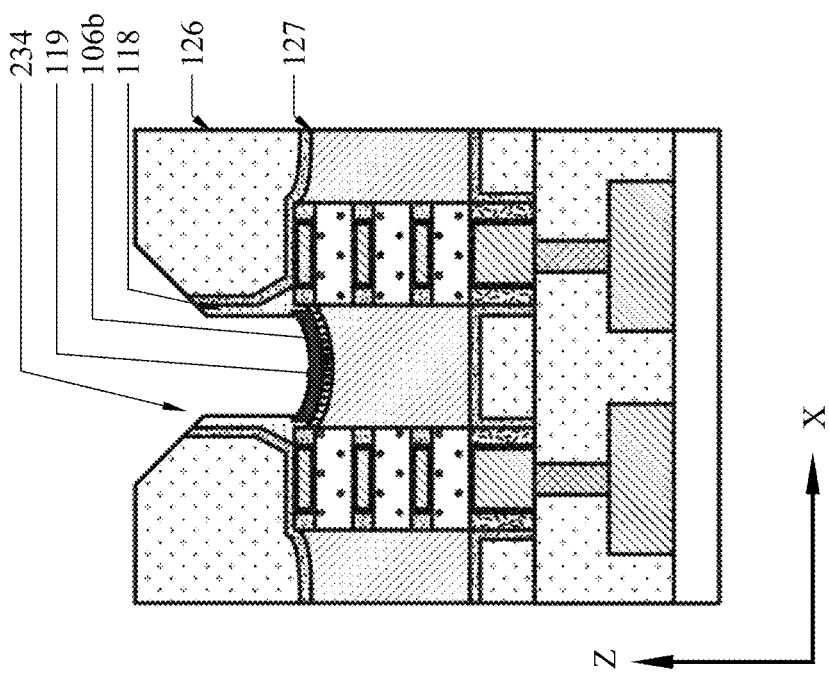
Figure 31C:
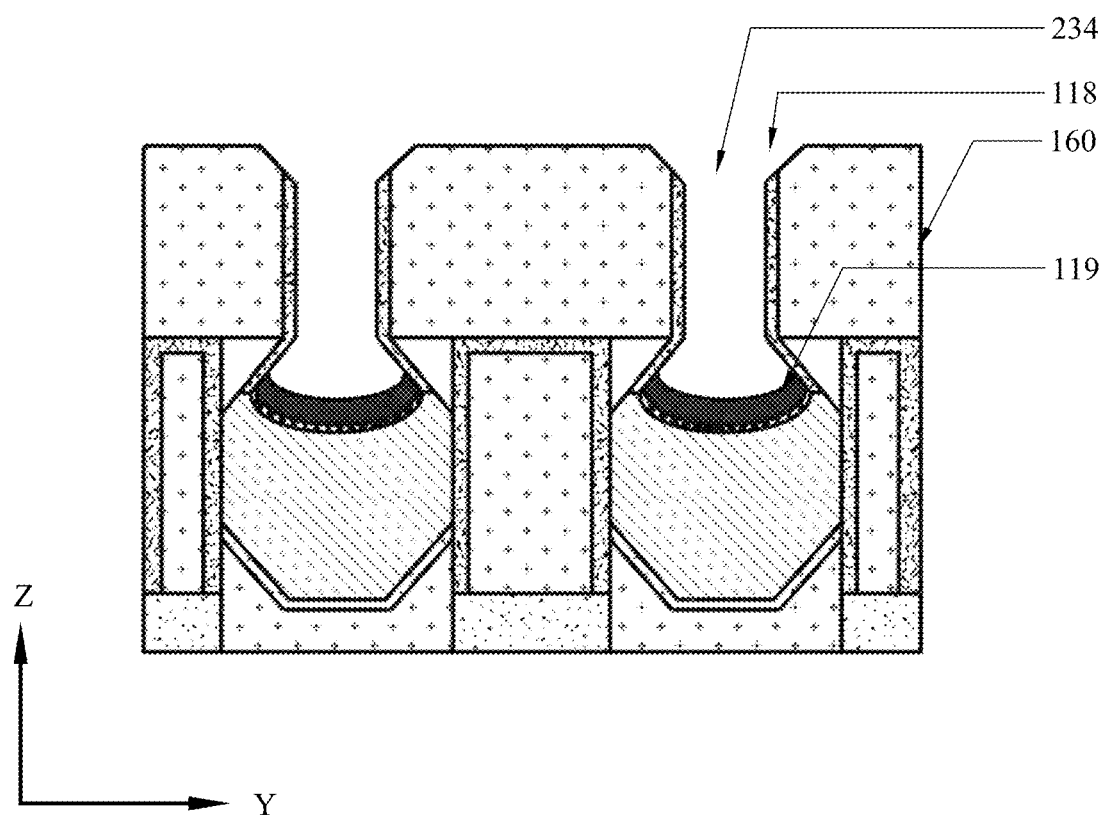

As shown in the perspective view of FIG. 31A, the x-direction cross-sectional view of FIG. 31B, and the y-direction cross-sectional view of FIG. 31C in the first source/drain region, in some embodiments, an opening of the back-side source/drain contact trench 234 is enlarged and rounded for better filling in subsequent processing steps. A low temperature epitaxial layer 119 may be formed on the recessed bottom surface 106b of the first source/drain epitaxial structure 106 in the enlarged back-side source/drain contact trench 234. The low temperature epitaxial layer 119 is formed with a doping concentration greater than that of the first source/drain epitaxial structure 106, such that a better metal alloy layer can be formed subsequently to gain performance. As an example, the low temperature epitaxial layer 119 may be formed with a thickness of about 5 nm. In some embodiments, a metal alloy layer 121 may be formed on the low temperature epitaxial layer 119 or the first source/drain epitaxial structure 106 if the low temperature epitaxial layer 119 was not formed. The metal alloy layer 121 may be a silicide layers formed by a self-aligned salicide process. The metal alloy layer 121 may include a material selected from titanium silicide, cobalt silicide, nickel silicide, platinum silicide, nickel platinum silicide, erbium silicide, palladium silicide, combinations thereof, or other suitable materials. In some embodiments, the metal alloy layer 121 may include germanium. A first dielectric liner 118 may be formed along a sidewall of the back-side source/drain contact trench 234 and may contact the second dielectric liner 127.

Figure 32A:
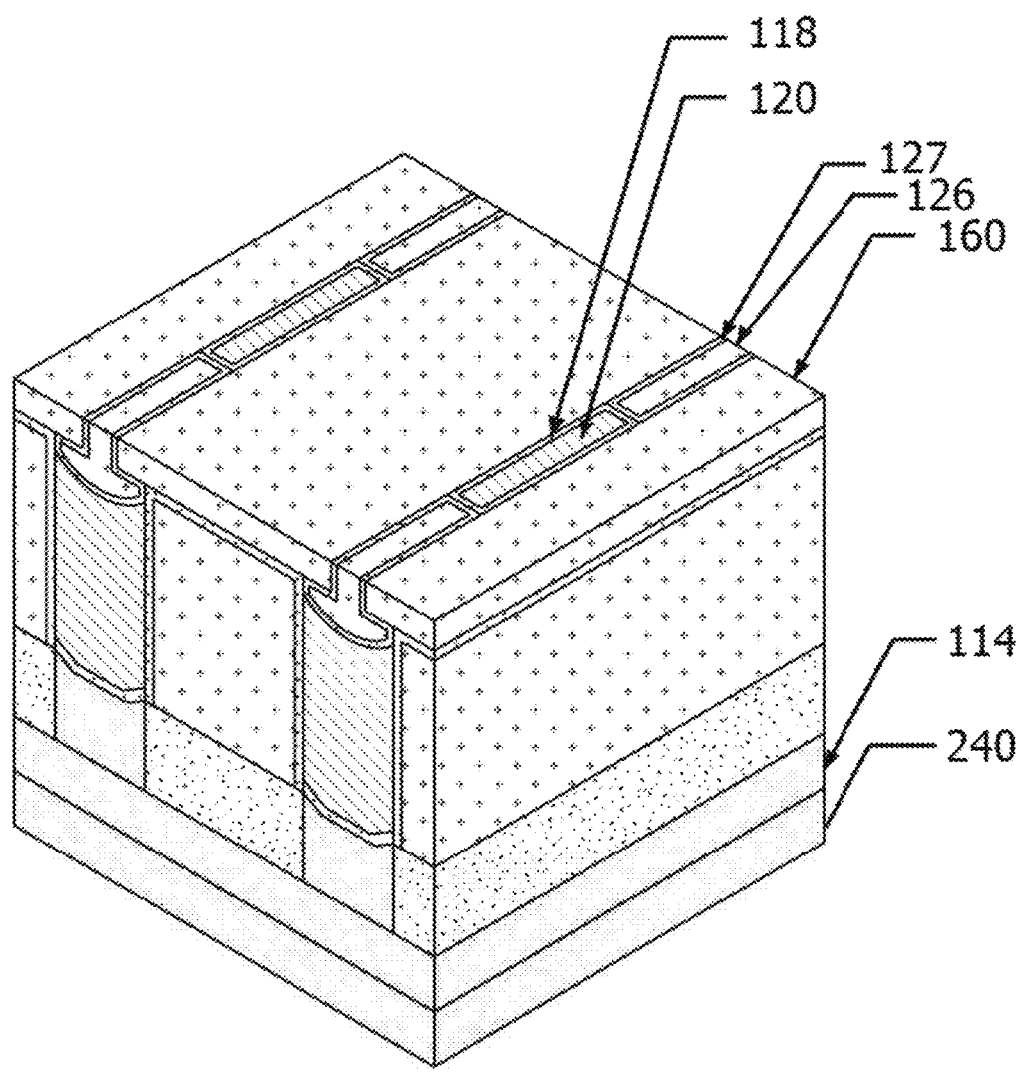
Figure 32B:
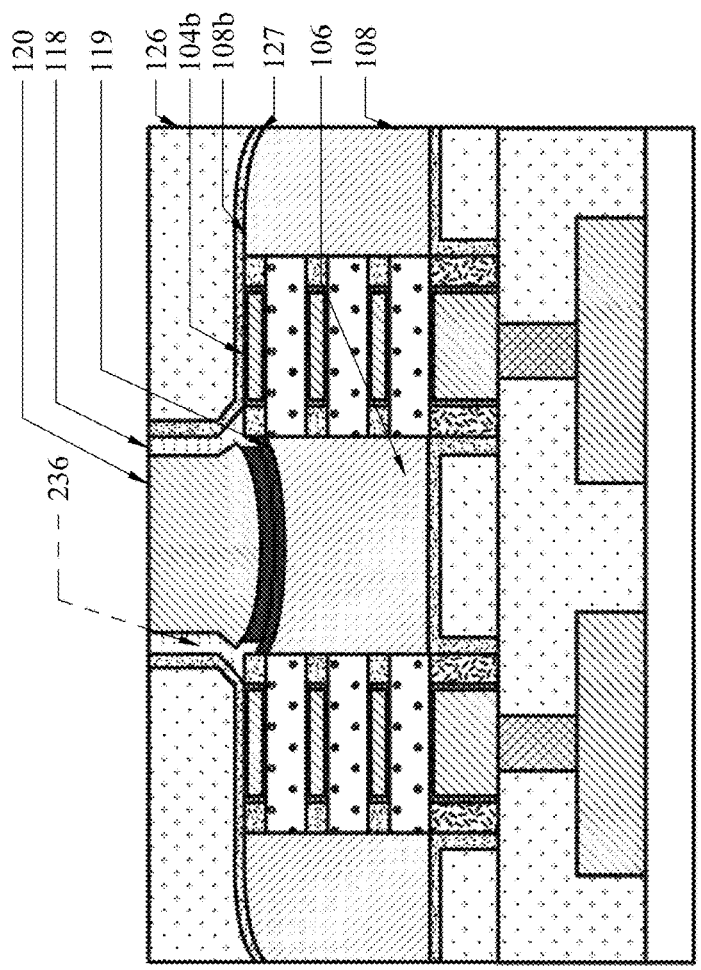
Figure 32B:
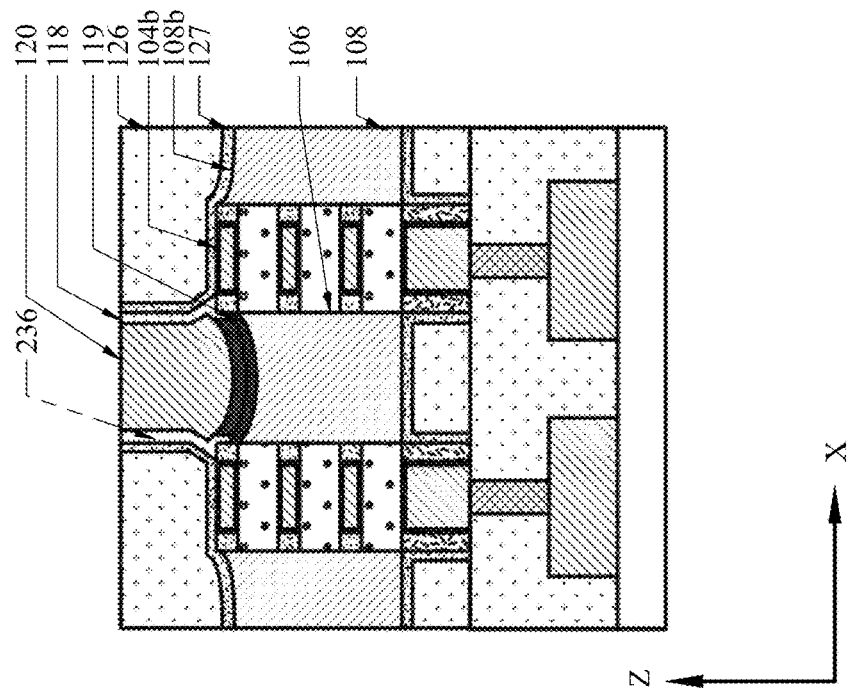
Figure 32C:
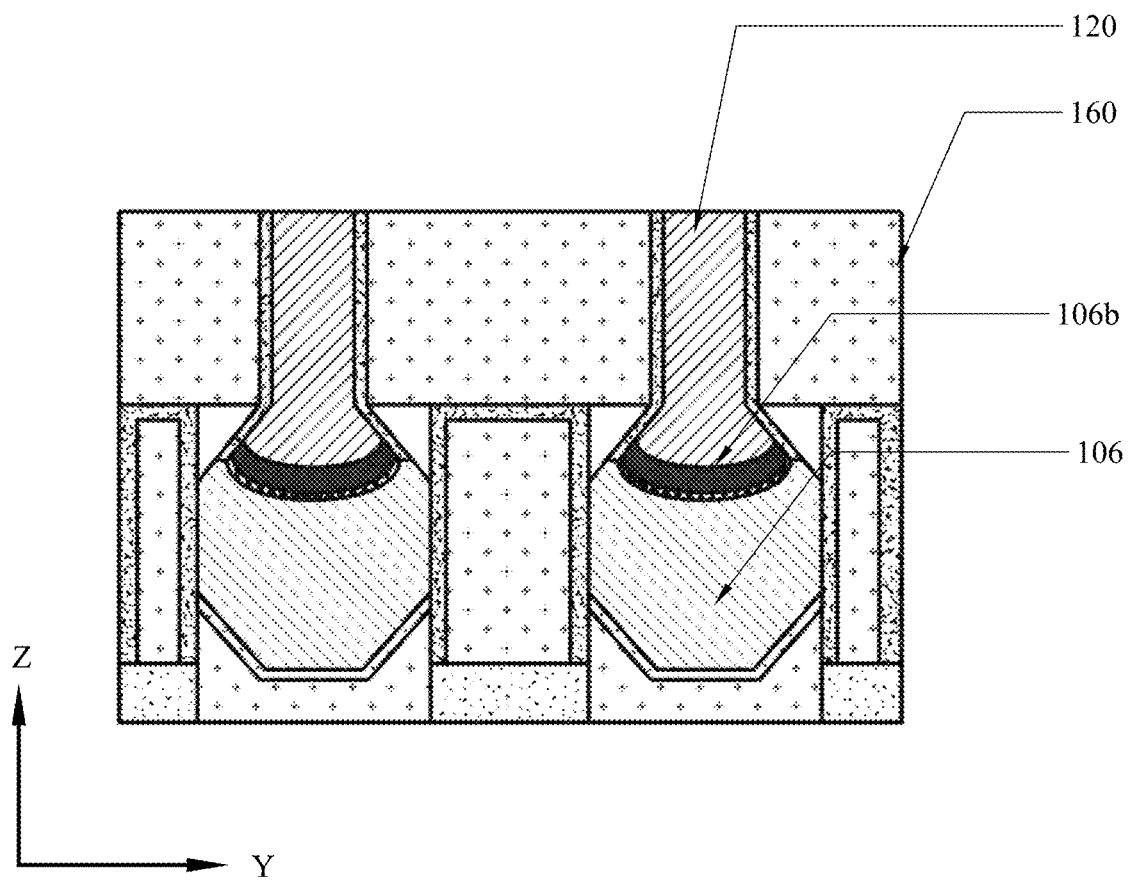

As shown in the perspective view of FIG. 32A, the x-direction cross-sectional view of FIG. 32B, and the y-direction cross-sectional view of FIG. 32C in the first source/drain region, in some embodiments, a back-side source/drain contact 120 is formed on the low temperature epitaxial layer 119 in the enlarged back-side source/drain contact trench 234. In some embodiments, the back-side source/drain contact 120 may be formed with a ledge 236 located in the position of the corner residue 152' of FIG. 29. The back-side source/drain contact 120 may have sidewalls contacting inner sidewalls of the first dielectric liner 118. In some embodiments, the ledge 236 of the back-side source/drain contact 120 may extend directly overlying the inner spacers 128 or the gate structure 104. In some embodiments, the back-side source/drain contact 120 may be made of metal, such as W, Co, Ru, Al, Cu, or other suitable materials. As an example, the metal alloy layer 121 may be formed with a thickness of about 5 nm. After the deposition of the back-side source/drain contact 120, a planarization process, such as a chemical mechanical planarization (CMP) process, may be then performed.

Figure 33A:
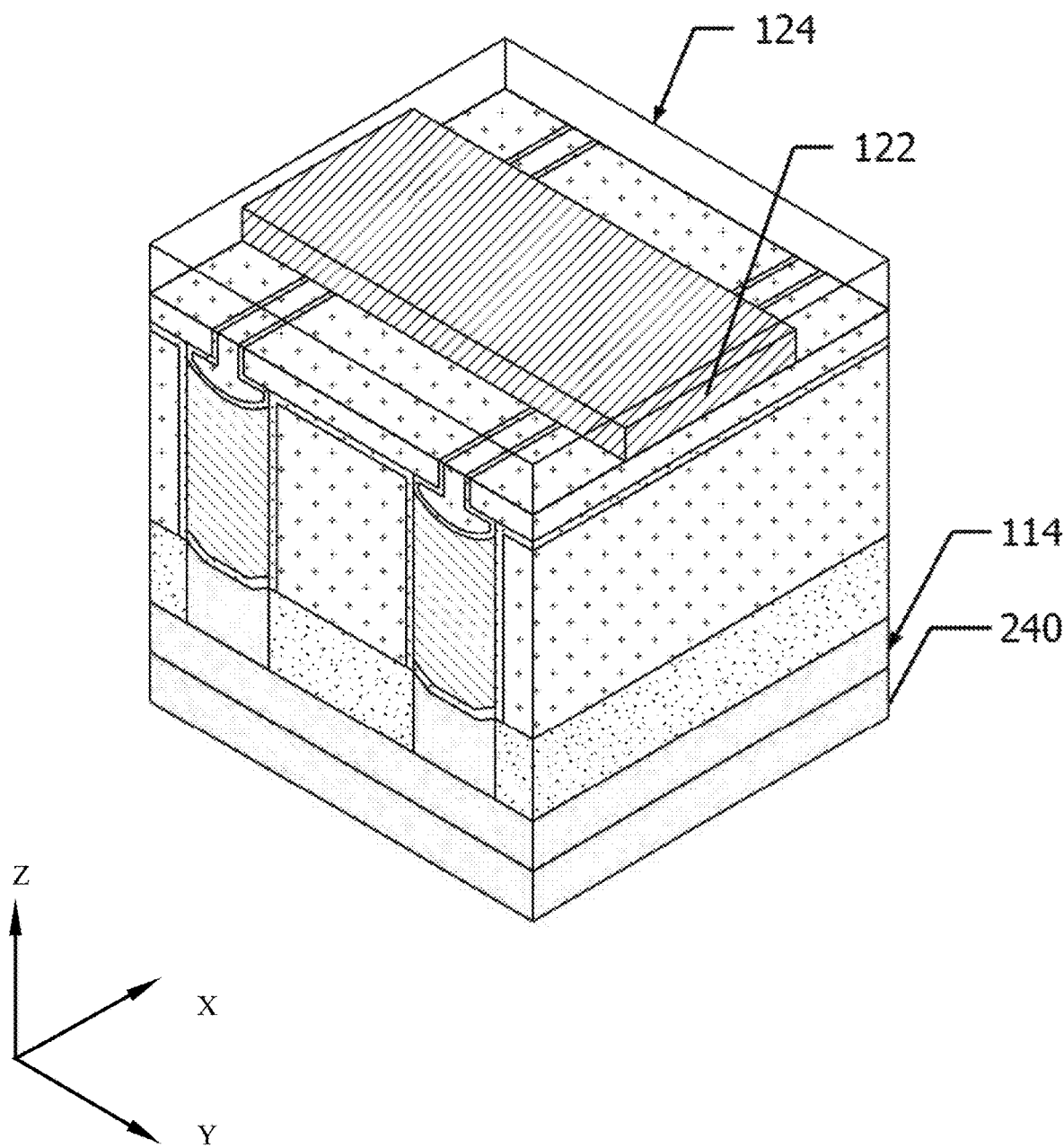
Figure 33B:
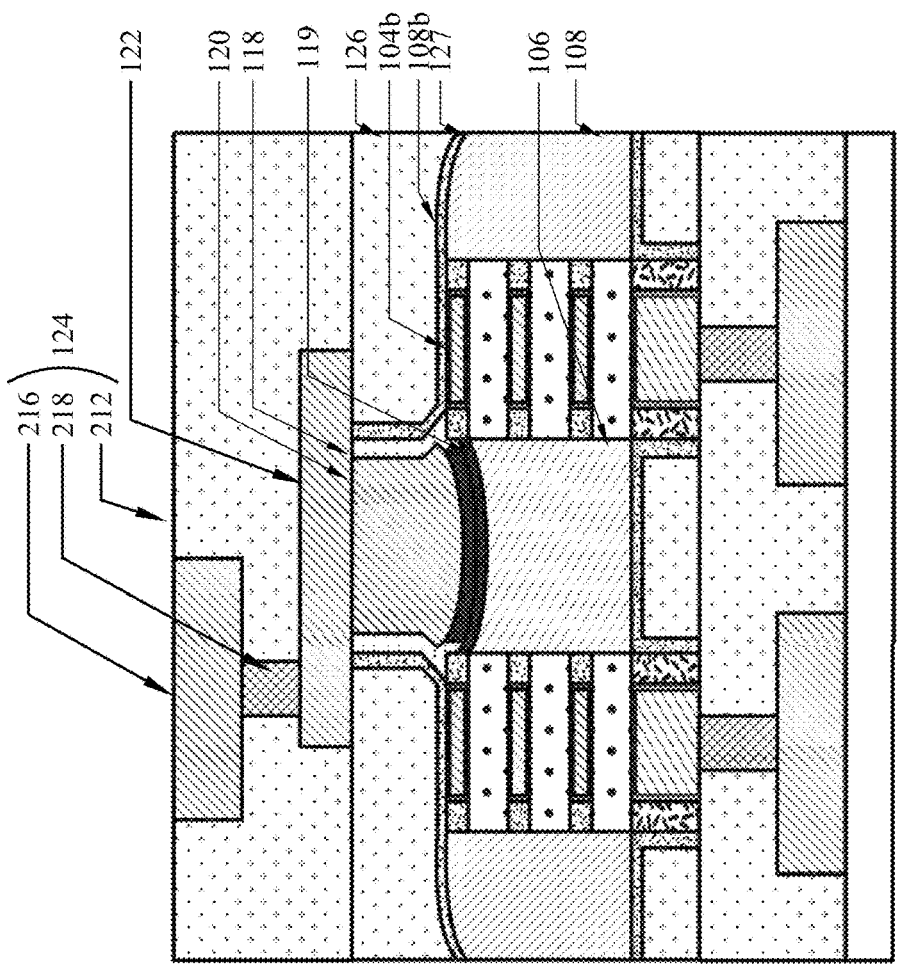
Figure 33B:
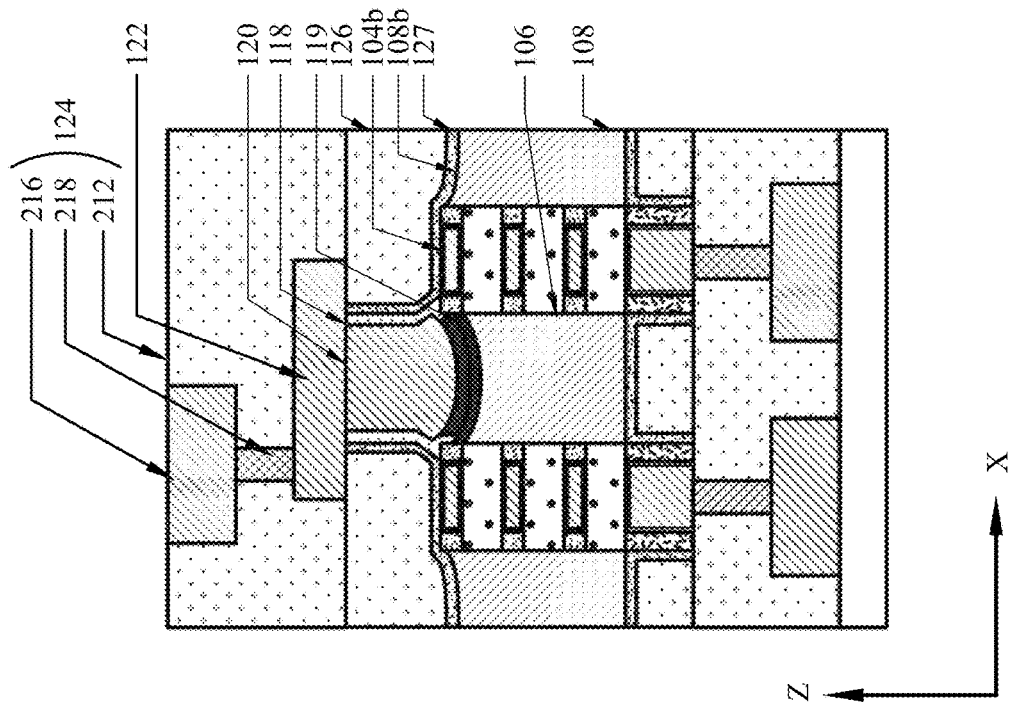

As shown in the perspective view of FIG. 33A and the x-direction cross-sectional view of FIG. 33B, in some embodiments, a back-side power rail 122 and a back-side interconnect structure 124 are formed to be electrically coupled to the back-side source/drain contact 120. The back-side interconnect structure 124 may comprise a plurality of back-side metal lines 216 and metal vias 218 disposed within and surrounded by a back-side interlayer dielectric layer 212. The back-side interconnect structure 124 electrically connects various features or structures of the semiconductor transistor device. For example, back-side interconnect structure 124 may be disposed on the back-side power rail 122 and connect external circuits to the back-side source/drain contact 120.

Figure 34:
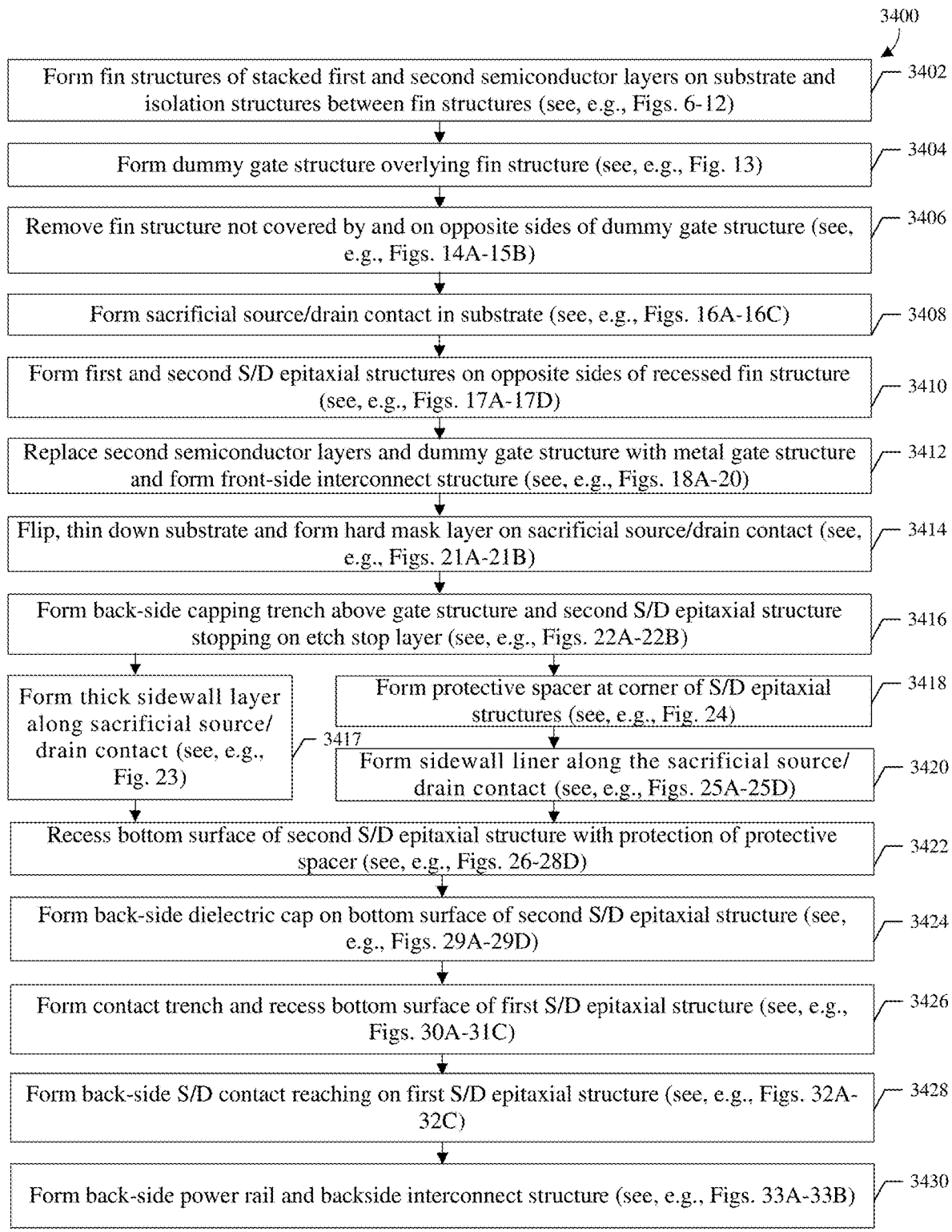
FIG. 34 illustrates a flow diagram of some embodiments of a method corresponding to FIGS. 6-33B.

FIG. 34 illustrates a flow diagram of some embodiments of a method 3400 of forming an integrated chip having multiple transistor devices with a high device density due to air spacer structures and high-κ dielectric spacer structures.

While method 3400 is illustrated and described below as a series of acts or events, it will be appreciated that the illustrated ordering of such acts or events are not to be interpreted in a limiting sense. For example, some acts may occur in different orders and/or concurrently with other acts or events apart from those illustrated and/or described herein. In addition, not all illustrated acts may be required to implement one or more aspects or embodiments of the description herein. Further, one or more of the acts depicted herein may be carried out in one or more separate acts and/or phases.

At act 3402, a plurality of fin structures of stacked first and second semiconductor layers are formed on a substrate. An isolation structure may be formed between the fin structures. FIGS. 6-12 illustrate the perspective views of some embodiments corresponding to act 3402.

At act 3404, a plurality of dummy gate structures is formed overlying the fin structures. FIG. 13 illustrates the perspective view of some embodiments corresponding to act 3404.

At act 3406, portions of the fin structures not covered by the dummy gate structures are etched and removed from opposite sides of dummy gate structure. The second semiconductor layers may be horizontal recessed from the first semiconductor layers, and inner spacers may be formed on opposite endings of the second semiconductor layers. FIGS. 14A-15B illustrate the various views of some embodiments corresponding to act 3406.

At act 3408, a first dummy backside contact is formed in the substrate. FIGS. 16A-16C illustrate the various views of some embodiments corresponding to act 3408.

At act 3410, first and second source/drain epitaxial structures are formed on opposite sides of the recessed fin structure. FIGS. 17A-17D illustrate the various views of some embodiments corresponding to act 3410.

At act 3412, the second semiconductor layers are replaced with a metal gate structure. Then, a gate contact and a front-side interconnect structure are formed. FIGS. 18A-20 illustrate the various views of some embodiments corresponding to act 3412.

At act 3414, the substrate is thinned down from back-side, and a masking layer may be formed on the sacrificial source/drain contact. FIGS. 21A-21B illustrate the various views of some embodiments corresponding to act 3414.

At act 3416, the substrate is further lowered to a position lower than a top surface of the sacrificial source/drain contact, and a back-side capping trench is formed above the gate structure and the second source/drain epitaxial structure. The substrate may be lowered by an etching process that stops on an etch stop layer. FIGS. 22A-22B illustrate the various views of some embodiments corresponding to act 3416.

At act 3417, the etch stop layer is removed to expose the bottommost first semiconductor layer, and a thick sidewall layer is formed along sacrificial source/drain contact. The thick sidewall layer covers a portion of the bottommost first semiconductor layer close to the sacrificial source/drain contact and the first source/drain epitaxial structure, and thus protects the first source/drain epitaxial structure from being damaged during subsequent removal of the bottommost first semiconductor layer and recessing of the second source/drain epitaxial structure. FIG. 23 illustrates the cross-sectional view of some embodiments corresponding to act 3417.

At act 3418 and act 3420, in some embodiments alternative to act 3417, a protective spacer is formed at corner of S/D epitaxial structures at act 3418, and a sidewall liner is formed along the sacrificial source/drain contact at act 3420. The protective spacer and the sidewall liner protect the first source/drain epitaxial structure from being damaged during subsequent removal of the bottommost first semiconductor layer and recessing of the second source/drain epitaxial structure. FIG. 24 illustrates the cross-sectional view of some embodiments corresponding to act 3418. FIGS. 25A-25D illustrate the various views of some embodiments corresponding to act 3420.

At act 3422, a bottom surface of second source/drain epitaxial structure is recessed with the lower portion of the bottommost first semiconductor layer or the protective spacer protecting the sidewall of the first source/drain epitaxial structure. FIGS. 26-28D illustrate the various views of some embodiments corresponding to act 3422.

At act 3424, a back-side dielectric cap is formed on the bottom surface of the second source/drain epitaxial structure. FIGS. 29A-29D illustrate the various views of some embodiments corresponding to act 3424.

At act 3426, a contact trench is formed, and a bottom surface of first source/drain epitaxial structure is recessed. FIGS. 30A-31C illustrate the various views of some embodiments corresponding to act 3426.

At act 3428, a back-side source/drain contact is formed reaching on bottom surface of first source/drain epitaxial structure FIGS. 28A-28C illustrate the various views of some embodiments corresponding to act 3428.

At act 3430, a back-side power rail and a backside interconnect structure are formed. FIGS. 29A-29B illustrate the various views of some embodiments corresponding to act 3430.

Accordingly, in some embodiments, the present disclosure relates to a method of forming a semiconductor transistor device. The method comprises forming a channel structure over a substrate and forming a first source/drain structure and a second source/drain structure on opposite sides of the channel structure. The method further comprises forming a gate structure surrounding the channel structure and forming a back-side capping trench from a back-side of the substrate. The method further comprises forming a back-side dielectric cap in the back-side capping trench.

In other embodiments, the present disclosure relates to a method of manufacturing a semiconductor transistor device. The method comprises forming a channel structure over a substrate and forming a sacrificial source/drain contact in the substrate on one side of the channel structure. The method further comprises forming a first source/drain structure and a second source/drain structure on opposite sides of the channel structure, the first source/drain structure overlying the sacrificial source/drain contact and forming a gate structure surrounding the channel structure. The method further comprises forming a back-side capping trench to expose a bottom surface of the gate structure and a bottom surface of the second source/drain structure. The bottom surface of the second source/drain structure is recessed. The method further comprises forming a back-side dielectric cap in the back-side capping trench.

In yet other embodiments, the present disclosure relates to a semiconductor device. The semiconductor device comprises a channel structure and a gate structure wrapping around the channel structure. The semiconductor device further comprises a first source/drain epitaxial structure and a second source/drain epitaxial structure disposed on opposite sides of the channel structure. The semiconductor device further comprises a back-side dielectric cap disposed under and extended along the second source/drain epitaxial structure and the gate structure. The first source/drain epitaxial structure has a bottom surface with a concave shape.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device, comprising:
   a first source/drain structure and a second source/drain structure disposed on opposite endings of a channel structure;
   a gate structure wrapping around the channel structure; and
   a back-side source/drain contact disposed under the first source/drain structure, wherein the back-side source/drain contact is electrically connected to the first source/drain structure along a contact surface, wherein the contact surface extends from a first outer sidewall of the first source/drain structure to a second outer sidewall of the first source/drain structure, and wherein the back-side source/drain contact extends vertically across a plane defined by a bottom surface of the gate structure.

2. The semiconductor device of claim 1, further comprising:
   a front-side interconnect structure disposed above the gate structure, wherein the front-side interconnect structure is on an opposite side from the back-side source/drain contact.

3. The semiconductor device of claim 2, wherein the front-side interconnect structure is electrically coupled to the gate structure.

4. The semiconductor device of claim 1, wherein a portion of the back-side source/drain contact that lies above the plane is concave down to the first source/drain structure.

5. The semiconductor device of claim 1, wherein a bottommost region of the back-side source/drain contact is flared outwards with a greater width than an upper region.

6. The semiconductor device of claim 1, further comprising:
   a power rail disposed below the back-side source/drain contact, wherein the power rail is electrically coupled to the back-side source/drain contact, and wherein the power rail is configured to connect external circuits to the back-side source/drain contact.

7. The semiconductor device of claim 6, wherein the power rail is below the channel structure, the gate structure, and the first source/drain structure.

8. The semiconductor device of claim 1, wherein an interconnect structure is disposed above the second source/drain structure, and wherein the interconnect structure is electrically coupled to the second source/drain structure.

9. The semiconductor device of claim 1, wherein a portion of the gate structure is below the channel structure.

10. A semiconductor device, comprising:
    a gate structure disposed around a channel structure;
    a first source/drain structure disposed on a first end of the channel structure;
    a second source/drain structure disposed on a second end of the channel structure opposite to the first end of the channel structure; and
    a back-side source/drain contact disposed under the first source/drain structure and contacting the first source/drain structure along a first interface that concaves down to the first source/drain structure, wherein a width of the back-side source/drain contact increases for a first distance away from the first source/drain structure.

11. The semiconductor device of claim 10, wherein the width of the back-side source/drain contact decreases after the first distance for a second distance, and wherein the back-side source/drain contact has sidewalls that are substantially straight after the second distance.

12. The semiconductor device of claim 10, wherein the back-side source/drain contact has an uppermost region that is above a bottommost surface of the second source/drain structure.

13. The semiconductor device of claim 10, wherein the first source/drain structure has a bottommost region that is above a bottommost region of the second source/drain structure.

14. The semiconductor device of claim 10, further comprising a power rail disposed along a back surface of the back-side source/drain contact, wherein the power rail is electrically coupled to the back-side source/drain contact, and wherein the power rail has a width larger than the width of the back-side source/drain contact.

15. The semiconductor device of claim 10, wherein the back-side source/drain contact has a ledge that extends outwards, and wherein the ledge has a width smaller than 5 nm.

16. The semiconductor device of claim 15, wherein the ledge has a height smaller than 20 nm.

17. The semiconductor device of claim 10, wherein a bottommost surface of the second source/drain structure is coplanar to a bottommost surface of the gate structure.

18. A semiconductor device comprising:
    a channel structure disposed within a substrate;
    a first source/drain structure disposed on an end of the channel structure;
    a back-side source/drain contact disposed under and electrically coupled to the first source/drain structure, wherein the back-side source/drain contact has a first ledge extending outwards from a first side and a second ledge extending outwards from a second side opposite to the first side; and
    a dielectric liner disposed along a bottom surface and a top surface of the first ledge, the dielectric liner being positioned below the channel structure.

19. The semiconductor device of claim 18, wherein the dielectric liner is positioned below the channel structure at a first region, the first region being laterally adjacent to a furthest extending point of the first ledge.

20. The semiconductor device of claim 18, wherein the top surface of the first ledge is continuous with the top surface of the back-side source/drain contact.

* * * * *